United States Patent
Moniwa et al.

(10) Patent No.: US 7,598,133 B2
(45) Date of Patent: Oct. 6, 2009

(54) SEMICONDUCTOR MEMORY DEVICE AND A METHOD OF MANUFACTURING THE SAME

(75) Inventors: Masahiro Moniwa, Sayama (JP); Hiraku Chakihara, Akishima (JP); Kousuke Okuyama, Kawagoe (JP); Yasuhiko Takahashi, Higashiyamato (JP)

(73) Assignee: Renesas Technology Corp, Tokyo (JP)

( * ) Notice: Subject to any disclaimer, the term of this patent is extended or adjusted under 35 U.S.C. 154(b) by 48 days.

(21) Appl. No.: 11/714,865

(22) Filed: Mar. 7, 2007

(65) Prior Publication Data
US 2007/0173006 A1    Jul. 26, 2007

Related U.S. Application Data

(62) Division of application No. 10/465,550, filed on Jun. 20, 2003, now Pat. No. 7,279,754.

(30) Foreign Application Priority Data

Jul. 8, 2002  (JP)  ............................ 2002-199308
Feb. 28, 2003  (JP)  ............................... 2003-54378

(51) Int. Cl.
H01L 21/336   (2006.01)
H01L 21/8234  (2006.01)
H01L 21/331   (2006.01)
H01L 21/76    (2006.01)

(52) U.S. Cl. ...................... 438/197; 438/257; 438/377; 438/445

(58) Field of Classification Search ................ 438/222, 438/197, 257, 377, 445
See application file for complete search history.

(56) References Cited

U.S. PATENT DOCUMENTS

| 5,072,286 | A |   | 12/1991 | Minami et al. |
| 5,132,771 | A |   | 7/1992  | Yamanaka et al. |
| 5,239,196 | A | * | 8/1993  | Ikeda et al. .................. 257/385 |
| 5,364,810 | A |   | 11/1994 | Kosa et al. |
| 5,550,396 | A |   | 8/1996  | Tatsumi |

(Continued)

FOREIGN PATENT DOCUMENTS

JP    5062474    3/1993

(Continued)

OTHER PUBLICATIONS

Takato, H., et al, "High Performance CMOS Surrounding Gate Transistor (SGT) for Ultra High Density LSIs", 1988 IEEE, IEDM 88, pp. 222-225.

(Continued)

Primary Examiner—Chuong A. Luu
(74) Attorney, Agent, or Firm—Antonelli, Terry, Stout & Kraus, LLP.

(57) ABSTRACT

A memory cell of an SRAM has two drive MISFETs and two vertical MISFETs. The p channel vertical MISFETs are formed above the n channel drive MISFETs. The vertical MISFETs respectively mainly comprise laminate formed of a lower semiconductor layer, intermediate semiconductor layer and upper semiconductor layer laminated in this sequence, a gate insulating film of silicon oxide formed on the surface of the side wall of the laminate, and a gate electrode formed so as to cover the side wall of the laminate. The vertical MISFETs are perfect depletion type MISFETs.

22 Claims, 78 Drawing Sheets

U.S. PATENT DOCUMENTS

| | | |
|---|---|---|
| 6,483,136 B1 | 11/2002 | Yoshida et al. |
| 6,693,008 B1 | 2/2004 | Sato et al. |
| 6,740,921 B2 | 5/2004 | Matsuoka et al. |
| 2002/0098639 A1 | 7/2002 | Kisu et al. |

FOREIGN PATENT DOCUMENTS

| | | |
|---|---|---|
| JP | 5206394 | 8/1993 |
| JP | 6104405 | 4/1994 |
| JP | 888328 | 4/1996 |
| WO | WO 03019663 | 3/2003 |
| WO | WO 03036714 | 5/2003 |

OTHER PUBLICATIONS

Chakahari H., et al—U.S. Appl. No. 10/629,733, filed Jul. 30, 2003—United States Patent Application.

* cited by examiner

FIG. 70
FIG. 71
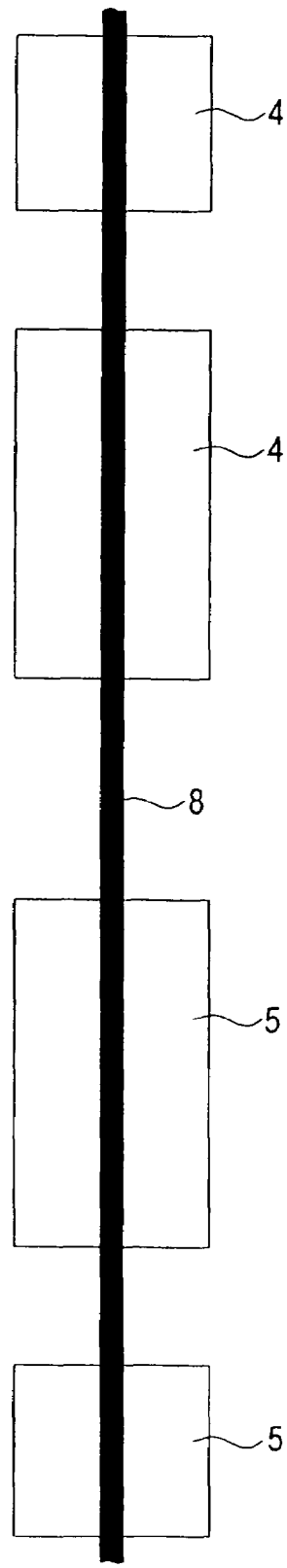
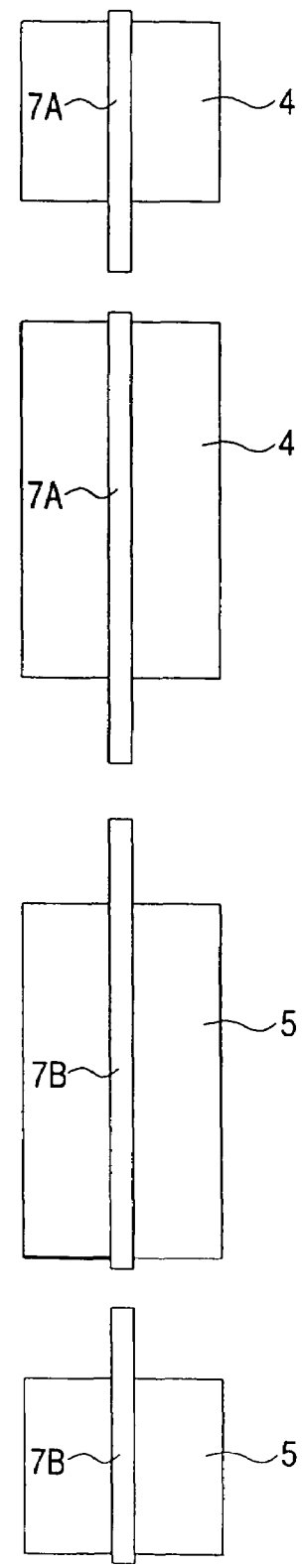

SEMICONDUCTOR MEMORY DEVICE AND A METHOD OF MANUFACTURING THE SAME

CROSS-REFERENCE TO RELATED APPLICATIONS

This Application is a divisional application of U.S. application Ser. No. 10/465,550, filed Jun. 20, 2003, and now U.S. Pat. 7,279,754, the entire contents of which are incorporated herein by reference.

BACKGROUND OF THE INVENTION

This invention relates to a semiconductor memory device, to a method of manufacturing a semiconductor memory device, and to a technique for effectively applying the device and method to a semiconductor memory device comprising a SRAM (Static Random Access Memory) in which a memory cell is formed from four MISFETs.

An SRAM (Static Random Access Memory), which is a type of general-purpose MOS semiconductor memory device, may comprise four n channel type MISFETs (Metal Insulator Field Effect Transistors) and two p channel type MISFETs for example. However, in a "perfect CMOS" (Complementary Metal Oxide Semiconductor) SRAM, which is of the same type, six MISFETs are arranged in a principal surface of a semiconductor substrate, so that reduction of the memory cell size is difficult.

SUMMARY OF THE INVENTION

A technique has been proposed, e.g., as discussed, for example, in Japanese Patent Application Laid-Open No. Hei 8(1996)-88328, corresponding to U.S. Pat. No. 5,364,810, and Japanese Patent Application Laid-Open No. 5(1993)-236394, corresponding to U.S. Pat. No. 5,550,396, for reducing the memory cell size in SRAM cells comprising six MISFETs by forming a channel part in the side walls of a groove in some of the MISFETs forming the memory cell, and forming a gate electrode so as to fill this groove.

The size of a memory cell is determined by the number of transistors which form the memory cell. For example, in the case of the aforesaid perfect CMOS type SRAM, wherein four n channel type MISFETs and two p channel type MISFETs are arranged on a semiconductor substrate, sufficient space for six transistors is required, which increases the memory cell size and makes the manufacturing process complex. Also, as this perfect CMOS type SRAM requires a well isolation region which separates the n channel type MISFET and p channel type MISFET, the memory cell size increases even more.

A technique for forming a SRAM cell from a transistor using thin-film transistor technology is disclosed, for example, by Japanese Patent Application Laid-Open No. Hei 6(1994)-104405. As disclosed in this publication, the source, channel region and drain of a thin-film transistor are arranged in the direction of extension of a polysilicon layer, which extends in the same direction as that of a bit line.

Thus, since the source, channel region and drain of the thin-film transistor are arranged in a plane parallel to the principal surface of the substrate, regions for this purpose are required in the extension direction, and since a region is also required for interconnections to the thin-film transistor, the memory cell size increases.

The circuit layout of a four transistor SRAM cell using thin-film transistors is disclosed by Japanese Patent Application Laid-Open No. Hei 5(1993)-62474, however, the specific construction of the thin-film transistors is not mentioned.

It is therefore an object of this invention to provide a technique which can reduce the memory cell size of an SRAM.

Other objects and novel features of the present invention will be understood from the description provided in this specification, with reference to the appended drawings.

The following are representative aspects of the invention disclosed in this application.

A semiconductor memory device comprises a memory cell including first and second drive MISFETs and first and second vertical MISFETs, which are disposed at the intersection of a pair of complementary data lines and a word line, the first drive MISFET and second drive MISFET being cross-coupled, wherein:

the first vertical MISFET is formed so as to be higher than the first drive MISFET that is formed on the principal surface of the semiconductor substrate, and the second vertical MISFET is formed so as to be higher than the second drive MISFET that is formed on the principal surface of the semiconductor substrate, the first and second vertical MISFETs respectively comprise a source, a channel region and a drain formed in a laminate extending in a perpendicular direction from the principal surface of the semiconductor substrate, and a gate electrode formed via a gate insulating film on the side walls of the laminate.

The gate electrodes of the vertical MISFETs are formed in the shape of side spacers, which self-align with the side walls of the laminate, so that the side wall perimeter of the laminate is surrounded.

The vertical MISFETs are a perfect depletion type MISFET.

A capacitative element is connected to a charge storage node of the cross-couple connection.

A complementary data line is formed above the vertical MISFET, one of the source and drain of the vertical MISFET is electrically connected to this complementary data line, and a word line is electrically connected to the gate electrodes of the vertical MISFETs.

The complementary data line extends above the laminate so as to run transverse to the laminate, whereas the word line is electrically connected to the gate electrodes of the first and second vertical MISFETs, and it is formed under the complementary data line.

One of the source and drain of the first vertical MISFET is formed so as to overlap superficially on the drain region of the first drive MISFET, and one of the source and drain of the second vertical MISFET is formed so as to overlap superficially on the drain region of the second drive MISFET.

The above-mentioned semiconductor memory device is manufactured by the following methods.

In the step of forming a connection hole for the cross-couple connection, the photolithography step and etching step of forming one connection hole is different from the photolithography step and etching step of forming the other connection hole.

The step of forming the laminate comprises a step of forming a mask layer for etching the film comprising the laminate above the film, a step of forming a photoresist pattern above the mask layer, a step of slimming the photoresist pattern, and a step of etching the mask layer using the slimmed photoresist pattern as a mask.

The gate electrodes of the vertical MISFET are formed in the shape of side wall spacers which self-align with the side walls of the laminate, so that the side wall perimeter of the laminate is surrounded.

A word line, which is electrically connected with the gate electrodes of the first and second vertical MISFETs, is formed by embedding a conductive film in an interconnection groove.

BRIEF DESCRIPTION OF THE DRAWINGS

FIG. 70 is a plan view showing a method of manufacturing a semiconductor memory device according to another embodiment of this invention.

FIG. 71 is a plan view showing a method of manufacturing a semiconductor memory device according to another embodiment of this invention.

DETAILED DESCRIPTION OF THE PREFERRED EMBODIMENTS

Hereafter, some embodiments of this invention will be described in detail with reference to the drawings. In all the drawings, the same symbols are assigned to identify members having the same functions, and their description is not repeated.

Embodiment 1

Figure 1:
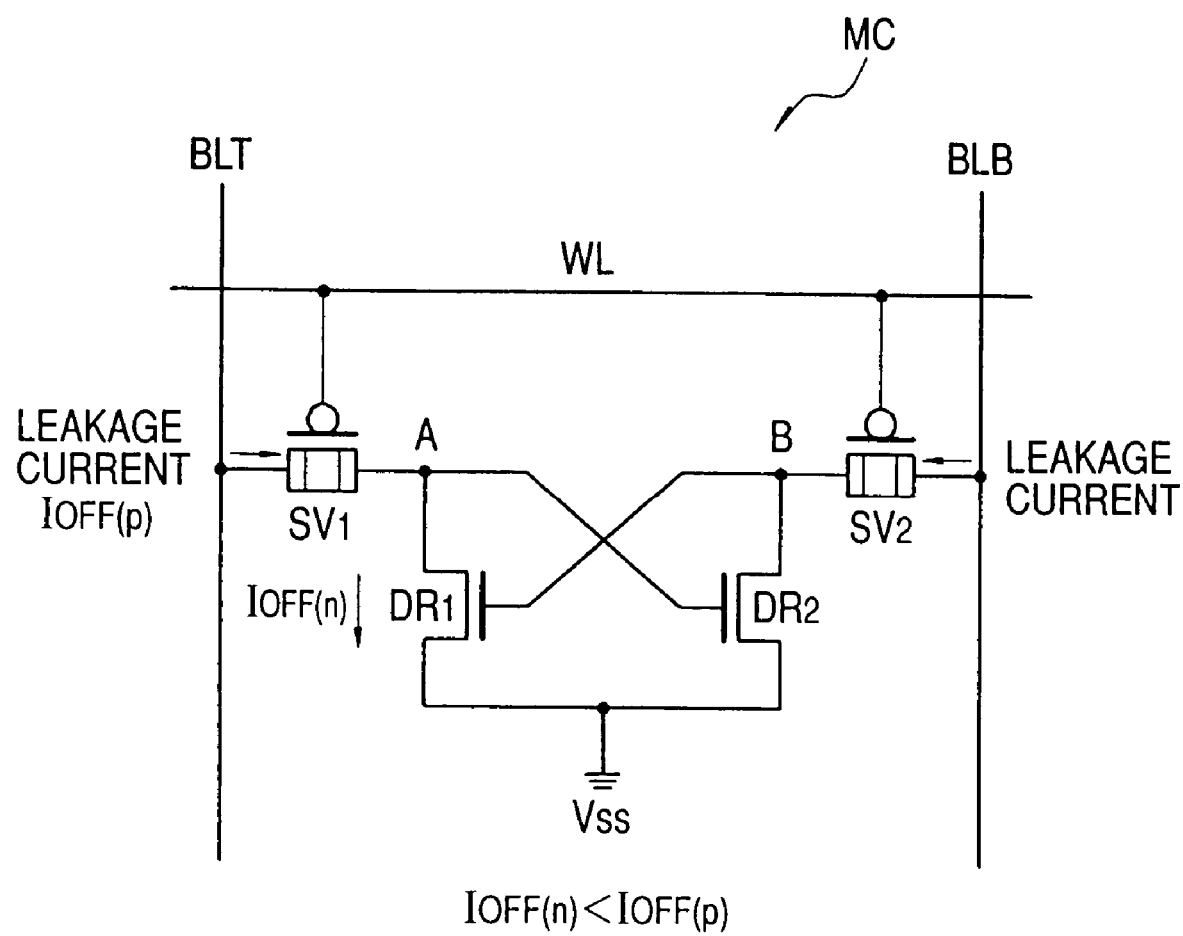
FIG. 1 is an equivalent circuit diagram showing a memory cell of a semiconductor memory device according to one embodiment of this invention.

FIG. 1 is an equivalent circuit diagram of a memory cell of a SRAM according to one embodiment of this invention. As shown in the diagram, a memory cell (MC) of this SRAM comprises two drive MISFETs (DR$_1$, DR$_2$) arranged at the intersection of a pair of complementary data lines (BLT, BLB) and a word line (WL), and comprises two drive MISFETs (DR$_1$, DR$_2$) and vertical MISFETs (SV$_1$, SV$_2$). The two drive MISFETs (DR$_1$, DR$_2$) are n channel MISFETs, and the two vertical MISFETs (SV$_1$, SV$_2$) comprise p channel type MISFETs of the vertical construction type, as will be mentioned later.

The gate electrodes of the vertical MISFETs (SV$_1$, SV$_2$) are respectively connected to one word line (WL). One of the source and drain of the first vertical MISFET (SV$_1$) is connected to one (BLT) of the complementary data lines (BLT, BLB), and the other of the source and drain is connected to the drain of the first drive MISFET (DR$_1$) and the gate electrode of the second drive MISFETs (DR$_2$), so as to form one storage node (A). One of the source and drain of the second vertical MISFET (SV$_2$) is connected to the other (BLB) of the complementary data lines (BLT, BLB), and the other of the source and drain is connected to the drain of the second drive MISFET (DR$_2$) and the gate electrode of the first drive MISFET (DR$_1$), so as to form another storage node (B). Of the storage nodes (A, B) of the memory cell (MC), one is held at a H (High) level, and the other is held at a L (Low) level to store 1 bit of information.

Thus, in the memory cell (MC) of this embodiment, the drive MISFETs (DR$_1$, DR$_2$) and vertical MISFETs (SV$_1$, SV$_2$) are cross-coupled, and form an information storage device which stores 1 bit of information.

The sources of the drive MISFETs (DR$_1$, DR$_2$) are connected to a reference voltage (Vss) of, for example, 0V.

The memory cell (MC) of this embodiment has a construction such that it retains a charge using a leakage current ($I_{OFF}$ (P)) when the vertical MISFETs (SV$_1$, SV$_2$) forming the p channel type MISFET are OFF. That is, during a standby state (when information is retained), a supply voltage (Vdd (>Vss)) of higher potential than the reference voltage (Vss) is supplied to each of the word line (WL) and complementary data lines (BLT, BLB). Due to this, the vertical MISFETs (SV$_1$, SV$_2$) are in the OFF state, and the supply voltage (Vdd) is supplied to one of the source and drain of the vertical MISFETs (SV$_1$, SV$_2$) in the OFF state via the complementary data line (BLT, BLB). At this time, by making the leakage current ($I_{OFF}$ (P)) of the vertical MISFETs (SV$_1$, SV$_2$) larger than the leakage current ($I_{OFF}$ (N)) of the drive MISFETs (DR$_1$ or DR$_2$) in the OFF state, a current (leakage current ($I_{OFF}$ (P)) is supplied from a complementary data line to the storage node on the H level side via the vertical MISFET, and the H level (Vdd) is maintained.

Also, the drive MISFET whose gate was electrically connected to the storage node on the H level side is maintained in the ON condition, and the storage node is held on the L level side (Vss). Thus, during the standby state (when information is retained), a charge is held, and information is held. The vertical MISFETs (SV$_1$, SV$_2$) and drive MISFETs (DR$_1$, DR$_2$) are arranged so that the leakage current ($I_{OFF}$ (P)) of the vertical MISFETs (SV$_1$, SV$_2$) is larger than the leakage current ($I_{OFF}$ (N)) of the drive MISFETs (DR$_1$, DR$_2$) ($I_{OFF}$(N) <$I_{OFF}$ (P)); and, although there is no particular limitation, a charge can be effectively retained if the ratio of $I_{OFF}$ (P) to $I_{OFF}$ (N) is 10 to 1 or more.

Reading and writing of information are fundamentally identical to those of an ordinary perfect CMOS type memory cell comprising six MISFETs. That is, for reading information, the reference voltage (Vss) is applied to a selected word line (WL), the vertical MISFETs (SV$_1$, SV$_2$) are turned ON, and the potential difference of a pair of storage nodes is read by the complementary data lines (BLT, BLB). For writing information, the reference voltage (Vss) is applied to a selected word line (WL), the vertical MISFETs (SV$_1$, SV$_2$) are turned ON, and the ON, OFF operation of the drive MISFETs (DR$_1$, DR$_2$) are reversed by connecting one side of the complementary data line (BLT, BLB) to the supply voltage (Vdd) and connecting the other side to the reference voltage (Vss).

Thus, the memory cell (MC) of this embodiment has a construction wherein the vertical MISFETs (SV$_1$, SV$_2$) have the double function of a transfer MISFET and a load MISFET of the perfect CMOS type memory cell comprising six MISFETs. During the standby state, the vertical MISFETs (SV$_1$, SV$_2$) function as a load MISFET, and during read/write operations, the vertical MISFETs (SV$_1$, SV$_2$) function as a transfer MISFET. In this construction, the memory cell comprises four MISFETs, so that the memory cell size can be reduced. Also, as will be described later, since the vertical MISFETs (SV$_1$, SV$_2$) are formed above the drive MISFETs (DR$_1$, DR$_2$), the memory cell size can be further reduced.

Figure 2:
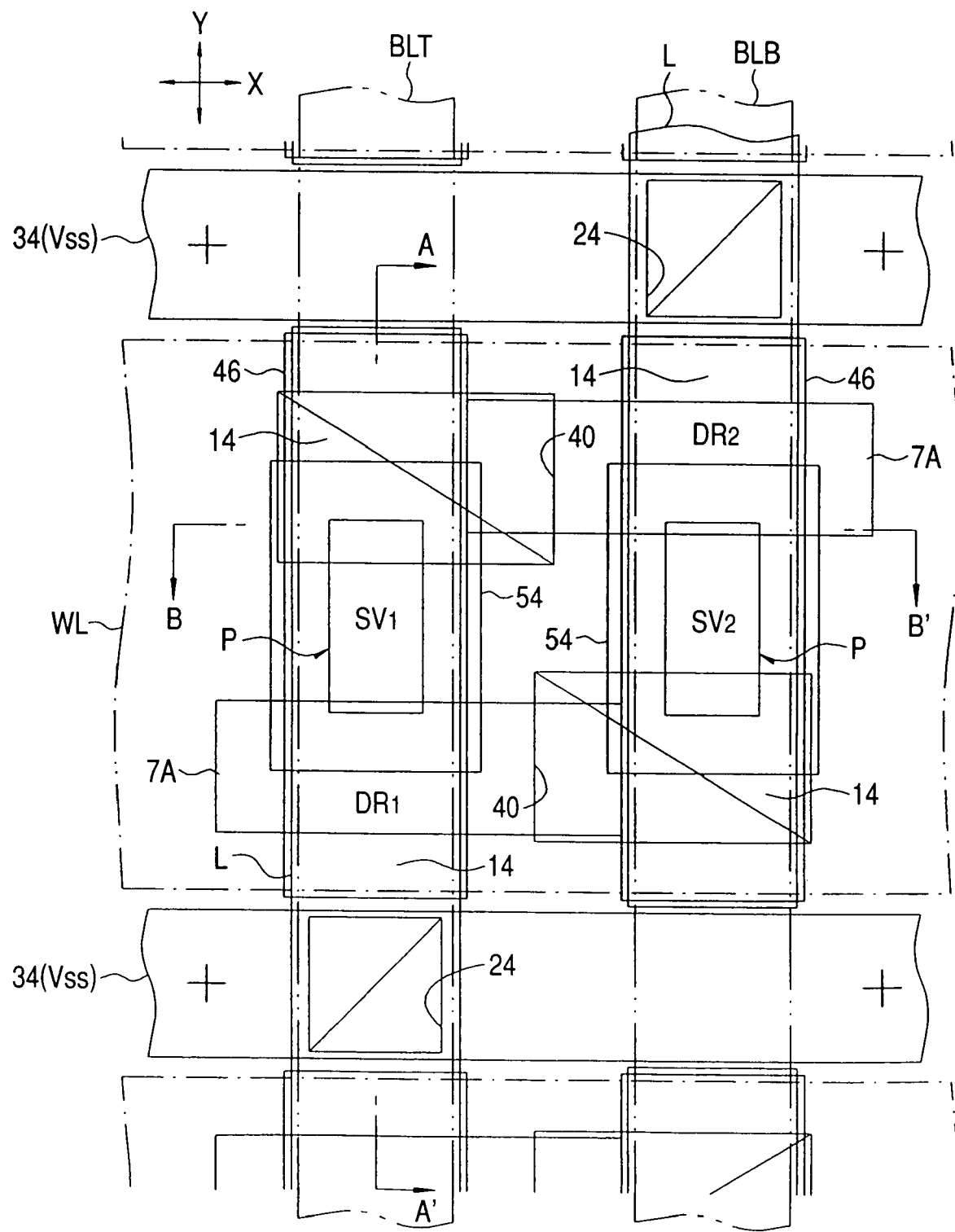
FIG. 2 is a plan view showing a memory cell of a semiconductor memory device according to one embodiment of this invention.
Figure 3:
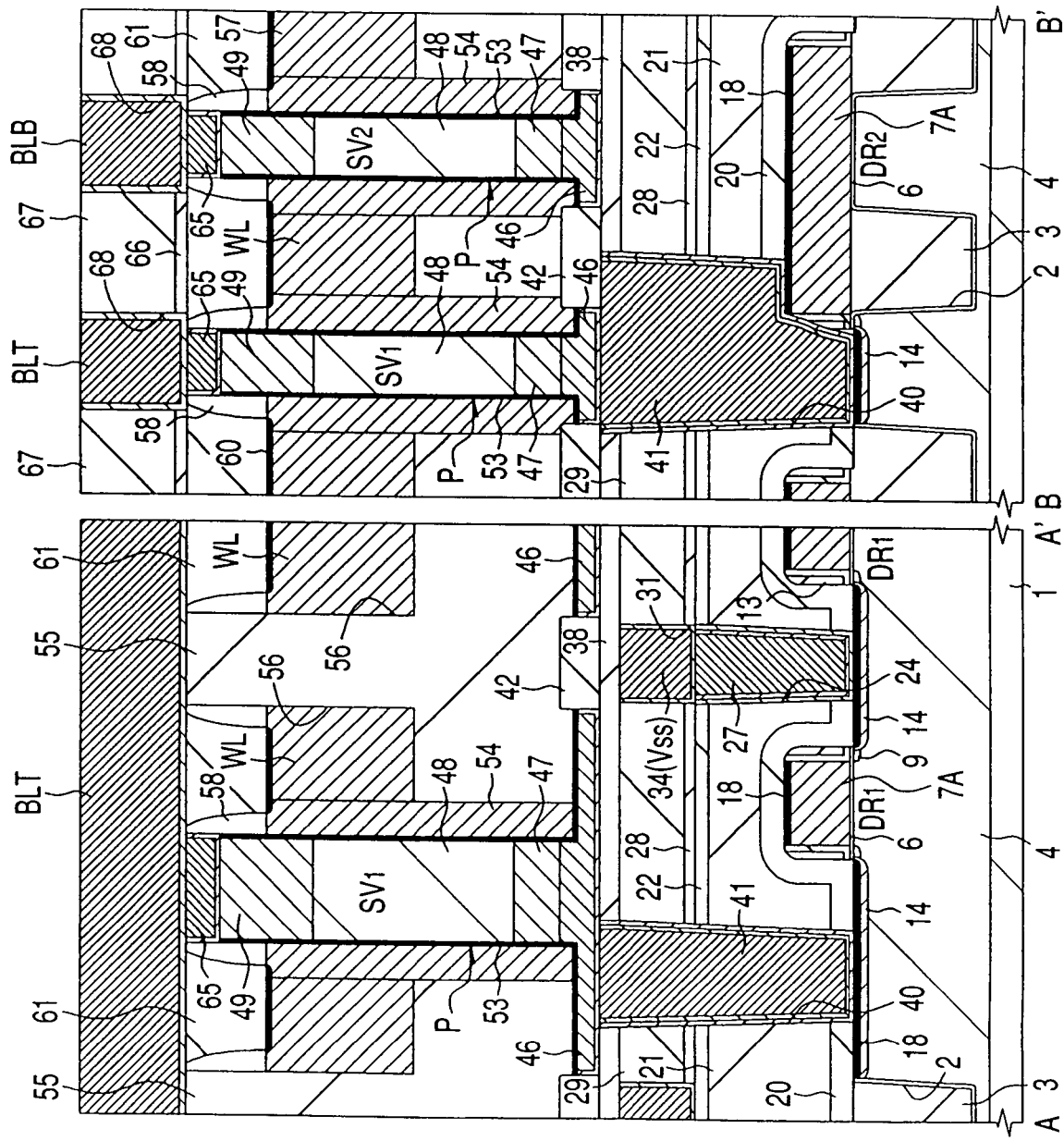
FIG. 3 is a cross-sectional view taken along a line A-A' and a line B-B' in FIG. 2.

FIG. 2 is a sectional view showing the specific construction of the above-mentioned memory cell (MC). The left-hand side of FIG. 3 is a sectional view through a line A-A' of FIG. 2, and the right-hand side is a sectional view through a line B-B' of FIG. 2. The rectangular region enclosed by four (+) marks as shown in FIG. 2, shows the occupancy region of one memory cell. These (+) marks are shown in the drawing to make the figure clearer, and are not actually formed on the semiconductor substrate. FIG. 2 shows only the main conductive layers which constitute the memory cell, and their connection regions. The insulating film formed between the conductive layers is omitted.

For example, a p type well 4 is formed in the principal surface of the semiconductor substrate (hereafter, substrate) 1 comprising p type single crystal silicon. Two drive MISFETs (DR$_1$, DR$_2$) forming a part of the memory cell (MC) are formed in the active region (L) whose perimeter was specified by an isolation groove 2 of this p type well 4. An insulating film 3 comprising silicon oxide, for example, is embedded in the isolation groove 2 and forms an isolation part.

As shown in FIG. 2, the active region (L) has a flat rectangular pattern extending in the lengthwise direction (Y direction) of the figure, and in the occupancy region of one memory cell, there are two active regions (L, L) which are arranged so as to be mutually parallel. Of the two drive MISFETs (DR$_1$, DR$_2$), one drive MISFET (DR$_1$) is formed in one active region (L), and the other drive MISFET (DR$_2$) is formed in the other active region (L).

Although it will be described later using FIG. 4, one of the active regions (L) is formed in one piece with the other active region (L) of one memory cell (upper side of figure) adjoining in the Y direction, and the other active region (L) is formed in one piece with the active region (L) of another memory cell (lower side of figure) adjoining in the Y direction.

Although it will be described later using FIG. 9 and FIG. 28, between the drive MISFETs (DR$_1$, DR$_2$) of memory cells adjoining in the Y direction, a flat pattern (DR$_1$, DR$_2$) has axial symmetry relative to the boundary line in the transverse direction (X direction) of the figure, and between the drive MISFETs (DR$_1$, DR$_2$) of memory cells adjoining in the X direction, the flat pattern has a point symmetry in the X direction. Due to this, the memory cell size can be reduced.

As shown in FIG. 2, the drive MISFETs (DR$_1$, DR$_2$) comprise a gate insulating film 6 mainly formed in the surface of the p type well 4, gate electrode 7A formed above the gate insulating film 6, and n$^+$ type semiconductor region 14 (source, drain) formed in the p type well 4 on both sides of the gate electrode 7A. That is, the drive MISFETs (DR$_1$, DR$_2$)

comprise an n channel type MISFET. The gate electrodes 7A of the drive MISFETs ($DR_1$, $DR_2$) comprise a conductive film formed, for example, of n type polycrystalline silicon, and comprise a flat rectangular pattern extending in the X direction, which intersects perpendicularly with the extension direction (Y direction) of the active region (L). That is, the drive MISFETs ($DR_1$, $DR_2$) are formed so that the channel width direction coincides with the X direction, and the channel length direction corresponds with the Y direction.

As shown in FIG. 3, a reference voltage line 34 (Vss) is formed above one (source) of the $n^+$ type semiconductor regions 14(source, drain). The reference voltage line 34 (Vss) is electrically connected to the $n^+$ type semiconductor region (source) 14 via a plug 27 in a contact hole 24 formed in the lower part. The reference voltage line 34 and plug 27 comprise a metal film, for example, based mainly on the use of tungsten (W), so that its resistance is reduced. Due to this, the reading and writing speed of the memory cell (MC) can be improved. In the following description, the metal film based mainly on the use of tungsten (W) will be simply referred to as a W film.

As shown in FIG. 2, the reference voltage lines 34 (Vss) are arranged, one at a time, at each end in the Y direction of the occupancy region of one memory cell, and they extend mutually parallel in the X direction, which intersects perpendicularly with the extension direction (Y direction) of the active region (L). One of the two reference voltage lines 34 (Vss), 34 (Vss) shown in this figure (upper side of memory cell) is electrically connected to the $n^+$ type semiconductor region (source) 14 of the drive MISFET ($DR_2$) via the contact hole 24, and the other line (lower side of memory cell) is electrically connected to the $n^+$ type semiconductor region (source) 14 of the drive MISFET ($DR_1$) via the contact hole 24. One of the two reference voltage lines 34 (Vss) (upper end of memory cell) is shared with the reference voltage line 34 (Vss) of the memory cell adjoining in the Y direction (upper side of figure), and the other line (lower end of memory cell) is shared with the reference voltage line 34 (Vss) of the memory cell adjoining in the Y direction. Due to this, the memory cell size can be reduced.

As shown in FIGS. 2 and 3, two vertical MISFETs ($SV_1$, $SV_2$), which form part of another memory cell (MC), are formed above the drive MISFETs ($DR_1$, $DR_2$). The vertical MISFET ($SV_1$) is formed above the drive MISFET ($DR_1$) and is arranged so that it overlaps with the drive MISFET ($DR_1$). Likewise, the vertical MISFET ($SV_2$) is formed above the drive MISFET ($DR_2$) and is arranged so that it overlaps with the drive MISFET ($DR_2$).

The vertical MISFET ($SV_1$) and drive MISFET ($DR_1$) of the memory cell (MC) are arranged with the vertical MISFET ($SV_2$) and drive MISFET ($DR_2$) at a location which has point symmetry relative to the center of the rectangular region enclosed by four (+) marks. Due to this, the memory cell size can be reduced.

The vertical MISFETs ($SV_1$, $SV_2$) mainly comprise a lower semiconductor layer 47, an intermediate semiconductor layer 48 and an upper semiconductor layer 49 laminated in that order perpendicular to the principal surface of the substrate, and they also comprise a laminate (P) whereof the flat pattern is a square pole (elliptical pole) shape, a gate insulating film 53 formed on the surface of the laminate (P) and a gate electrode 54 formed so as to surround the side walls of the laminate (P).

The gate insulating film 53 comprises silicon oxide and is a monolayer film formed by low-temperature thermal oxidation (for example, wet oxidation) or CVD (Chemical Vapor Deposition) at a temperature of 800° C. or less, or a laminated film comprising a low-temperature thermal oxidation film and a CVD film. Thus, by forming the gate insulating film 53 by a low temperature process, variations in the vertical MISFETs ($SV_1$, $SV_2$), such as the threshold value (Vth), can be reduced.

The gate electrode 54 comprises, for example, a silicon film, and comprises n type polycrystalline silicon. The lower semiconductor layer 47 of the laminate (P) is a p type silicon film, for example, p type polycrystalline silicon, and it forms one of the source and drain of the vertical MISFETs ($SV_1$, $SV_2$). There is no particular limitation on the intermediate semiconductor layer 48, but it is a non-doped silicon film, for example, a non-doped polycrystalline silicon, which effectively forms the substrate of the vertical MISFETs ($SV_1$, $SV_2$), and its side walls form the channel region. The upper semiconductor layer 49 consists of a p type silicon film, for example, a p type polycrystalline silicon film, and it forms the other of the source and drain of the vertical MISFETs ($SV_1$, $SV_2$). The upper semiconductor layer 49 is formed above the vertical MISFETs ($SV_1$, $SV_2$), and the upper part of the laminate (P) is electrically connected to the complementary data lines (BLT, BLB) which run transverse to the laminate (P). In other words, the vertical MISFETs ($SV_1$, $SV_2$) comprise a p channel type MISFET. In the vertical MISFET ($SV_1$, $SV_2$), the lower semiconductor layer 47 forms one of a source and drain, and the upper semiconductor layer 49 forms the other of the source and drain; however, in the following description, for the sake of convenience, the lower semiconductor layer 47 is defined as the source and the upper semiconductor layer 49 is defined as the drain.

Thus, in the vertical MISFETs ($SV_1$, $SV_2$), the source, substrate (channel region) and drain are perpendicularly laminated on the principal surface of a substrate, and a channel current flows in a perpendicular direction to the principal surface of the substrate, i.e., they form a vertical channel MISFET. The channel length direction of the vertical MISFETs ($SV_1$, $SV_2$) is the direction perpendicular to the principal surface of the substrate, and the channel length is specified by the length between the lower semiconductor layer 47 and the upper semiconductor layer 49 in a direction perpendicular to the principal surface of the substrate. The channel width of the vertical MISFETs ($SV_1$, $SV_2$) is specified by the length of the side wall perimeter of the square pole laminate. Due to this, the channel width of the vertical MISFETs ($SV_1$, $SV_2$) can be enlarged.

As will be described later, in the OFF state, when the supply voltage (Vdd) is applied to the gate electrode 54, the vertical p channel MISFET ($SV_1$, $SV_2$) will comprise a perfect depletion SOI (Silicon-On-Insulator)-vertical MISFET wherein the intermediate semiconductor layer 48, which is the substrate of the vertical MISFET, is completely depleted, so that the OFF leakage current ($I_{OFF}$ (P)) can be reduced compared with the ON current ($I_{ON}$(P)) and the memory cell (MC) can be formed. The threshold (Vth) of the vertical p channel MISFET ($SV_1$, $SV_2$) is controlled by the work function of the gate electrode 54, e.g., the gate electrode 54 may comprise a p type silicon film (p type polycrystalline silicon), p type SiGe film, non-doped SiGe film, n type SiGe film and a high melting point metal film. Although the intermediate semiconductor layer was described as a non-doped silicon film, the invention is not limited thereto. For example, n type or p type impurities may be introduced into the intermediate semiconductor layer 48 (channel doping), and by adjusting the profile of the channel impurities in the perpendicular direction to the principal surface of the substrate, the intermediate semiconductor layer 48, which is the substrate of the vertical MISFET, can be completely depleted, and the OFF leakage current ($I_{OFF}$ (P)) can be reduced compared with the ON current ($I_{ON}$ (P)).

As shown in FIG. 3, the lower semiconductor layer (source) 47 of the vertical MISFET ($SV_1$) is electrically connected to the n+ type semiconductor region (drain) 14 of the drive MISFET ($DR_1$) via the connecting conductive layer 46 formed in the lower part, and the plug 41 in the contact hole 40 formed underneath this. The plug 41 in the contact hole 40, which connects the lower semiconductor layer (source) 47 of the vertical MISFET ($SV_1$) and the n+ type semiconductor region (drain) 14 of the drive MISFET ($DR_1$), is connected also to the gate electrode 7A of the drive MISFET ($DR_2$), as shown in the right-hand side of this figure. Although not shown in FIG. 3, the plug 41 in the contact hole 40, which connects the lower semiconductor layer (source) 47 of the vertical MISFET ($SV_2$) and the n+ type semiconductor region (drain) 14 of the drive MISFET ($DR_2$), is connected also to the gate electrode 7A of the drive MISFET ($DR_1$). In other words, the plugs 41, 41 in the two contact holes 40, 40 formed in the memory cell function as a conductive layer which cross-couples the drive MISFETs ($DR_1$, $DR_2$) and vertical MISFETs ($SV_1$, $SV_2$). The connecting conductive layer 46 comprises a metal film, for example, based mainly on W silicide ($WSi_2$), and the plug 41 comprises a metal film for example based mainly on W. The connecting conductive layer 46 comprises a conductive film based mainly on W silicide ($WSi_2$), or a conductive film wherein a W silicide film is laminated on a metal film, and the plug 41 comprises a metal film based mainly on W.

The connecting conductive layer 46 may comprise a conductive film wherein a W film is laminated on a WN (titanium nitride) film. In this case, although the oxidation resistance margin decreases compared with the conductive film based mainly on W silicide, there is the advantage that the electrical resistance becomes small. The question, of which of these conductive films should be selected, should be determined by product specification. For example, for a medium or low speed operating specification, the conductive film based mainly on W silicide, which is excellent for productivity, is selected, whereas for high speed operation, the laminate based mainly on W, which gives priority to performance, is selected.

The plugs 41, 41 in the two contact holes 40, 40 formed in the memory cell (MC) form a cross-coupled interconnection 41 which electrically connects the gate electrode 7A of one of the drive MISFETs ($DR_1$, $DR_2$) and the drain (n+ type semiconductor region 14) of the other of the drive MISFETs ($DR_1$, $DR_2$), and the laminates (P) of square pole shape forming the vertical MISFETs ($SV_1$, $SV_2$), are superimposed on the plugs 41, 41.

That is, the laminate (P) of square pole shape is formed so that, as seen in plan view, it overlaps the drain (n+ type semiconductor region 14) of the drive MISFETs ($DR_1$, $DR_2$), and the current path from the drain (n+ type semiconductor region 14) of the drive MISFETs ($DR_1$, $DR_2$) to the lower semiconductor layer (source) 47, the intermediate semiconductor layer 48 (substrate, channel) and the upper semiconductor layer 49 (drain) of the vertical MISFETs ($SV_1$, $SV_2$) is formed so that current mainly flows perpendicularly to the principal surface of the substrate.

Due to this, the memory cell size can be reduced. Further, the current path is formed so that current from the drain (n+ type semiconductor region 14) of the drive MISFETs ($DR_1$, $DR_2$) to the complementary data lines (BLT, BLB) via the vertical MISFETs ($SV_1$, $SV_2$) mainly flows perpendicular to the principal surface of the substrate, so that the read/write operating speed of the memory cell (MC) can be improved.

The gate electrodes 54 of the vertical MISFETs ($SV_1$, $SV_2$) are formed so as to surround the side walls of the square pole laminates (P), and the word line (WL), which was electrically connected with the gate electrode 54 further outside this gate electrode 54, is formed so as to surround the laminates (P) and the gate electrode 54 of that side wall. The word line (WL) comprises a conductive film, such as n type polycrystalline silicon, as is used for the gate electrode 54.

As shown in FIG. 3, the word line (WL) is embedded in the groove 56 that is formed in the insulating film, comprising a silicon oxide film 55 around the laminate (P). As shown in FIG. 2, in plan view, one word line (WL) is arranged between the two reference voltage lines 34 (Vss), 34 (Vss) at the upper end and lower end of the occupancy region of one memory cell, and it extends in the X direction in the same way as the reference voltage line 34 (Vss).

Due to this, the width of a word line (WL) can be made thick without increasing the memory cell size, and the word line (WL) can be made to surround the square pole laminate (P) forming the source, substrate (channel) and drain region of the vertical MISFETs ($SV_1$, $SV_2$). The word line (WL) contains conductive films, such as a Co silicide layer 60. The word line (WL) may consist of a silicide film, a high melting point metal film or a metal film. Due to this, the resistance value is reduced, and the read/write operating speed of the memory cell (MC) can be increased.

The complementary data lines (BLT, BLB) extend above the vertical MISFETs ($SV_1$, $SV_2$) so that the complementary data lines (BLT, BLB) run transverse to the laminate (P), above the laminate (P). One (BLT) of the complementary data lines (BLT, BLB) is electrically connected with the upper semiconductor layer (drain) 49 of the vertical MISFET ($SV_1$) via a plug 65 formed in the topmost part of one laminate (P), and the other (BLB) is electrically connected to the upper semiconductor layer (drain) 49 of the vertical MISFET ($SV_2$) via the plug 65 formed in the topmost part of the other laminate (P). That is, the complementary data lines (BLT, BLB) are arranged so that the complementary data lines (BLT, BLB) overlap with the laminates (P) and are electrically connected to the upper semiconductor layer 49 (drain).

The complementary data lines (BLT, BLB) comprise a metal film based, for example, mainly on copper (Cu). The plug 65 comprises a metal film based mainly, for example, on W. Due to this, the read/write operating speed of the memory cell (MC) can be improved.

As shown in FIG. 2, one (BLT) of the complementary data lines (BLT, BLB) is arranged so that it overlaps with the active region (L) in which the drive MISFET ($DR_1$) was formed, and it extends in the Y direction.

The other (BLB) of the complementary data lines (BLT, BLB) is arranged so that it overlaps with the active region (L) in which the drive MISFET ($DR_2$) was formed, and it extends in the Y direction. Due to this, the memory cell size can be reduced.

Thus, the SRAM of this embodiment forms a memory cell from two drive MISFETs ($DR_1$, $DR_2$) and two vertical MISFETs ($SV_1$, $SV_2$), the vertical MISFET ($SV_1$) is formed above the drive MISFET ($DR_1$) and is arranged so that it overlaps with the drive MISFET ($DR_1$). Likewise, the vertical MISFET ($SV_2$) is formed above the drive MISFET ($DR_2$) and is arranged so that it overlaps with the drive MISFET ($DR_2$). Due to this layout, the occupancy surface area of the memory cell is effectively equal to the occupancy surface area of the two drive MISFETs ($DR_1$, $DR_2$) and is approximately ⅓ compared with a perfect CMOS type memory cell of the same design rule comprising six MISFETs.

Since the SRAM of this embodiment is formed from p channel type vertical MISFETS ($SV_1$, $SV_2$) above n channel type drive MISFETs ($DR_1$, $DR_2$), it differs from the perfect CMOS type memory cell wherein a p channel type load MISFET is formed in a n type well of a substrate, so that it is unnecessary to provide a region separating the p type well and n type well in the occupancy region of one memory cell. Therefore, the occupancy region of the memory cell is further reduced to approximately ¼ of a perfect CMOS type memory cell having the same design rules comprising six MISFETs, and a high speed, high capacitance SRAM can be manufactured.

Next, the construction of the SRAM of this embodiment will be described in still more detail together with a method of manufacture thereof with reference to FIG. 4-FIG. 61. In the cross-sectional views illustrating the method of manufacturing the SRAM, the portion identified by the symbol A-A' represents a cross-section of the memory cell along a line A-A' in FIG. 2, the portion identified by the symbol B-B' represents a cross-section of the memory cell along a line B-B' in FIG. 2, and other portions represent cross-sections of part of the peripheral circuit region. The peripheral circuit of the SRAM comprises a n channel type MISFET and a p channel type MISFET, but as these two types of MISFET have almost identical constructions, except for the fact that the conductivity type is reversed, only one (the p channel type MISFET) is shown. Also, the n channel and p channel MISFETs which constitute the peripheral circuit may form a X and Y decoder circuit, a sense amplifier circuit, an input/output circuit or a logical circuit, but this list is not exhaustive, and the n channel and p channel MISFETs may also form a logical circuit, such as a microprocessor or CPU, etc. Also, in the plan views (plan views of the memory array) illustrating the method of manufacturing the SRAM, only the main conductive layers forming the memory cell and their connection regions are shown, and the insulating films formed between the conductive layers are in principle omitted.

Figure 4:
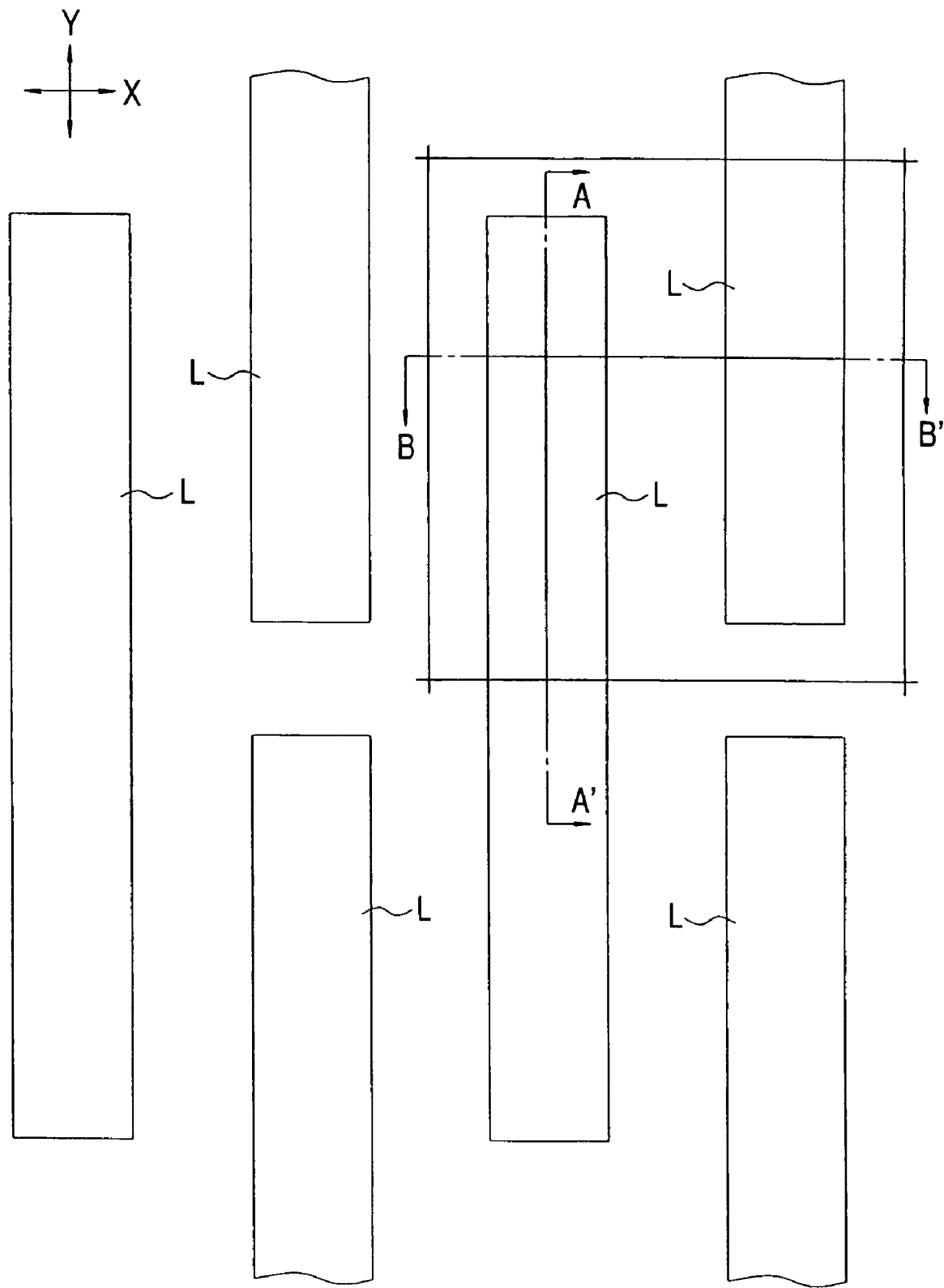
FIG. 4 is a plan view showing a method of manufacturing a semiconductor memory device according to one embodiment of this invention.
Figure 5:
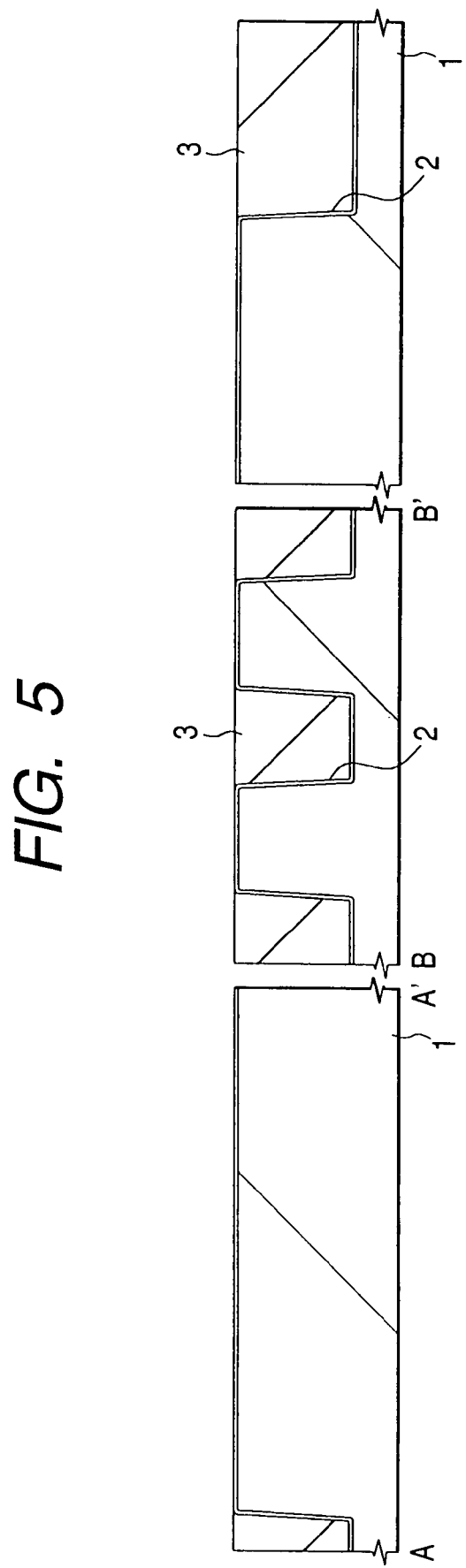
FIG. 5 is a cross-sectional view showing a method of manufacturing a semiconductor memory device according to one embodiment of this invention.

First, as shown in FIGS. 4 and 5, an isolation groove 2 is formed in the isolation region of the principal surface of the substrate 1 which comprises p type single crystal silicon. An isolation part is formed by embedding the silicon oxide film 3 in the isolation groove 2, for example, by forming the principal surface of a substrate 1 using dry etching, depositing an insulating film, such as the silicon oxide film 3, by CVD on the substrate 1, including the interior of this groove 2, and then removing the unnecessary silicon oxide film 3 on the exterior of the groove 2 by chemical mechanical polishing (CMP). Due to the formation of this isolation part, an island-shaped active region (L) having a perimeter specified by the isolation part is formed in the principal surface of the substrate 1 of the memory array.

As shown in FIG. 4, the active region (L) formed in the substrate 1 of the memory array has a flat rectangular pattern extending in the vertical direction (the Y direction) of the figure. Each of these active regions (L) is shared by two memory cells adjoining in the Y direction. That is, one drive MISFET ($DR_1$ or $DR_2$) of one memory cell and one drive MISFET ($DR_1$ or $DR_2$) of one memory cell adjoining in the Y direction are formed in one active region (L).

Figure 6:
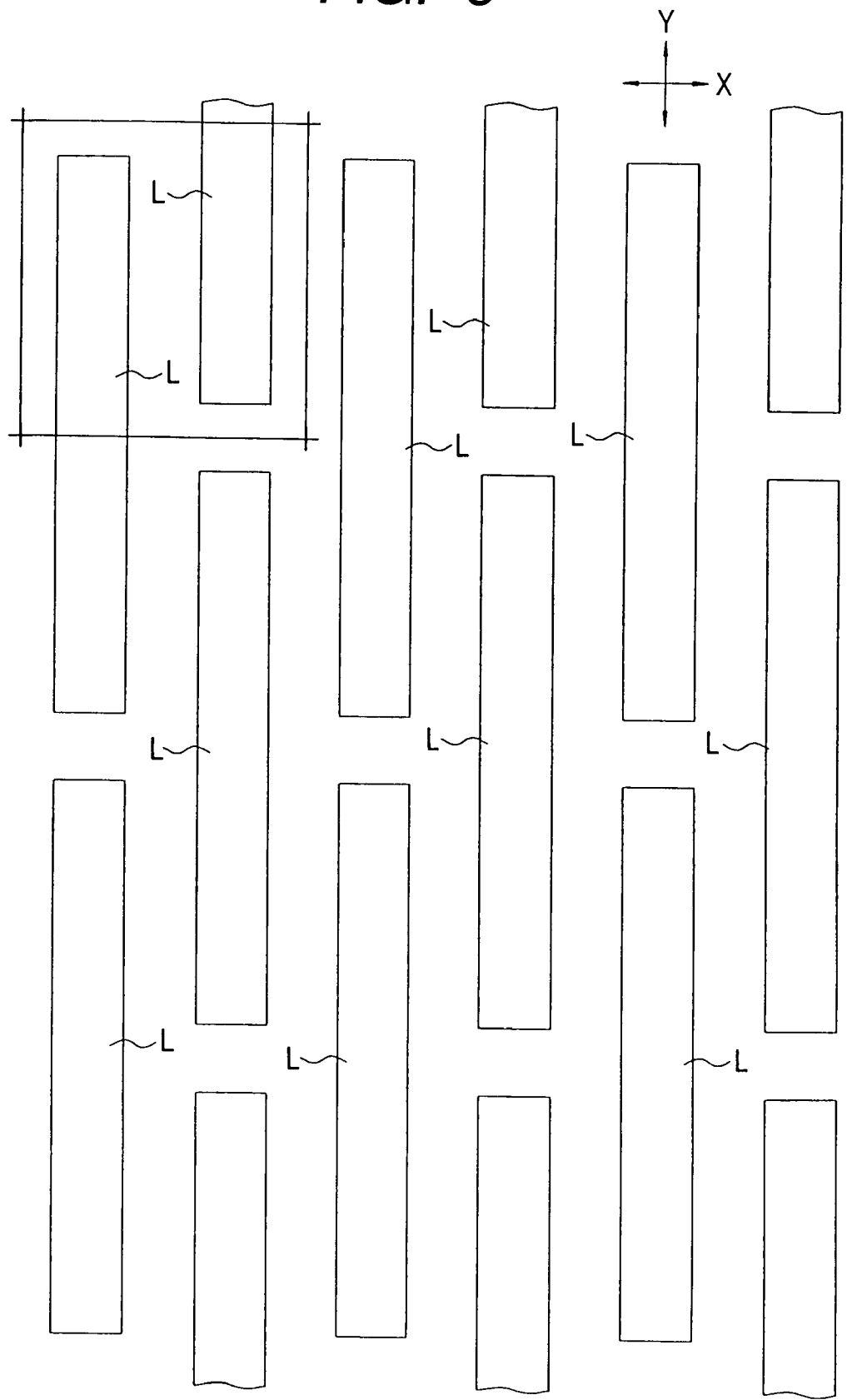
FIG. 6 is a plan view showing a method of manufacturing a semiconductor memory device according to one embodiment of this invention.

FIG. 6 shows the flat pattern of the active region (L) formed in the occupancy region of about 12 memory cells. The rectangular region enclosed by four (+) marks, which is shown in FIGS. 4 and 6 represents the occupancy region of one memory cell. The dimension thereof in the vertical direction (Y direction) is for example, 0.78 µm, and in the horizontal direction (X direction) it is, for example, 0.72 µm. That is, the occupancy region of one memory cell is 0.72 µm×0.78 µm=0.5616 µm².

Figure 7:
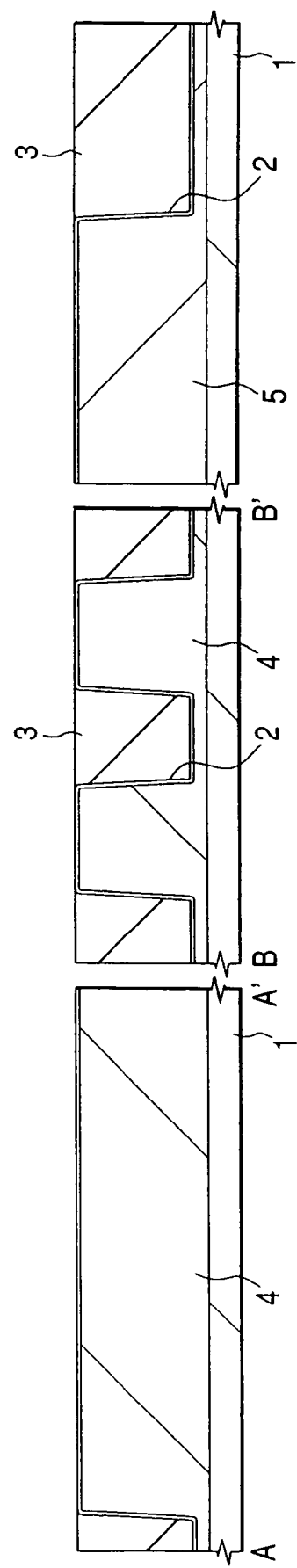
FIG. 7 is a cross-sectional view showing a method of manufacturing a semiconductor memory device according to one embodiment of this invention.

Next, as shown in FIG. 7, a p type well 4 and n type well 5 are formed by ion implantation of phosphorus (P) in part of the substrate 1 and ion implantation of boron (B) in another part, heat-treating the substrate 1, and diffusing phosphorus and boron in the substrate 1. As shown in the figure, only the p type well 4 is formed, and the n type well 5 is not formed, in the substrate 1 of the memory array. On the other hand, a n type well 5 and a p type well, not shown, are formed in the substrate 1 of the peripheral circuit region.

Figure 8:
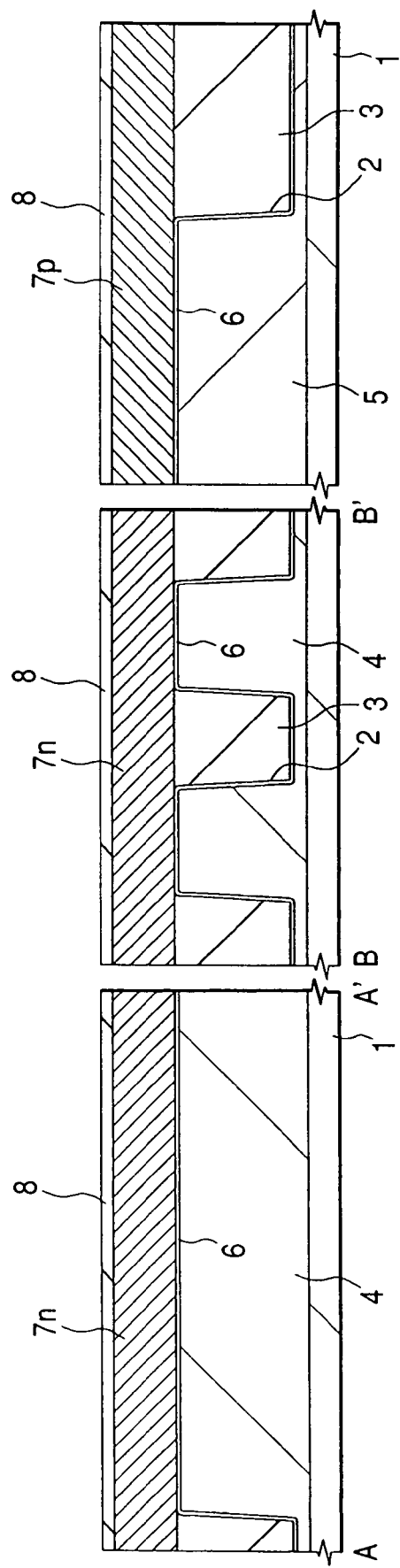
FIG. 8 is a cross-sectional view showing a method of manufacturing a semiconductor memory device according to one embodiment of this invention.

Next, as shown in FIG. 8, the substrate 1 is thermally oxidized to form a gate insulating film 6 having a film thickness of approx. 3 nm-4 nm, comprising silicon oxide in the surface of the p type well 4 and n type well 5, respectively. Then, for example, a n type polycrystalline silicon film is formed on the first gate insulating film 6 of the p type well 4, a p type polycrystalline silicon film 7p is formed on the first gate insulating film 6 of the n type well 5, and a silicon oxide film 8 having a film thickness of approx. 40 nm is deposited by CVD, respectively, above the n type polycrystalline silicon film 7n and p type polycrystalline silicon film 7p.

In order to form the n type polycrystalline silicon film 7n and p type polycrystalline silicon film 7p, a non-doped polycrystalline silicon film (or amorphous silicon film) having a film thickness of approx. 180 nm is deposited by CVD on the gate insulating film 6, then phosphorus (or arsenic) is ion implanted in the polycrystalline silicon film (or amorphous silicon film) on the p type well 4, and boron is implanted in the polycrystalline silicon film (or amorphous silicon film) on the n type well 5.

Figure 9:
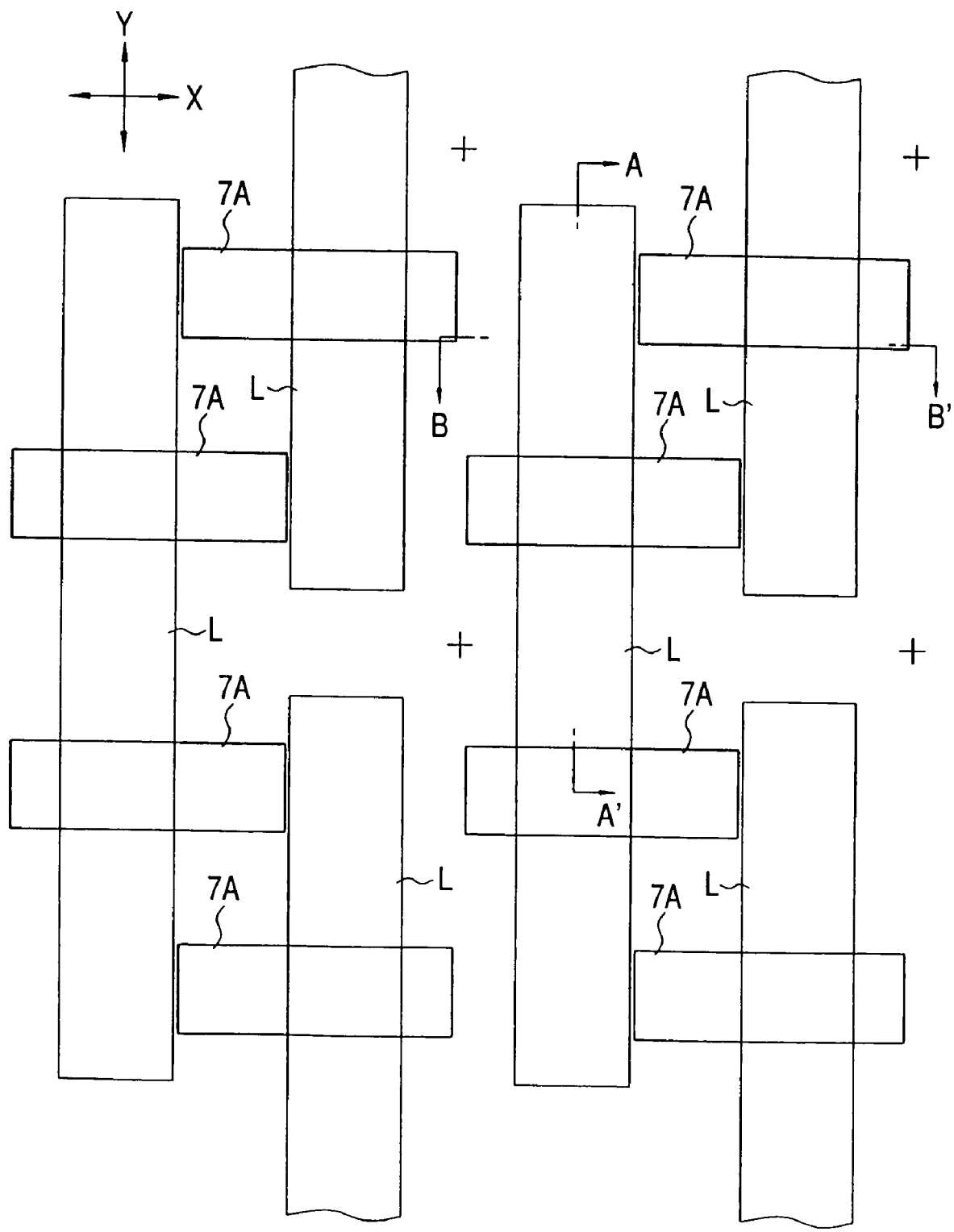
FIG. 9 is a plan view showing a method of manufacturing a semiconductor memory device according to one embodiment of this invention.
Figure 10:
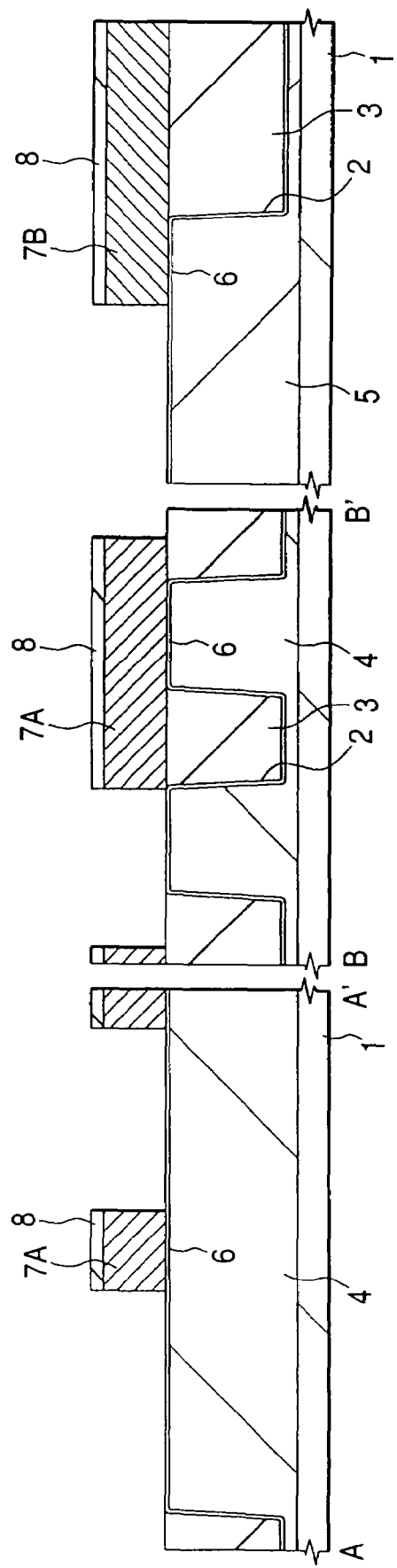
FIG. 10 is a cross-sectional view showing a method of manufacturing a semiconductor memory device according to one embodiment of this invention.

Next, as shown in FIGS. 9 and 10, a gate electrode 7A comprising a n type polycrystalline silicon film 7n on the p type well 4 of the memory array, and a gate electrode 7B comprising a p type polycrystalline silicon film 7p on the n type well 5 of the peripheral circuit region, are formed, for example, by dry etching the n type polycrystalline silicon film 7n and p type polycrystalline silicon film 7p. Although not shown, a gate electrode comprising the n type polycrystalline silicon film 7n is formed on the p type well 4 of the peripheral circuit region at this time.

In order to form the gate electrodes 7A, 7B, for example, the silicon oxide film 8 is patterned by dry etching using a photoresist film as a mask so that it has the same flat shape as the gate electrodes 7A, 7B, then the n type polycrystalline silicon film 7n and the p type polycrystalline silicon film 7p are dry-etched using the patterned silicon oxide film 8 as a mask. In the silicon oxide, the etching selectivity ratio relative to the polycrystalline silicon is large compared with the photoresist, so that the gate electrodes 7A, 7B can be patterned with high precision compared with the case where the polycrystalline silicon films (7n, 7p) are etched using the photoresist as a mask, and the silicon oxide film 8 and polycrystalline silicon films (7n, 7p) are etched continuously.

The gate electrode 7A, which is formed in the memory array, is the gate electrode of the drive MISFETs ($DR_1$, $DR_2$). As shown in FIG. 9, this gate electrode 7A has a flat rectangular pattern extending in the X direction of the figure, and the width in the Y direction, i.e., the gate length, is, for example, 0.13-0.14 µm.

Also, as shown in FIG. 9, the layouts of the two gate electrodes 7A, 7A formed in the occupancy region of one memory cell are identical for memory cells adjoining in the X direction, but they are inverted for memory cells adjoining in the Y direction. That is, plural memory cells arranged in the X direction have identical layouts, but plural memory cells arranged in the Y direction have mutually inverted layouts.

The above-mentioned gate electrodes 7A, 7B can also be formed by the following methods.

Figure 11:
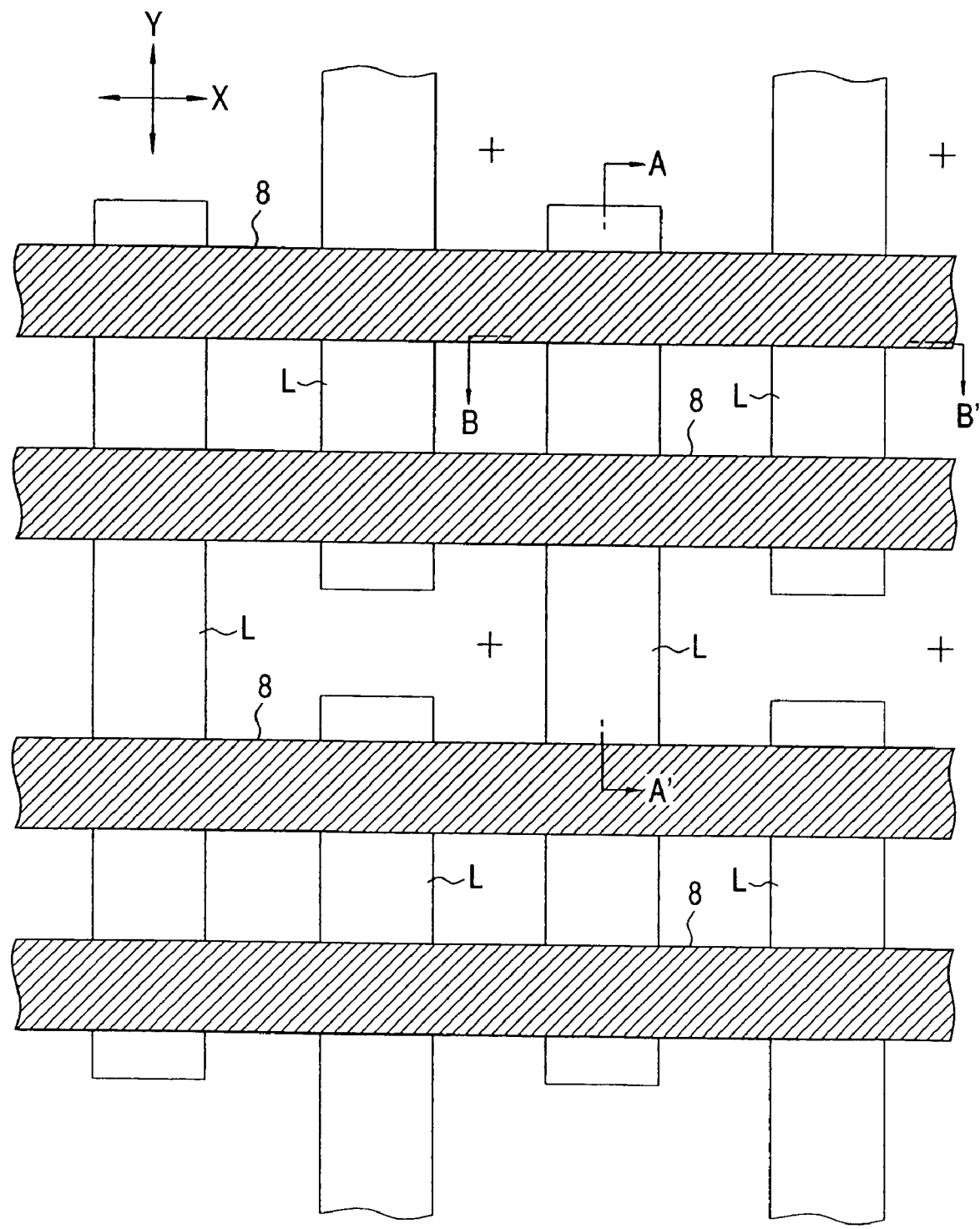
FIG. 11 is a plan view showing a method of manufacturing a semiconductor memory device according to one embodiment of this invention.
Figure 12:
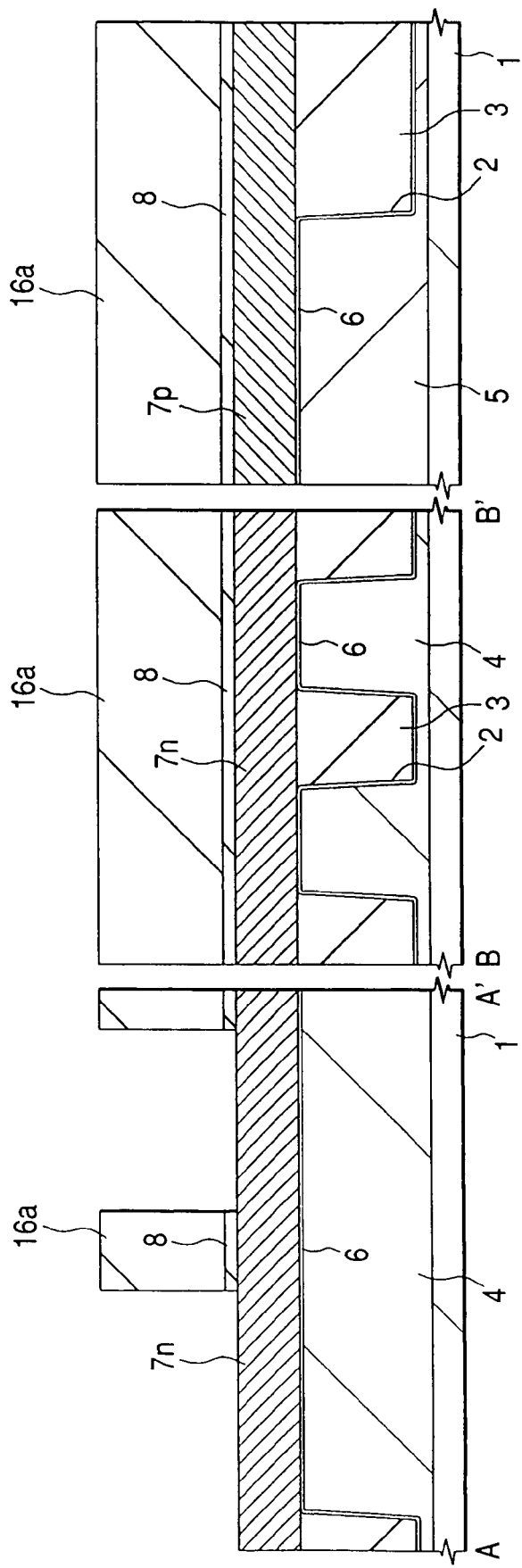
FIG. 12 is a cross-sectional view showing a method of manufacturing a semiconductor memory device according to one embodiment of this invention.
Figure 13:
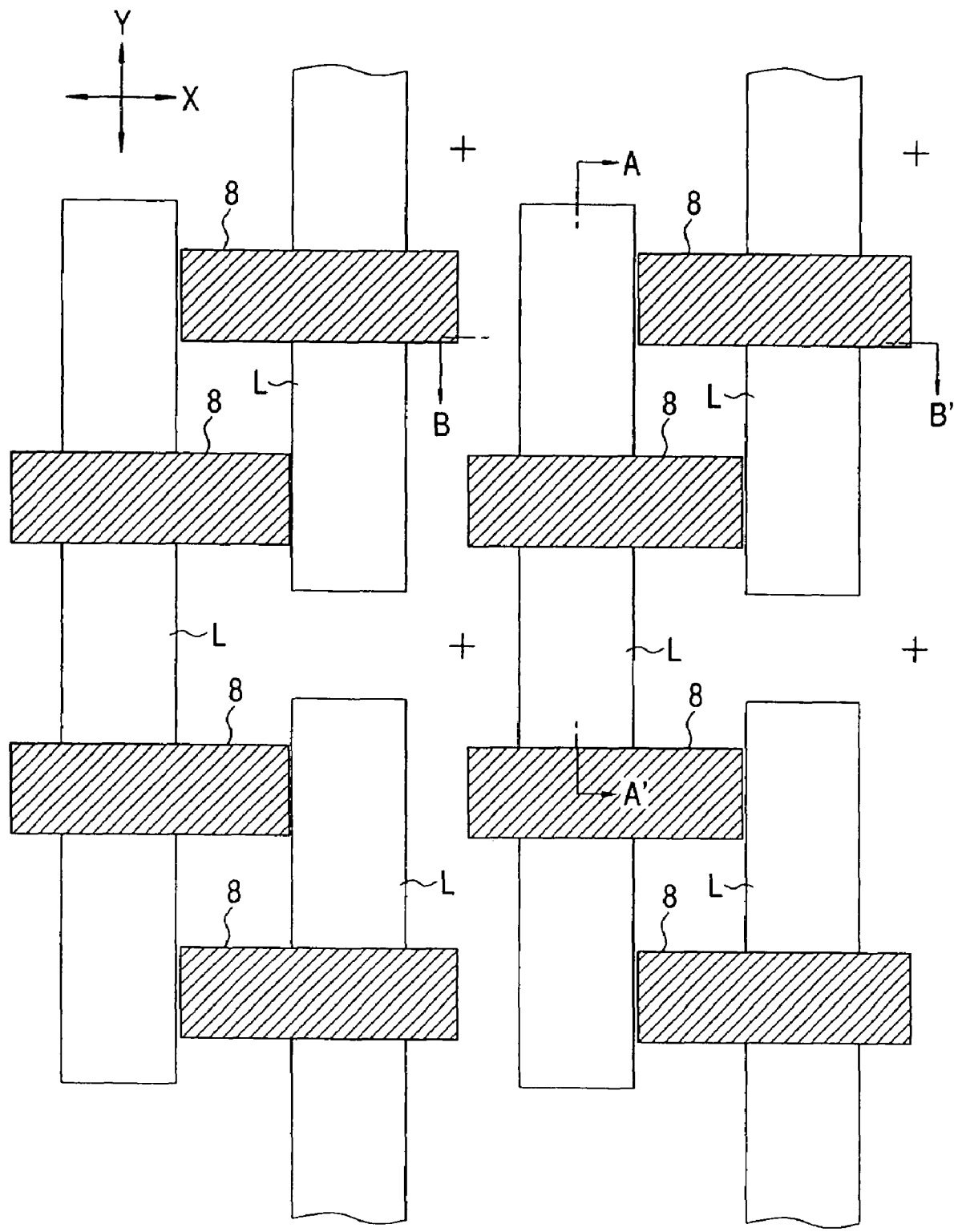
FIG. 13 is a plan view showing a method of manufacturing a semiconductor memory device according to one embodiment of this invention.
Figure 14:
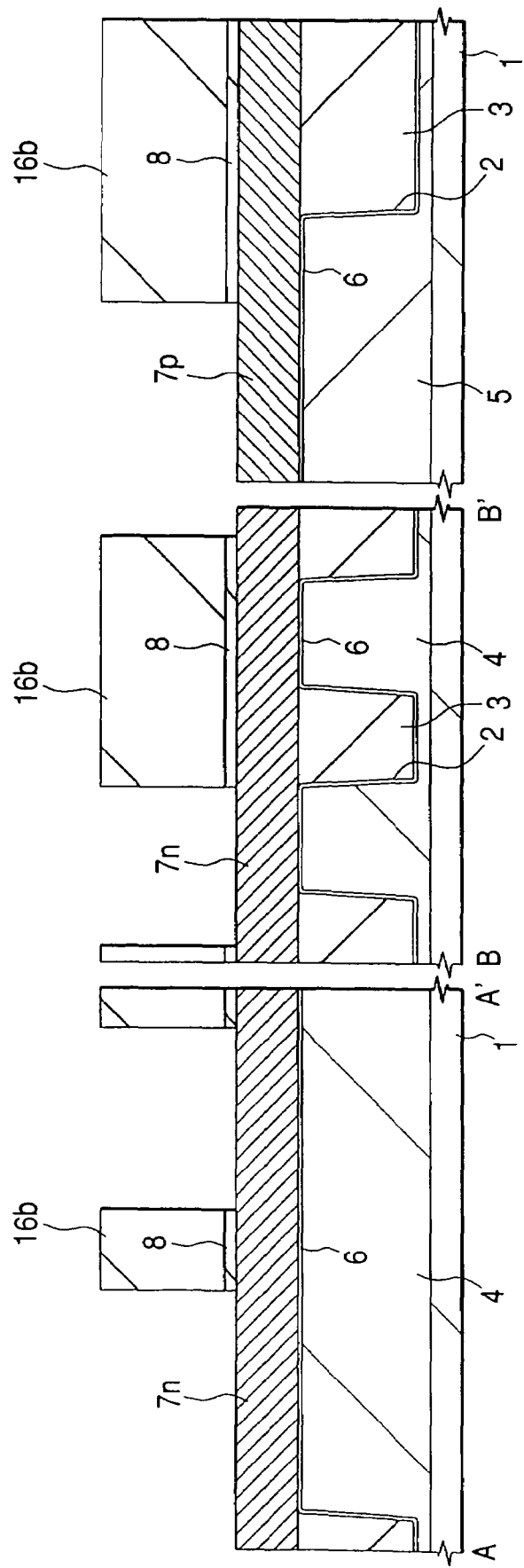
FIG. 14 is a cross-sectional view showing a method of manufacturing a semiconductor memory device according to one embodiment of this invention.

First, as shown in FIGS. 11 and 12, dry etching of the silicon oxide film 8 is performed using a first photoresist film 16a as a mask. At this time, as shown in FIG. 11, the silicon oxide film 8 is patterned in a belt shape in the X direction. Next, as shown in FIGS. 13 and 14, the silicon oxide film 8 is patterned so that it has the same flat shape (rectangular) as the gate electrodes 7A, 7B using the second photoresist film 16b as a mask. Subsequently, dry etching of the n type polycrystalline silicon film 7n and the p type polycrystalline silicon film 7p is performed using this silicon oxide film 8 as a mask.

Thus, in the above-mentioned etching method, the silicon oxide film 8 is patterned in the X direction, and then it is patterned in the Y direction. Alternatively, it may be patterned in the Y direction, and then patterned in the X direction. According to this etching method, to form a silicon oxide film 8 having the same flat shape (rectangular) as the gate electrode 7A, etching must be performed twice using two different masks, but pattern deformation can be lessened compared with the case where the silicon oxide film 8 of the same flat shape (rectangular) as the gate electrode 7A is formed using one mask.

Specifically, if the rectangular pattern is formed by one etching when the gate length of the gate electrode 7A is very close to the wavelength of the exposure light, the four corners of the rectangle will be rounded due to light interference. For this reason, if the pattern width decreases near the end of gate electrode 7A and this reaches the inner side of the active region (L), the properties of the drive MISFETs ($DR_1$, $DR_2$) may be degraded.

This problem can be avoided if the end of the gate electrode 7A is moved far away from the active region (L). However, although this method is permissible in peripheral circuits, such as a logical circuit or a power supply circuit where the density of components is low, it is not suitable for a circuit where the component density must be increased, as in a memory array. On the other hand, when a rectangular gate pattern is formed by two etchings using two masks, the roundness of the four corners of the rectangle is small and the amount by which the end of the gate electrode 7A retreats inside the active region (L) is small, so that deterioration of the properties of the drive MISFETs ($DR_1$, $DR_2$) can be suppressed. In this case, since the end of the gate electrode 7A can be brought close to the active region (L), the gap between adjacent active regions (L) can be reduced by a corresponding amount, and a highly integrated memory chip and system chip can be produced.

Figure 15:
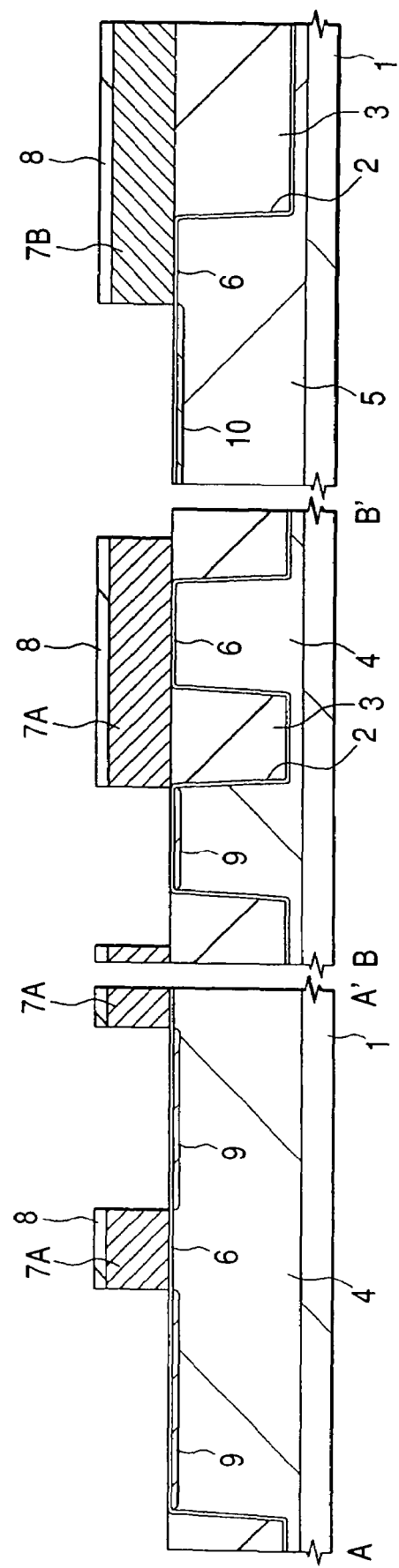
FIG. 15 is a cross-sectional view showing a method of manufacturing a semiconductor memory device according to one embodiment of this invention.

Next, as shown in FIG. 15, a relatively low-concentration $n^-$ type semiconductor region 9 is formed, for example, by ion implantation of phosphorus or arsenic in the p type well 4, and a relatively low-concentration $n^-$ p-type semiconductor region 10 is formed, for example, by ion implantation of boron in the n type well 5. The $n^-$ type semiconductor region 9 is formed to give the source and drain of the drive MISFETs ($DR_1$, $DR_2$), as well as the n channel type MISFET of the peripheral circuit, a LDD (Lightly Doped Drain) construction, and the $p^-$ type semiconductor region 10 is formed to give the source of the p channel type MISFET of the peripheral circuit a LCD construction.

Figure 16:
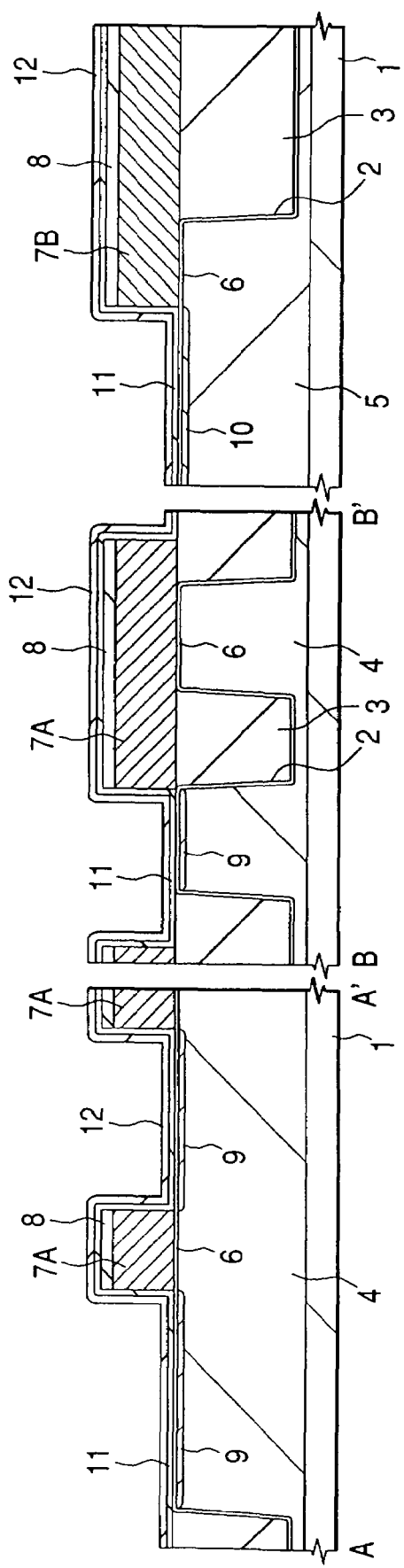
FIG. 16 is a cross-sectional view showing a method of manufacturing a semiconductor memory device according to one embodiment of this invention.
Figure 17:
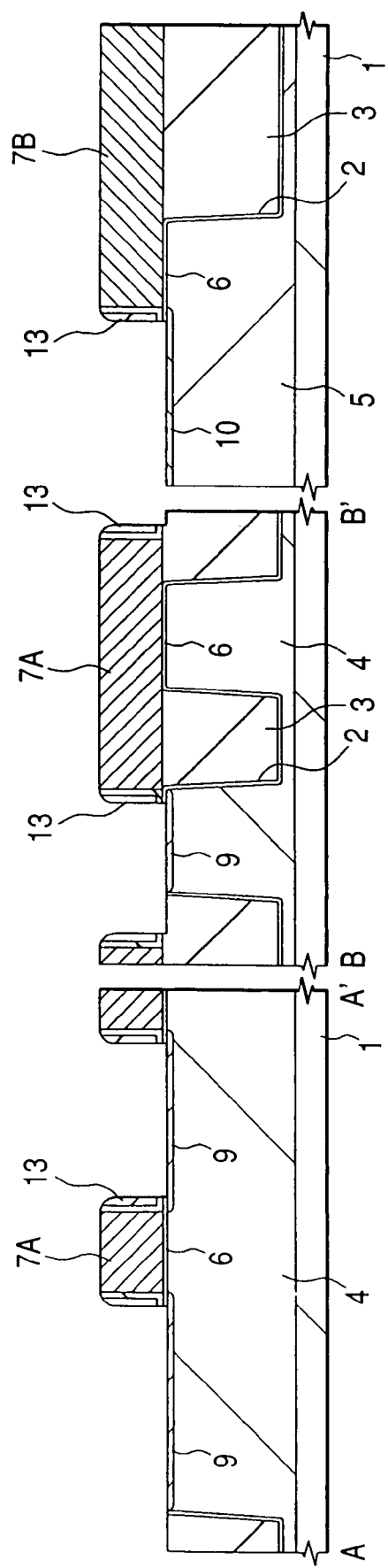
FIG. 17 is a cross-sectional view showing a method of manufacturing a semiconductor memory device according to one embodiment of this invention.

Next, as shown in FIG. 16, a silicon oxide film 11 having a film thickness of approx. 20 nm and a silicon nitride film 12 having a film thickness of approx. 25 nm were deposited by CVD on the substrate 1; and, as shown in FIG. 17, side wall spacers 13 are respectively formed on the side walls of the gate electrodes 7A, 7B by anisotropic etching of the silicon nitride film 12 and silicon oxide film 11. At this time, the upper surfaces of the gate electrodes 7A, 7B, and the upper surfaces of the $n^-$ type semiconductor region 9 and $p^-$ type semiconductor region 10, are exposed by etching the silicon oxide film 8 covering the surfaces of the gate electrodes 7A, 7B and the silicon oxide film (gate insulating film 6) of the surface of the substrate 1.

Figure 18:
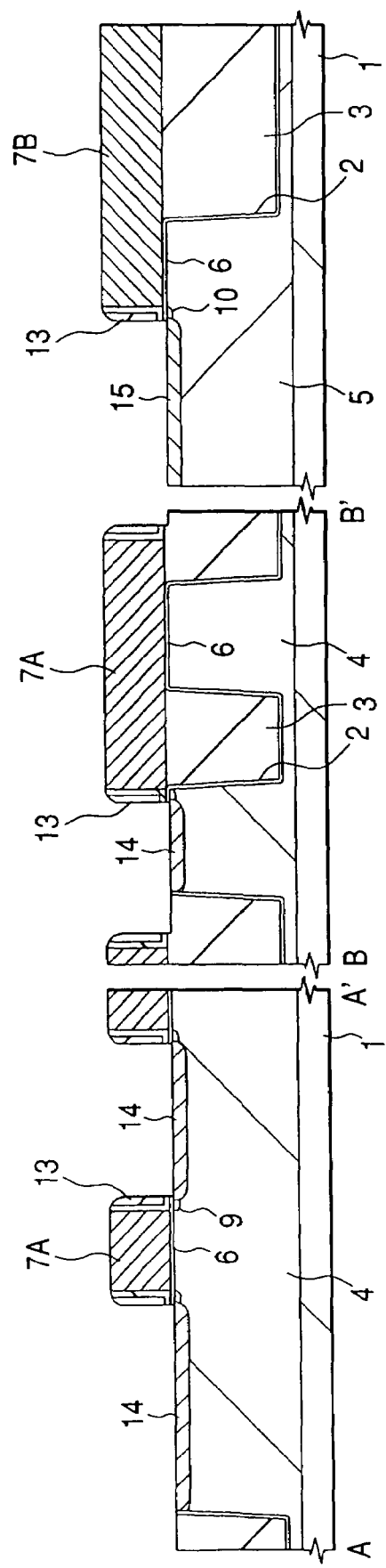
FIG. 18 is a cross-sectional view showing a method of manufacturing a semiconductor memory device according to one embodiment of this invention.

Next, as shown in FIG. 18, a relatively high-concentration $n^+$ type semiconductor region 14 is formed by ion implantation of phosphorus or arsenic in the p type well 4, and a relatively high-concentration $p^+$ type semiconductor region 15 is formed by ion implantation of boron in the n type well 5. The $n^+$ type semiconductor region 14 that is formed in the p type well 4 of the memory array constitutes the source and drain of the drive MISFETs ($DR_1$, $DR_2$), and the $p^+$ type semiconductor region 15 formed in the n type well 5 of the peripheral circuit region constitutes the source and drain of the p channel type MISFET of the peripheral circuit. Also, at this time, a relatively high-concentration $n^+$ type semiconductor region, which constitutes the source and drain of a n channel type MISFET, is formed by ion implantation of phosphorus or arsenic in a p type well of the peripheral circuit region, not shown.

Figure 19:
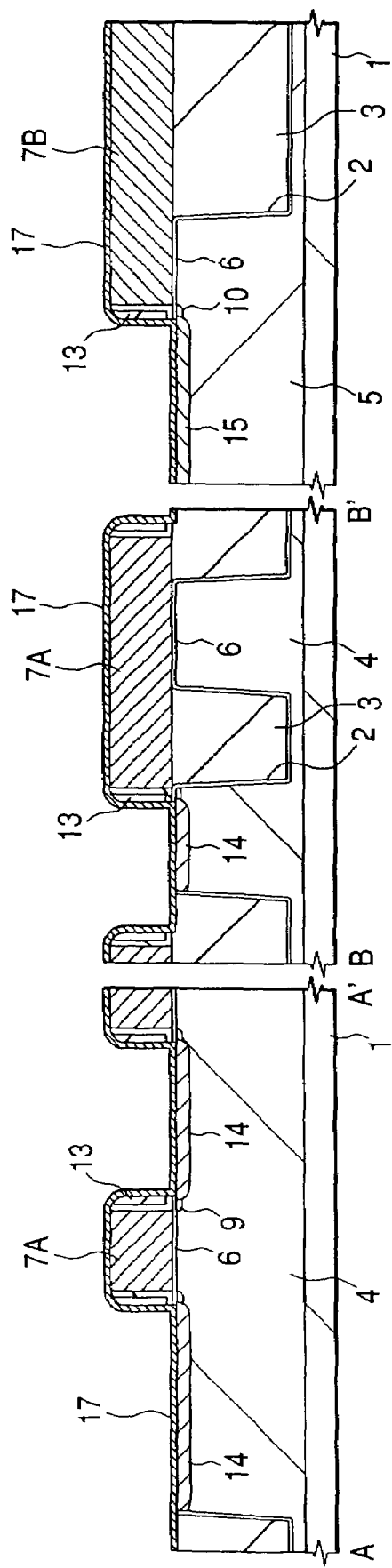
FIG. 19 is a cross-sectional view showing a method of manufacturing a semiconductor memory device according to one embodiment of this invention.
Figure 20:
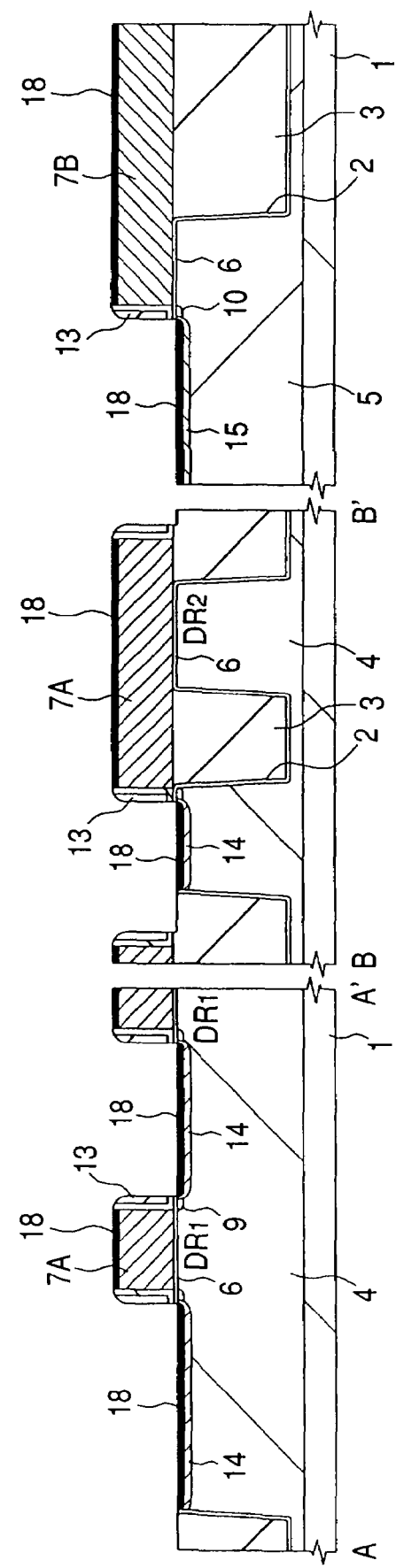
FIG. 20 is a cross-sectional view showing a method of manufacturing a semiconductor memory device according to one embodiment of this invention.

Next, as shown in FIG. 19, a cobalt (Co) film 17 having a film thickness of approx. 8 nm is deposited by sputtering on the substrate 1. Then, as shown in FIG. 20, the substrate 1 is heat-treated to make the Co film 17, the gate electrodes 7A, 7B and the substrate 1 react, and a Co silicide layer 18, which is a silicide layer, is formed on the surfaces of the electrodes 7A, 7B, respectively, and the surfaces of the source and drain ($n^+$ type semiconductor region 14, $p^+$ type semiconductor region 15) by removing the unreacted Co film 17 by etching. Due to this, the n channel type drive MISFETs ($DR_1$, $DR_2$) are formed in the memory array, and a p channel type MISFET (Qp) and n channel type MISFET (not shown) are formed in the peripheral circuit region.

Figure 21:
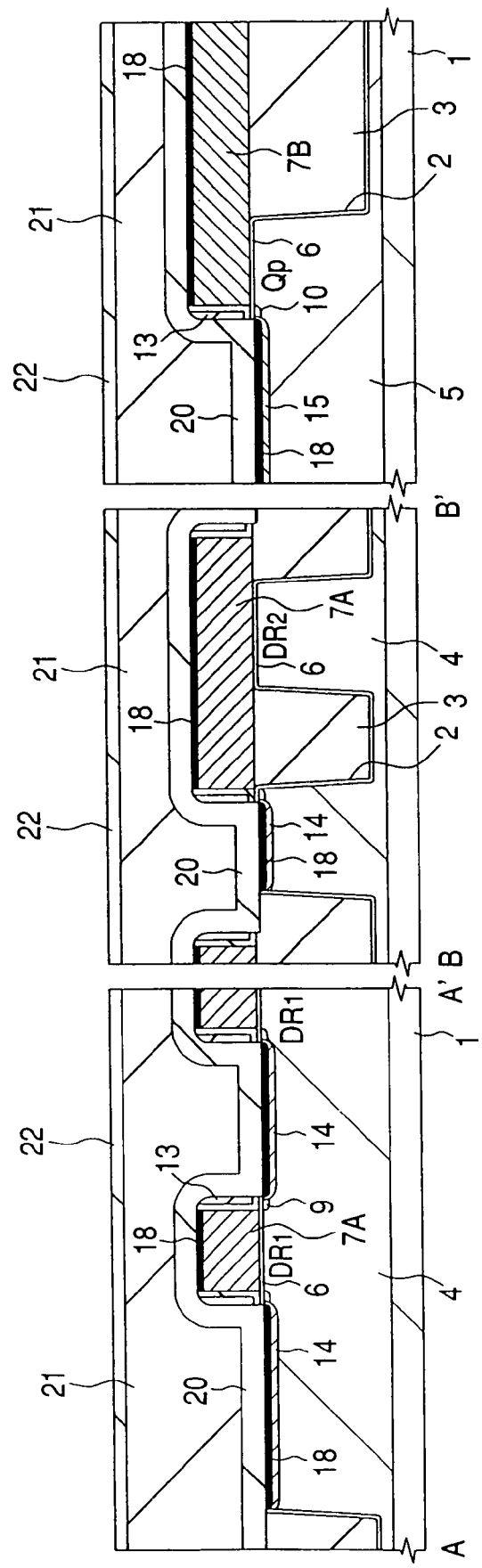
FIG. 21 is a cross-sectional view showing a method of manufacturing a semiconductor memory device according to one embodiment of this invention.

Next, as shown in FIG. 21, a silicon nitride film 20 having a film thickness of approx. 50 nm and silicon oxide film 21 having a film thickness of approx. 400 nm, for example, are deposited by CVD as insulating films on the substrate 1, the surface of the silicon oxide film 21 is flattened by chemical mechanical polishing, and a silicon oxide film 22 having a film thickness of approx. 90 nm is deposited as an insulating film, for example by CVD, above the silicon oxide film 21.

Figure 22:
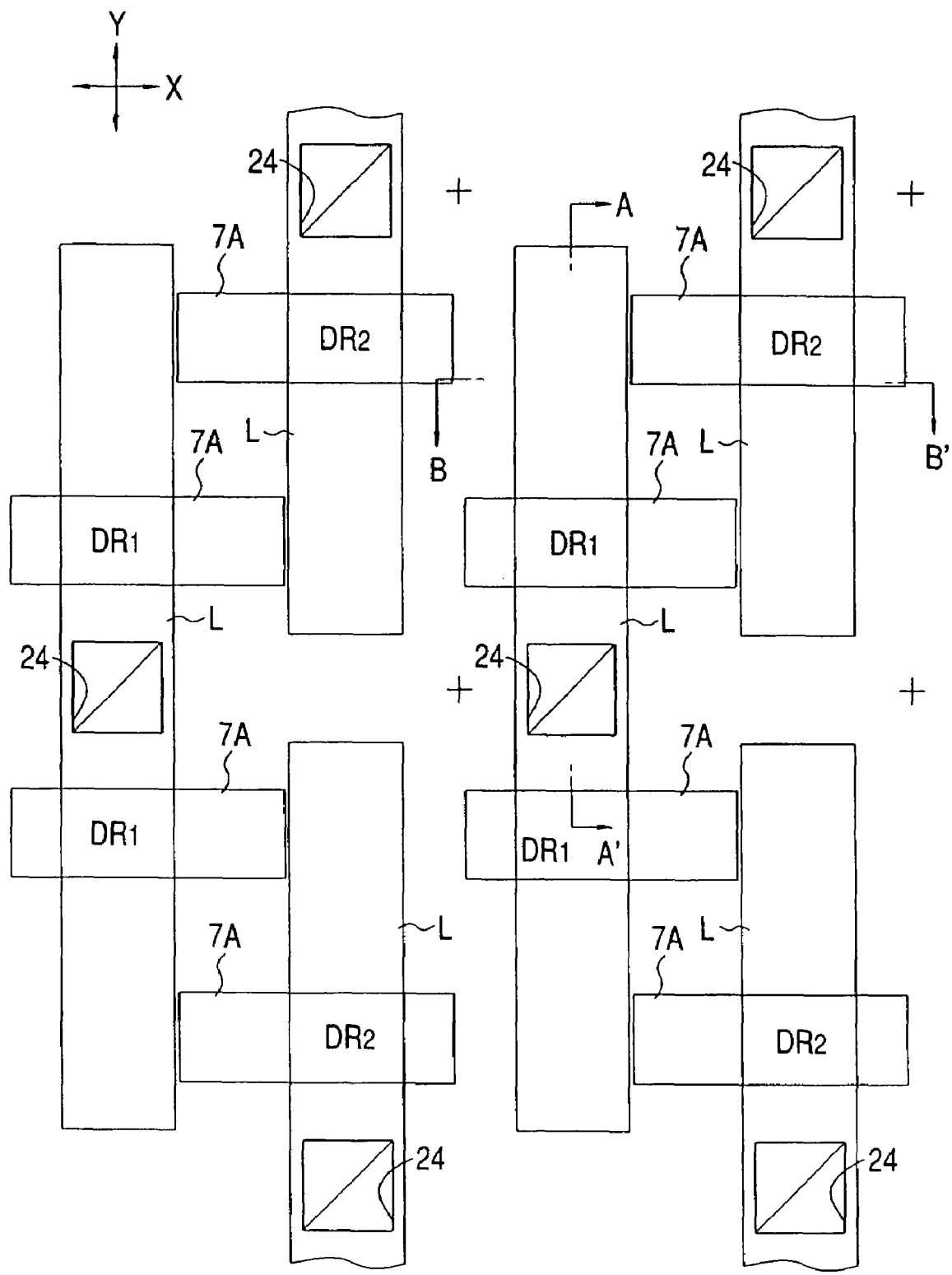
FIG. 22 is a plan view showing a method of manufacturing a semiconductor memory device according to one embodiment of this invention.
Figure 23:
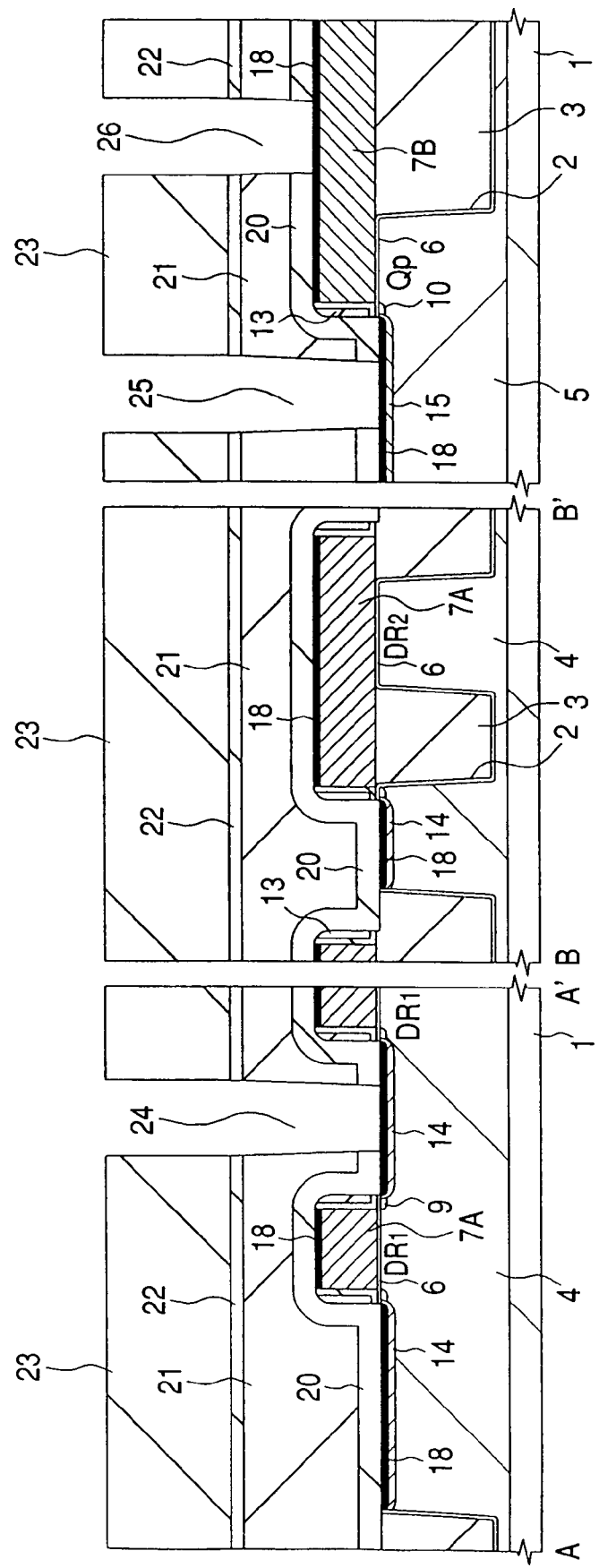
FIG. 23 is a cross-sectional view showing a method of manufacturing a semiconductor memory device according to one embodiment of this invention.

Next, as shown in FIGS. 22 and 23, a contact hole 24 is formed above one (source) of the source and drain of the $n^+$ type semiconductor region 14 of the drive MISFETs ($DR_1$, $DR_2$), and contact holes 25, 26 are formed above the gate electrode 7B of the p channel type MISFET (Qp) of the peripheral circuit region and the $p^+$ type semiconductor region (source, drain), by dry etching of the above-mentioned silicon oxide films 22, 21 and silicon nitride film 20, using the photoresist film 23 as a mask.

Figure 24:
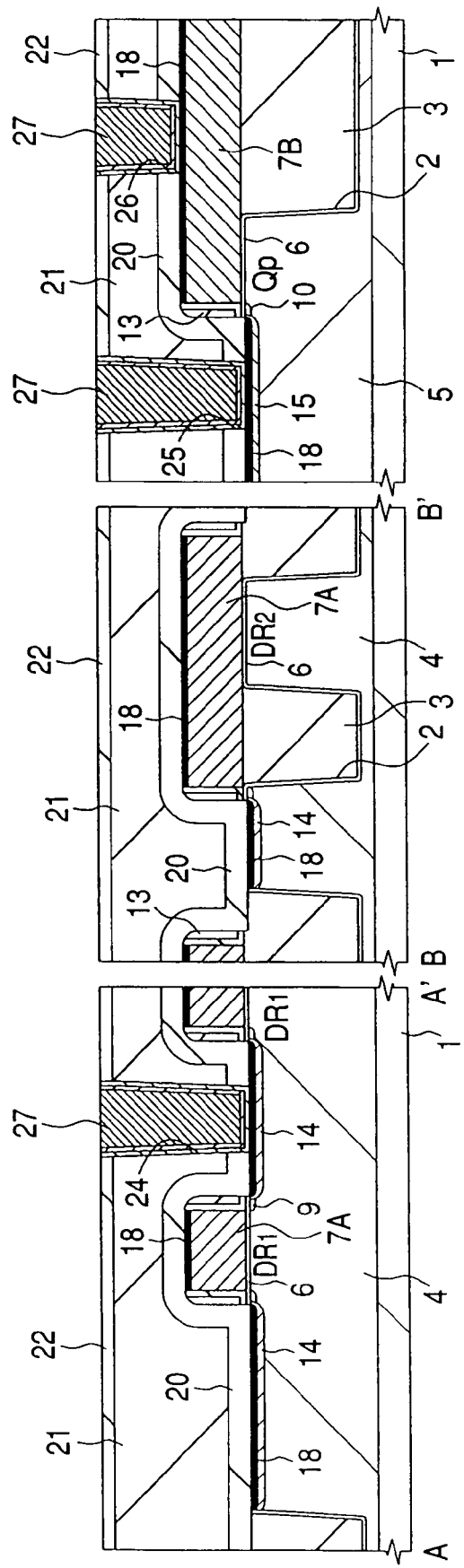
FIG. 24 is a cross-sectional view showing a method of manufacturing a semiconductor memory device according to one embodiment of this invention.

Next, as shown in FIG. 24, a plug 27 is formed so as to be embedded in the contact holes 24, 25, 26 by depositing a titanium (Ti) film and titanium nitride (TiN) film, for example, by sputtering on the silicon oxide film 22, including the inside of the contact holes 24, 25, 26, depositing a TiN film and a tungsten (W) film as a metal film by CVD, and removing any unnecessary W film, TiN film and Ti film above the silicon oxide film 22 by chemical mechanical polishing. The plug 27 may also be formed by a laminated film comprising a TiN film and W film, instead of the aforesaid TiN film, TiN film and W film.

Figure 25:
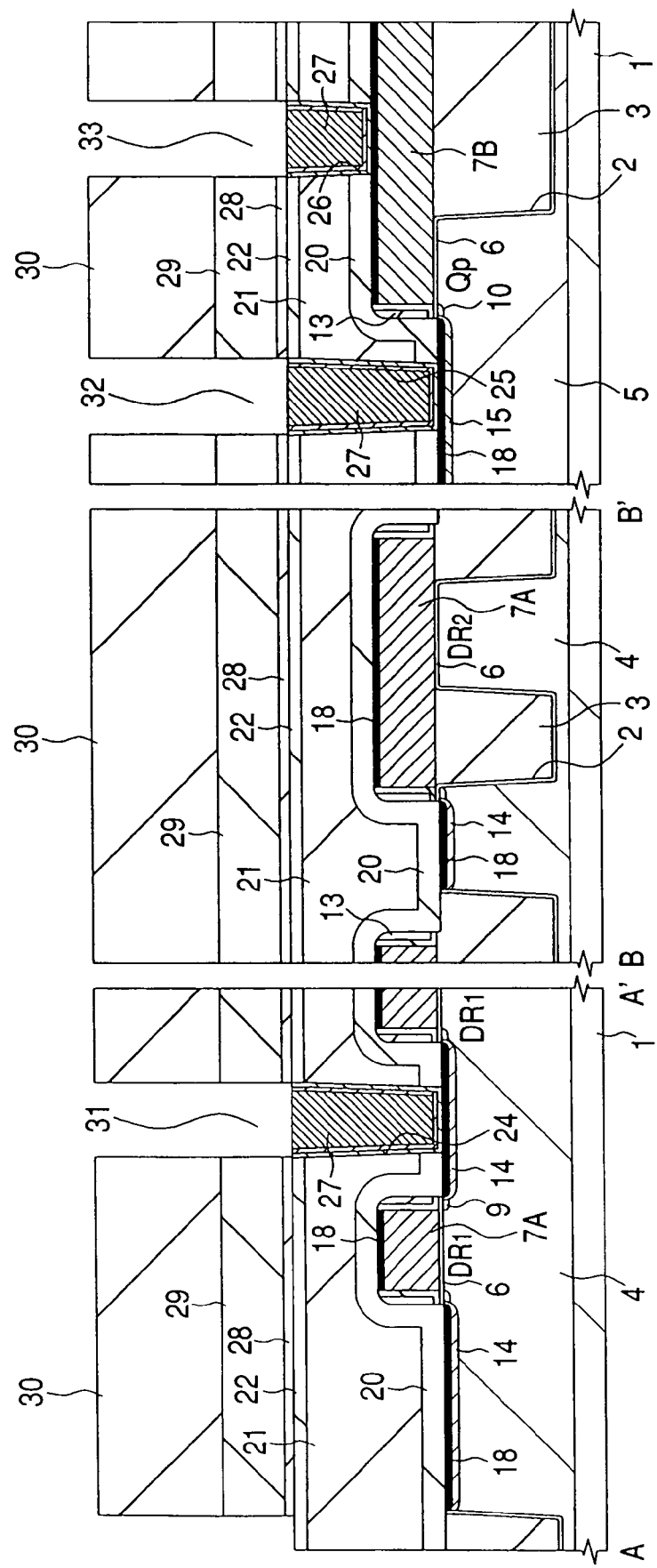
FIG. 25 is a cross-sectional view showing a method of manufacturing a semiconductor memory device according to one embodiment of this invention.

Next, as shown in FIG. 25, the silicon nitride film 20 having a film thickness of approx. 20 nm and the silicon oxide film 21 having a film thickness of approx. 400 nm are deposited, for example, by CVD as insulating films on the substrate 1, and interconnection grooves 31, 32, 33 extending in a predetermined direction above the contact holes 24, 25, 26 are formed by dry etching of the silicon oxide film 21 and the silicon nitride film 20, using the photoresist film 30 as a mask.

The silicon nitride film 20 under the silicon oxide film 21 is used as a stopper film during the etching of the silicon oxide film 21. That is, when the contact holes 24, 25, 26 are formed, the silicon oxide film 21 is etched first, etching is stopped on the surface of the silicon nitride film 20 underneath, and then the silicon nitride film 20 is etched. Due to this, even if the interconnection groove 31 and its contact hole 24 underneath are shifted due to a mismatch of the photomask, the silicon oxide films 22, 21 of the lower layer of the interconnection groove 31 are not etched excessively.

Figure 26:
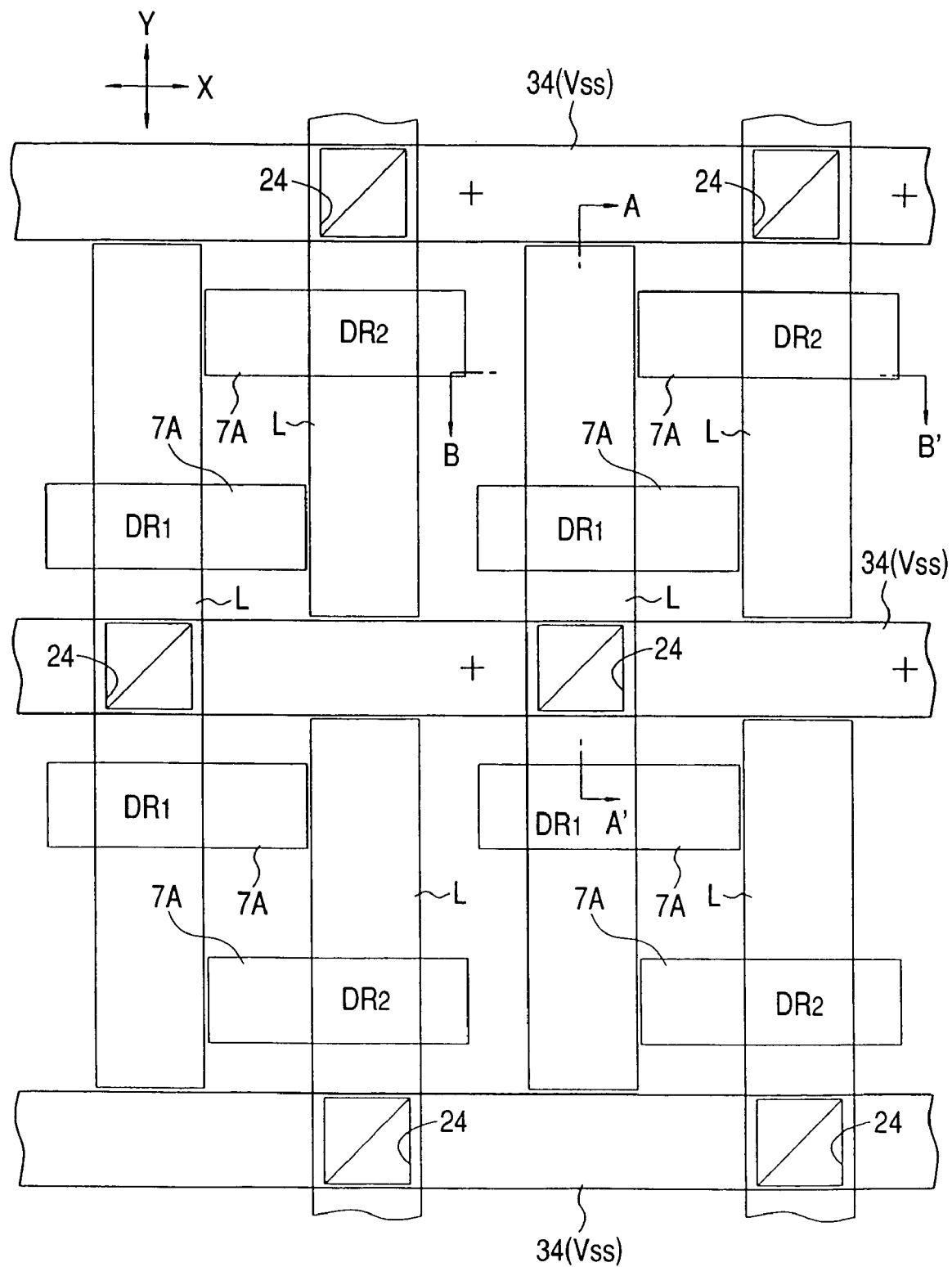
FIG. 26 is a plan view showing a method of manufacturing a semiconductor memory device according to one embodiment of this invention.
Figure 27:
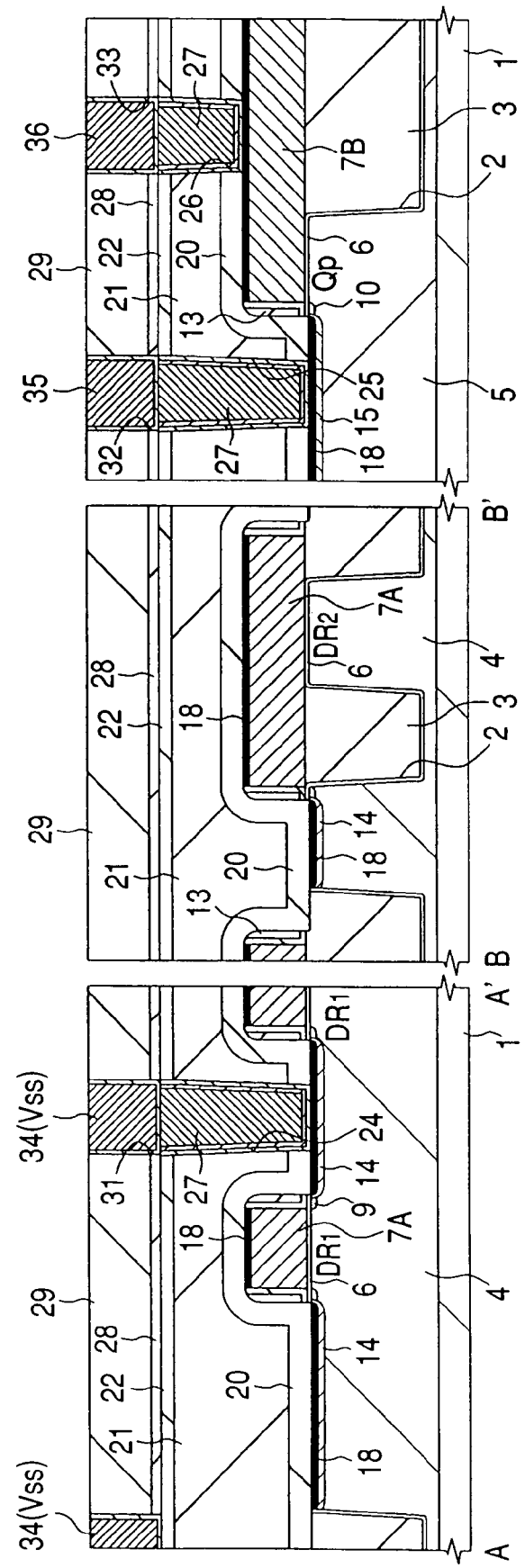
FIG. 27 is a cross-sectional view showing a method of manufacturing a semiconductor memory device according to one embodiment of this invention.

Next, as shown in FIGS. 26 and 27, reference voltage lines 34 (Vss) are formed inside the interconnection groove 31 that is formed in the memory array, and first layer interconnections 35, 36 are formed inside the interconnection grooves 32, 33 that is formed in the peripheral circuit region. The reference voltage lines 34 (Vss) and first-layer interconnections 35, 36 are embedded in the interconnection grooves 31, 32, 33, for example, by depositing a TiN film by sputtering on the silicon oxide film 29, including the inside of the interconnection grooves 31, 32, 33, depositing a W film as a metal film by CVD, and then removing any unnecessary W film and TiN film above the silicon oxide film 29 by chemical mechanical polishing.

Hence, the interconnections 35, 36 and the plug 27, which electrically connect the source region of the n channel MISFET, p channel MSFET, drain region, and gate electrodes, which constitute the peripheral circuit, comprise the same interconnection layer and plug layer as the reference voltage lines 34 (Vss) and plug 27, which constitute the first-layer interconnections in the memory cell-forming region. Due to this, in the connections between the source region, drain region and gate electrode of the n channel MISFET and p channel MSFET forming the peripheral circuit, the current path length can be shortened and the circuit operation of the semiconductor memory device can be improved.

As shown in FIG. 26, the reference voltage lines 34 (Vss) formed in the memory array are arranged in the boundary region of the memory cell adjoining in the Y direction, and they extend mutually parallel in the X direction. The reference voltage lines 34 (Vss) are electrically connected to the source ($n^+$ type semiconductor region 14) of the drive MISFETs ($DR_1$, $DR_2$) via the plug 27 in the contact hole 24. The source ($n^+$ type semiconductor region 14) to which the reference voltage lines 34 (Vss) are connected is a source common to two drive ($DR_1$, $DR_1$, or $DR_2$, $DR_2$) MISFETs adjoining in the Y direction. That is, the reference voltage lines 34 (Vss) are shared by the drive ($DR_1$, $DR_1$, or $DR_2$, $DR_2$) MISFET of two memory cells adjoining in the Y direction, and a circuit reference voltage (Vss, for example, 0V) is supplied to the source ($n^+$ type semiconductor region 14) common to these drive ($DR_1$, $DR_1$, or $DR_2$, $DR_2$) MISFETs.

Figure 28:
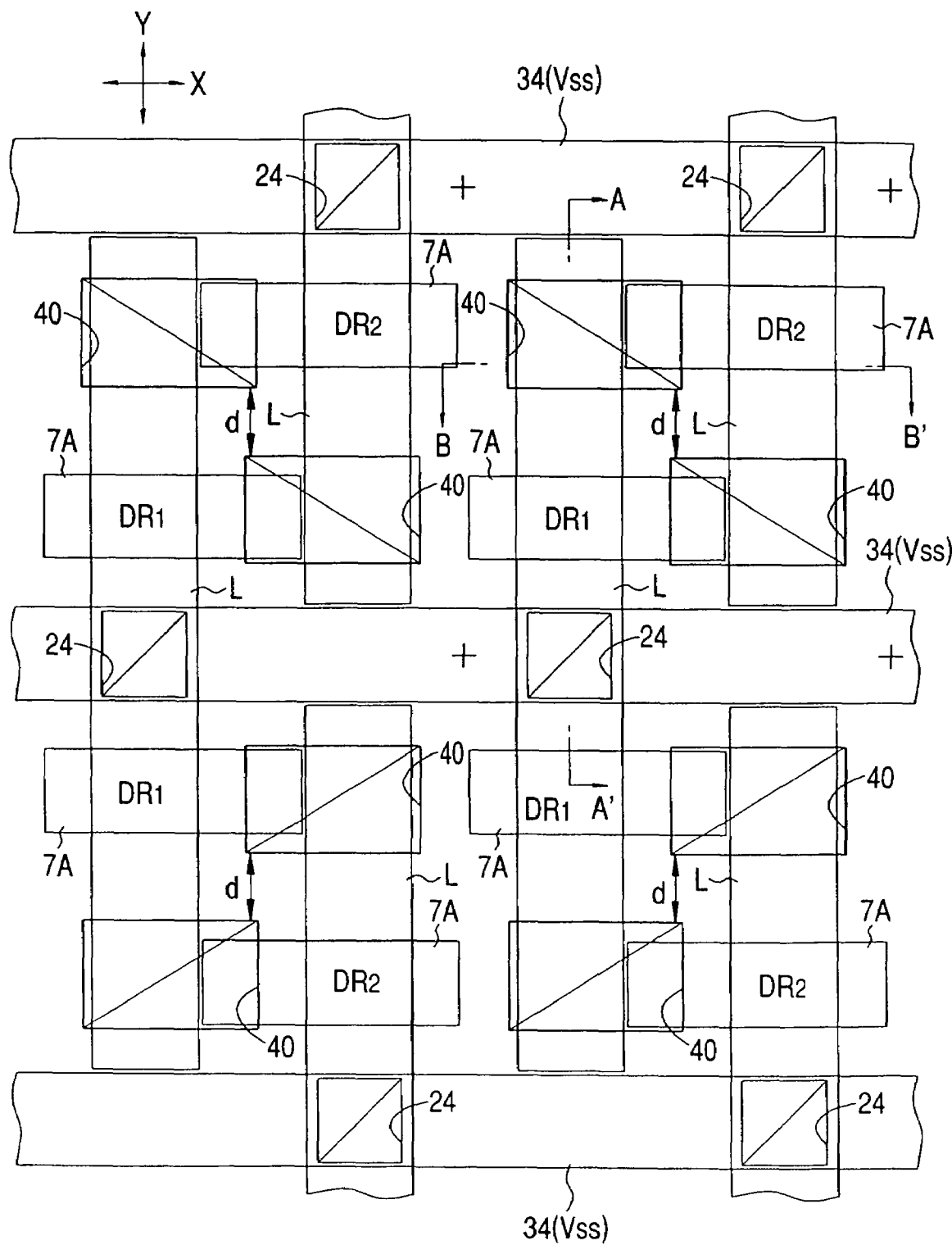
FIG. 28 is a plan view showing a method of manufacturing a semiconductor memory device according to one embodiment of this invention.
Figure 29:
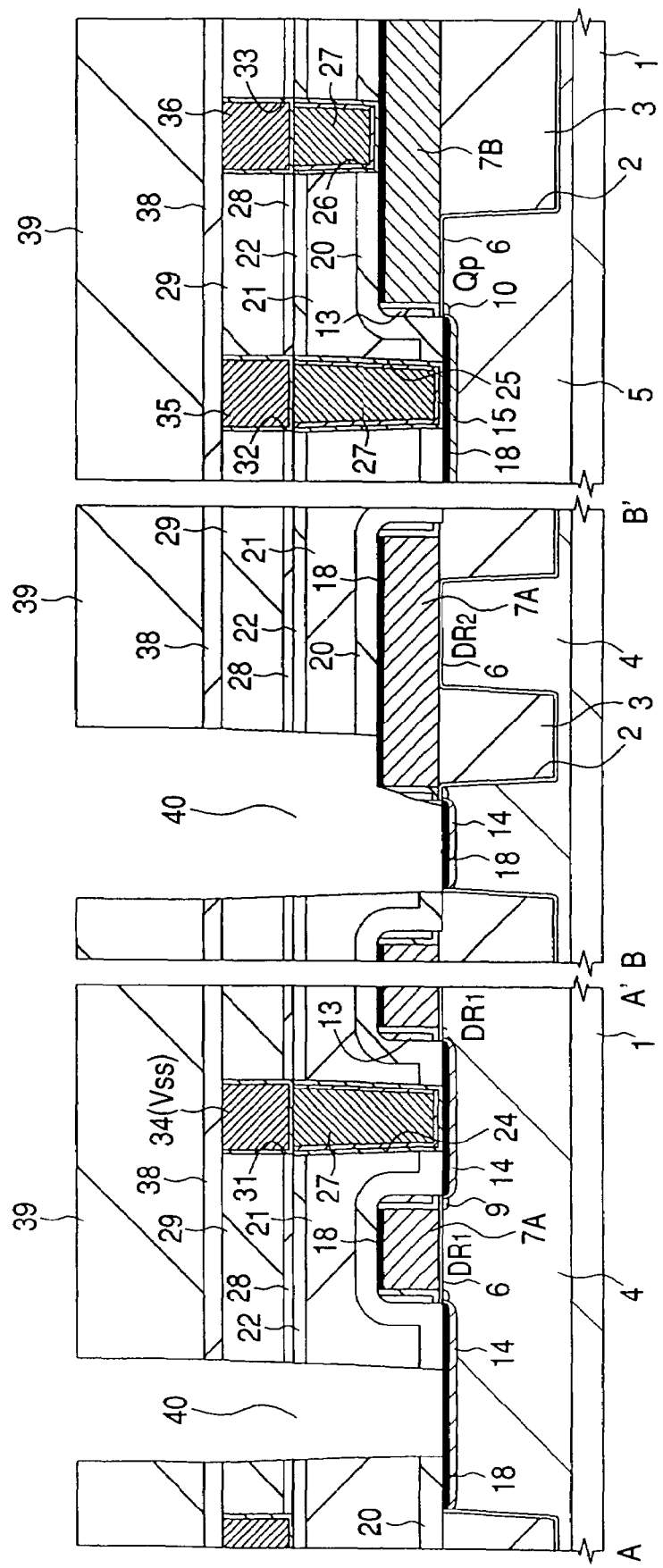
FIG. 29 is a cross-sectional view showing a method of manufacturing a semiconductor memory device according to one embodiment of this invention.

Next, as shown in FIGS. 28 and 29, a silicon nitride film 38 having a film thickness of approx. 100 nm is deposited as an insulating film, for example, by CVD, on the substrate 1, and contact holes 40 exposing the ends of the gate electrodes 7A of the drive MISFETs ($DR_1$, $DR_2$) and part of the drain ($n^+$ type semiconductor region 14) are formed by successively dry etching the silicon nitride film 38, silicon oxide film 29, silicon nitride film 28, silicon oxide films 22, 21 and the silicon nitride film 20, using the photoresist film 39 as a mask.

As shown in FIG. 28, two of the contact holes 40 are formed in each memory cell. That is, one contact hole 40 is formed in the region spanning the gate electrode 7A of the drive MISFET ($DR_1$) and the drain ($n^+$ type semiconductor region 14) of the drive MISFET ($DR_2$), and the other contact hole 40 is formed in the region spanning the gate electrode 7A of the drive MISFET ($DR_2$) and the drain ($n^+$ type semiconductor region 14) of the drive MISFET ($DR_1$).

Hence, as the contact hole 40 must expose the ends of the gate electrode 7A and part of the adjoining drain ($n^+$ type semiconductor region 14), they are formed over a larger surface area than the contact holes 24 which connect the source ($n^+$ type semiconductor region 14) and the reference voltage lines 34 (Vss). Therefore, as shown in FIG. 28, the distance (d) between the two contact holes 40, 40 formed in the same memory cell becomes very short. As a result, the two contact holes 40, 40 may be connected by interference of the light used for exposure of the photoresist film 39.

Figure 30:
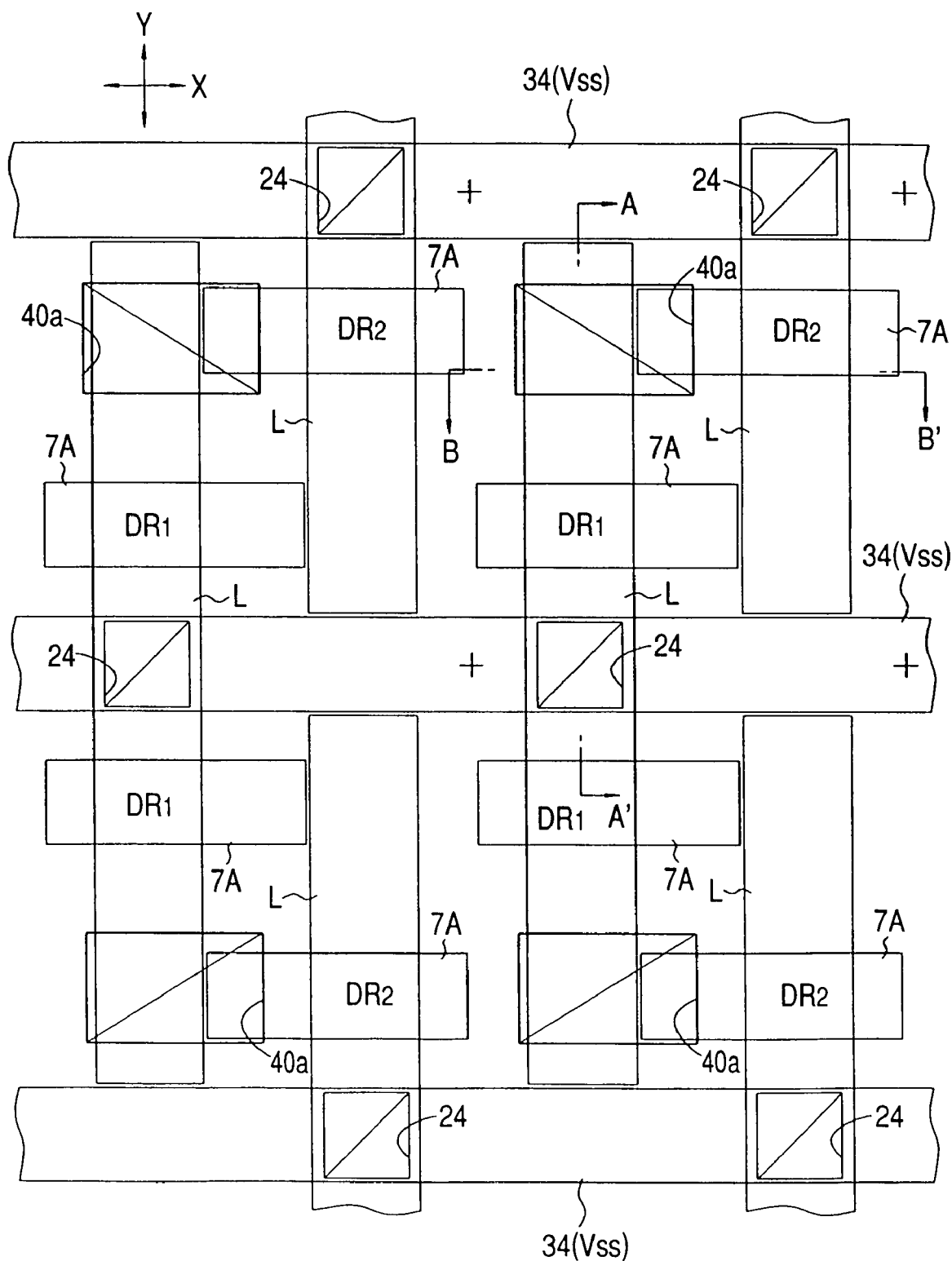
FIG. 30 is a plan view showing a method of manufacturing a semiconductor memory device according to one embodiment of this invention.
Figure 31:
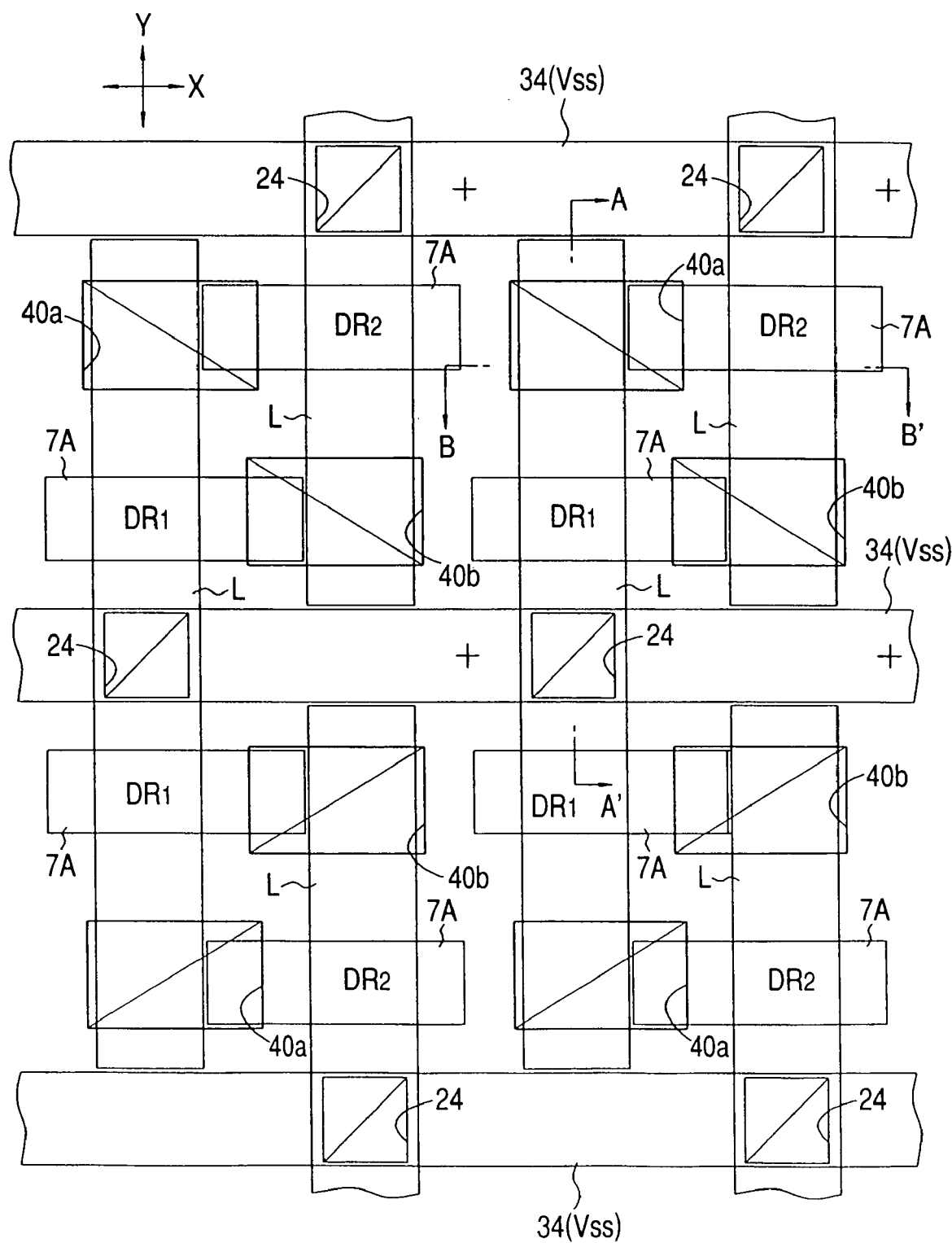
FIG. 31 is a plan view showing a method of manufacturing a semiconductor memory device according to one embodiment of this invention.

To counteract this, the two contact holes 40, 40 that are formed in the same memory cell may be formed by two etching steps using two different photomasks. That is, firstly, as shown in FIG. 30, for example, one contact hole 40a is formed by etching, using the first photoresist film as a mask, then, as shown in FIG. 31, another contact hole 40b is formed by etching, using the second photoresist film as a mask. In this way, the four corners of the contact holes 40a, 40b are rounded by the light interference; and, since the four corners of the contact hole 40b are also rounded by light interference, the distance (d) between the contact holes 40a and contact holes 40b is effectively lengthened, which prevents them from interconnecting.

Figure 32:
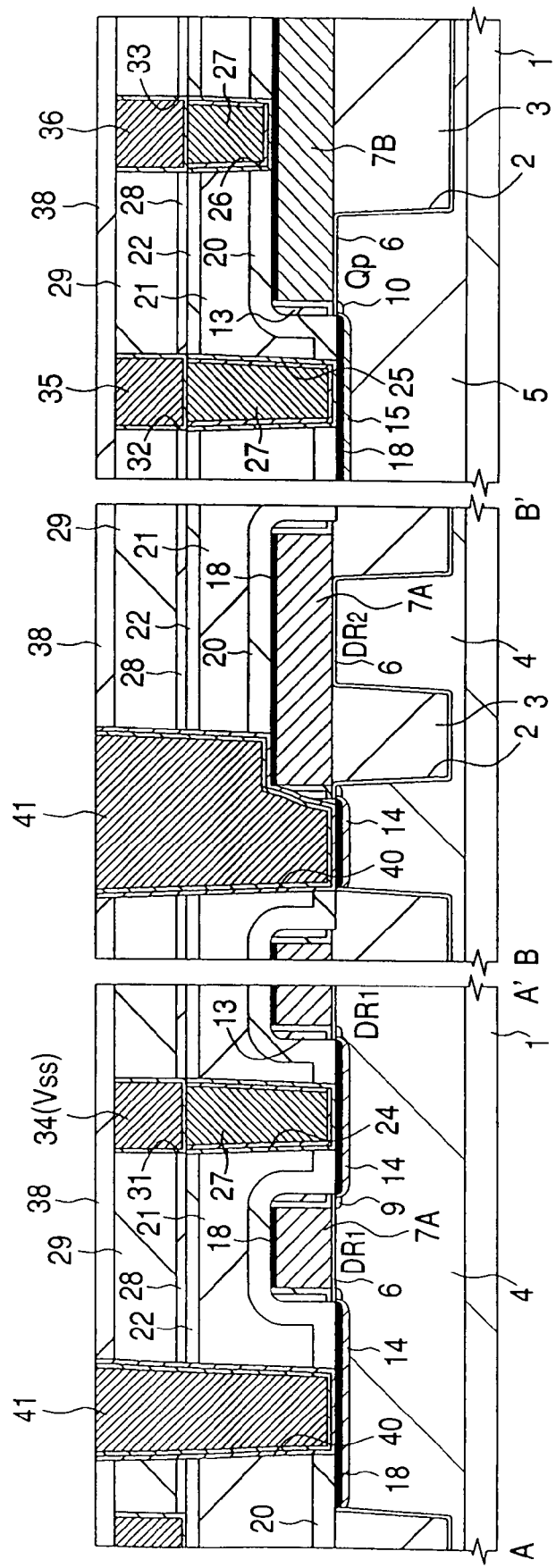
FIG. 32 is a cross-sectional view showing a method of manufacturing a semiconductor memory device according to one embodiment of this invention.

Next, as shown in FIG. 32, a plug 41 is formed inside the contact hole 40. The plug 41 is formed so as to be embedded in the contact hole 40 by depositing a titanium (Ti) film and a titanium nitride (TiN) film, for example, by sputtering on the silicon oxide film 38, including the inside of the contact hole 40, depositing a TiN film and a tungsten (W) film as a metal film by CVD, and removing any unnecessary W film, TiN film and Ti film above the silicon oxide film 38 by chemical mechanical polishing. The plug 41 may also comprise, for example, a laminated film comprising a TIN film and W film, or a n or p type polycrystalline silicon film doped with impurities. The plugs 41, 41 constitute a cross-coupled interconnection 41, which electrically connects the gate electrode 7A of one of the drive MISFETs ($DR_1$, $DR_2$), and the drain ($n^+$ type semiconductor region 14) of the other of drive MISFETs ($DR_1$, $DR_2$). Also, by forming the plugs 41, 40a, 40b by a separate process from that used to form the reference voltage lines 34 (Vss), 31 and plugs 27, 24, the gap between them can be reduced and the memory cell size can be reduced. In other words, the plugs 41, 40a, 40b are formed by a different plug layer from the plugs 27, 24, and from a different layer from the reference voltage lines 34 (Vss), 31, so that the memory cell size can be reduced.

Figure 33:
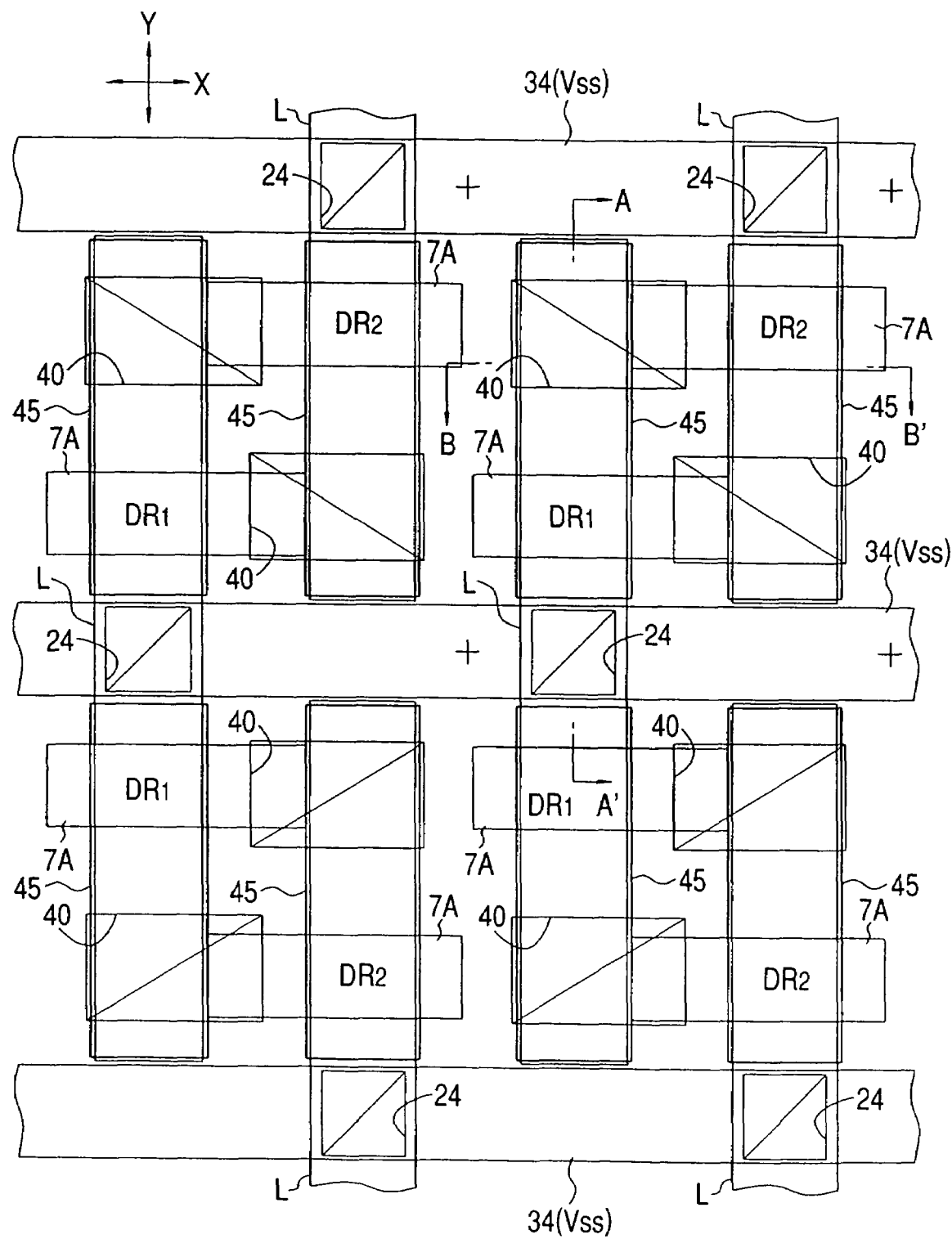
FIG. 33 is a plan view showing a method of manufacturing a semiconductor memory device according to one embodiment of this invention.
Figure 34:
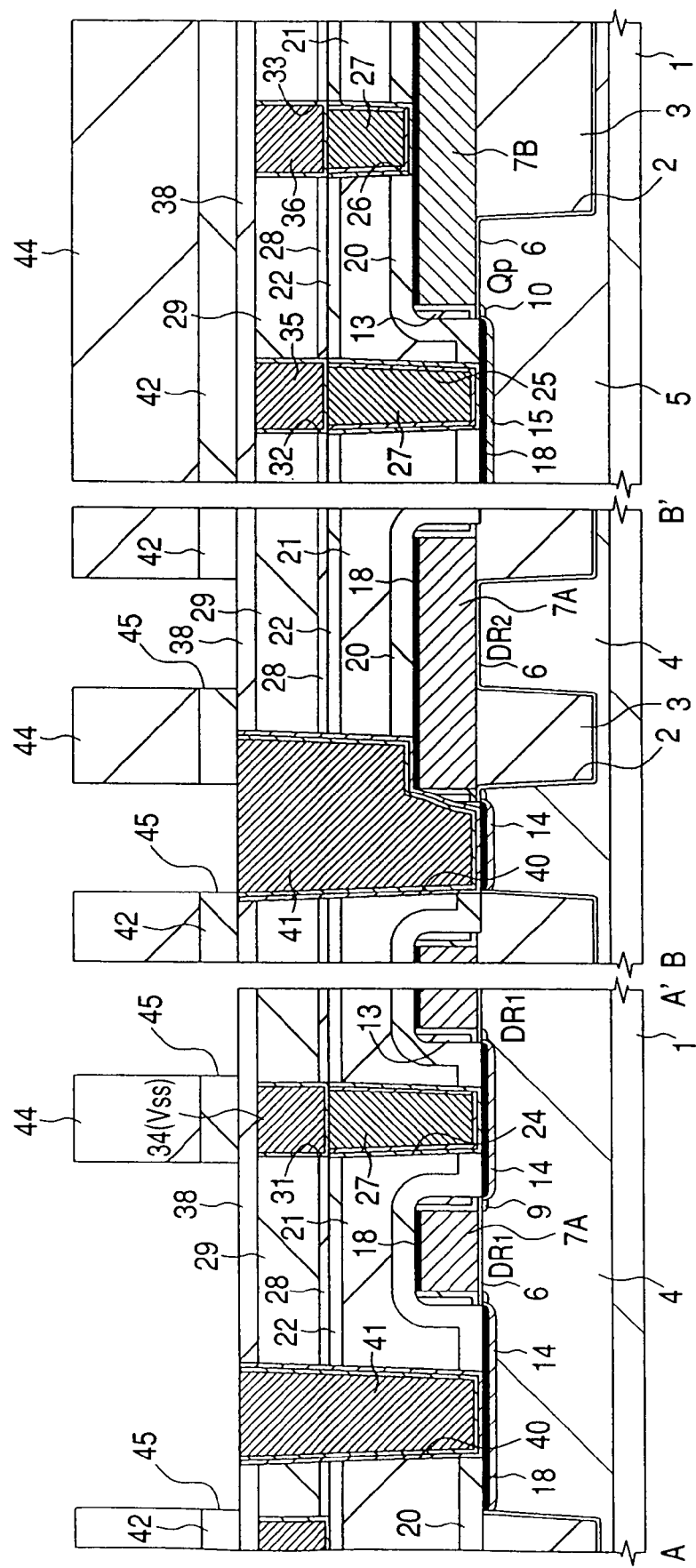
FIG. 34 is a cross-sectional view showing a method of manufacturing a semiconductor memory device according to one embodiment of this invention.

Next, as shown in FIGS. 33 and 34, a groove 45, which exposes the surface of the plug 41 at its base, is formed by depositing a silicon oxide film 42 having a film thickness of approx. 150 nm as an insulating film, for example, by CVD, on the substrate 1, and dry etching the silicon oxide film 42, using the photoresist film 44 as a mask.

As shown in FIG. 33, two of the grooves 45 are formed in each memory cell. One groove 45 has a flat rectangular pattern extending in the Y direction above one contact hole 40, and the other groove 45 has a flat rectangular pattern extending in the Y direction above the contact hole 40.

Figure 35:
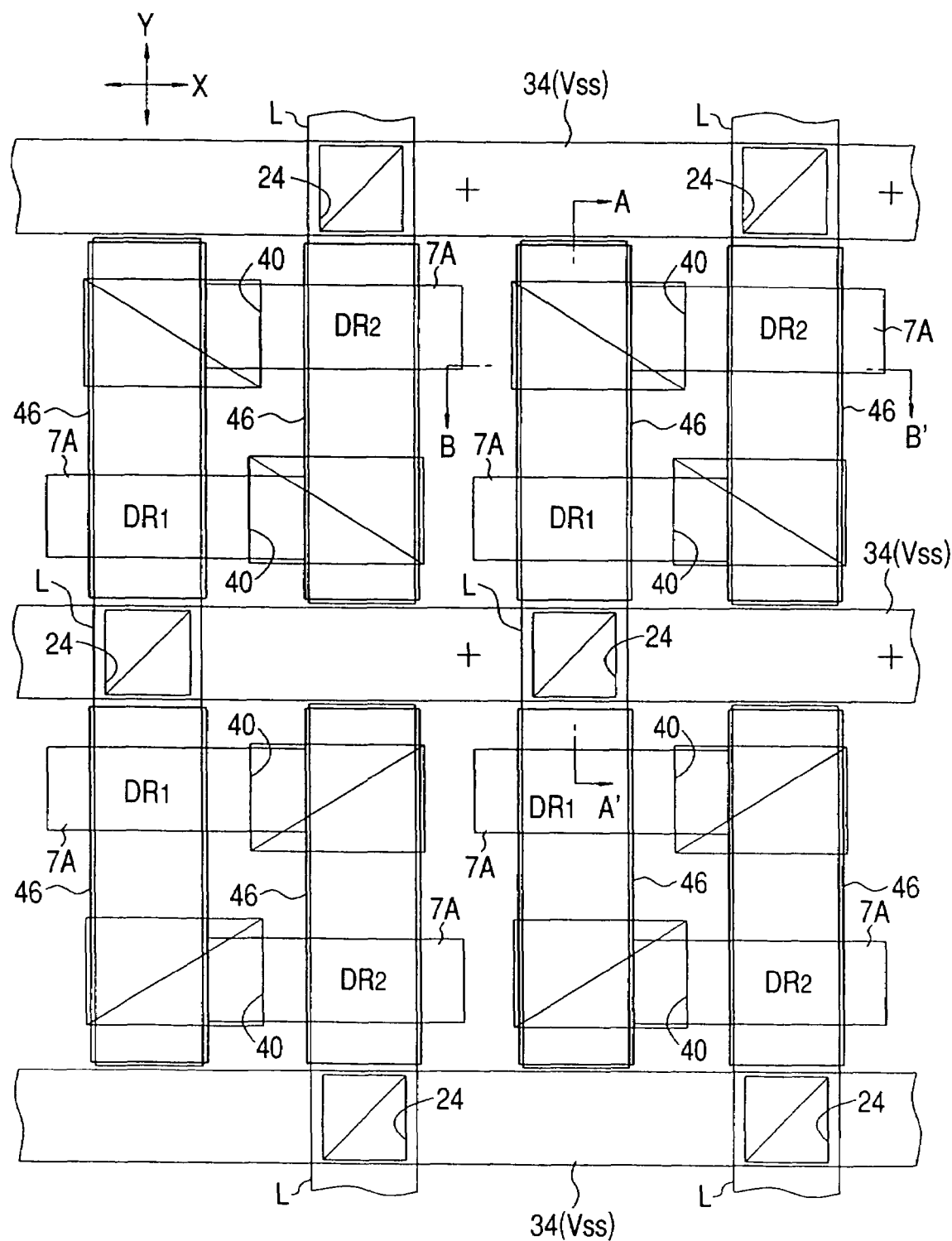
FIG. 35 is a plan view showing a method of manufacturing a semiconductor memory device according to one embodiment of this invention.
Figure 36:
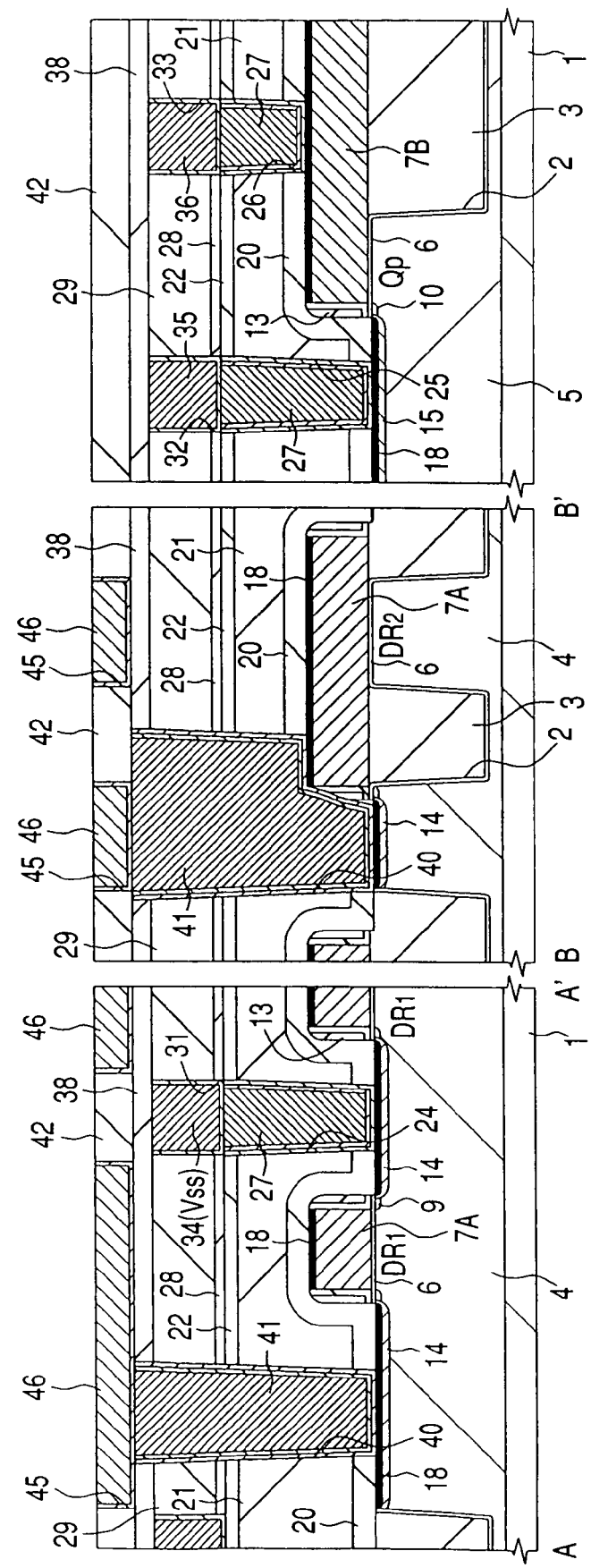
FIG. 36 is a cross-sectional view showing a method of manufacturing a semiconductor memory device according to one embodiment of this invention.

Next, as shown in FIGS. 35 and 36, a connecting conductive layer 46 is formed inside the groove 45. The connecting conductive layer 46 comprises an oxidation-resistant conductive film to be described later. The connecting conductive layer 46 is embedded in the groove 45 by depositing a W silicide ($WSi_2$) film, for example, by sputtering on the silicon oxide film 42, including the inside of the groove 45, and removing any unnecessary W silicide film above the silicon oxide film 42 by chemical mechanical polishing. The connecting conductive layer 46 may also comprise, for example, a conductive film wherein a W silicide film is laminated on a metal film, such as a W film. It may also comprise a conductive film wherein a W film is laminated on a WN film. In this case, the oxidation resistance of the surface of the connecting conductive layer 46 decreases compared to the case where a W silicide film is used, but the electrical resistance can be made small.

One of the above-mentioned connecting conductive layers 46, 46, of which two are formed in each memory cell, is electrically connected to the gate electrode 7A of the drive MISFET ($DR_1$) and the drain ($n^+$ type semiconductor region 14) of the drive MISFET ($DR_2$) via the plug 41, and the other is electrically connected to the gate electrode 7A of the drive MISFET ($DR_2$) and the drain ($n^+$ type semiconductor region 14) of the drive MISFET ($DR_1$) via the plug 41.

The connecting conductive layer 46 is formed to electrically connect the drain ($n^+$ type semiconductor region 14) of the drive MISFETs ($DR_1$, $DR_2$), and the source or drain of the vertical MISFETs ($SV_1$, $SV_2$) formed in a later step. That is, as seen in plan view, the connecting conductive layer 46 overlaps with the plug 41, and, in the Y direction, it is arranged to extend above the gate electrode 7A of the other drive MISFET.

The drain ($n^+$ type semiconductor region 14) of the drive MISFETs ($DR_1$, $DR_2$) and the source or drain of the vertical MISFETs ($SV_1$, $SV_2$) can also be connected without the connecting conductive layer 46. That is, the source or drain of the vertical MISFETs ($SV_1$, $SV_2$) may be directly formed on the plug 41, which is electrically connected to the drain ($n^+$ type semiconductor region 14) of the drive MISFETs ($DR_1$, $DR_2$). In this case, a step to prevent formation of an insulating oxide on the surface of the plug 41 in the thermal oxidation step of forming the gate insulating film of the vertical MISFETs ($SV_1$, $SV_2$), which will be described later, is necessary.

When the above-mentioned connecting conductive layer 46 is formed between the plug 41 and vertical MISFETs ($SV_1$, $SV_2$), the surface of the plug 41 does not oxidize in the thermal oxidation step of forming the gate insulating film of the vertical MISFETs ($SV_1$, $SV_2$). However, in this case, the connecting conductive layer 46 must be formed from a conductive material having good oxidation control properties, such as W silicide ($WSi_2$), so that the connecting conductive layer 46 does not abnormally oxidize in the aforesaid thermal oxidation step. Examples of conductive materials having good oxidation control properties are W silicide ($WSi_2$) and polycrystalline silicon.

Also, since W suicide ($WSi_2$) has a low adhesion to silicon oxide, if the connecting conductive layer 46 comprises a W silicide ($WSi_2$) film, it may peel away at the interface with the silicon oxide film 42 in the chemical mechanical polishing step. To counteract this, an adhesive film, such a TiN film, which has good adhesion to silicon oxide, may be provided, for example, under the W silicide ($WSi_2$) layer, or a silicon nitride film, which is an insulating film with good adhesion to W silicide ($WSi_2$), may be provided above the silicon oxide film 42.

Figure 37:
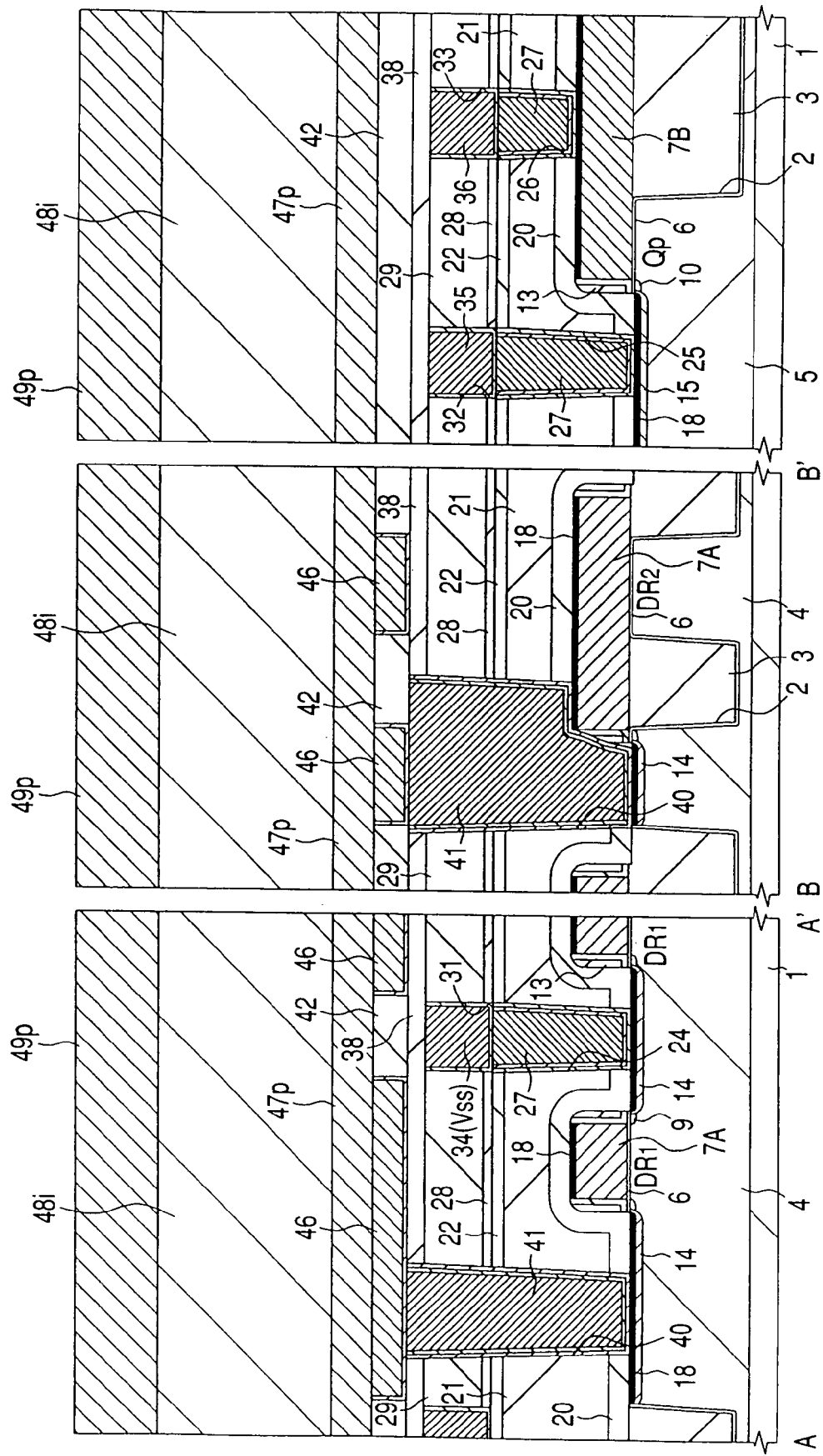
FIG. 37 is a cross-sectional view showing a method of manufacturing a semiconductor memory device according to one embodiment of this invention.

Next, as shown in FIG. 37, a p type silicon film 47p having a film thickness of approx. 100 nm, a silicon film 48i having a film thickness of approx. 400 nm and a p type silicon film 47p having a film thickness of approx. 200 nm, are formed on the silicon oxide film 42 and the connecting conductive layer 46. In order to form these three silicon films (47p, 48i, 49p), an amorphous silicon film that is doped with boron, a non-doped amorphous silicon film and an amorphous silicon film that is doped with boron are successively deposited by CVD, and these amorphous silicon films are then continuously crystallized by heat treatment. The amorphous silicon films may be crystallized using the thermal oxidation for forming the gate insulating film as will be mentioned later.

Alternatively, these three silicon films (47p, 48i, 49p) may also be formed by successively depositing an amorphous silicon film doped with boron and an amorphous non-doped silicon film by CVD, crystallizing these amorphous silicon films by heat treatment, performing ion implantation (channel doping) of n type or p type impurities in the non-doped amorphous silicon film, depositing an amorphous silicon film doped with boron by CVD, and crystallizing this amorphous silicon film by heat treatment.

Due to this, when the non-doped amorphous silicon film is crystallized, the crystals can be enlarged, and the properties of the vertical MISFETs ($SV_1$, $SV_2$) can be improved. Also, by adjusting the profile of the -channel impurities in the perpendicular direction relative to the principal surface (plane) of the substrate 1, the intermediate semiconductor layer 48, which is the substrate of the vertical MISFET, can be perfectly depleted, and the OFF leakage current ($I_{OFF}$ (P)) can be reduced compared with the ON current ($I_{ON}$ (P)). When the channel is doped, a silicon oxide film may be formed on the non-doped amorphous silicon film as a through insulating film, and impurities introduced into the intermediate semiconductor layer 48 by ion implantation (channel doping) through the through insulating film. In this case, the through insulating film is removed after channel doping, and the amorphous silicon film 49p with doped boron is then deposited by CVD.

Figure 38:
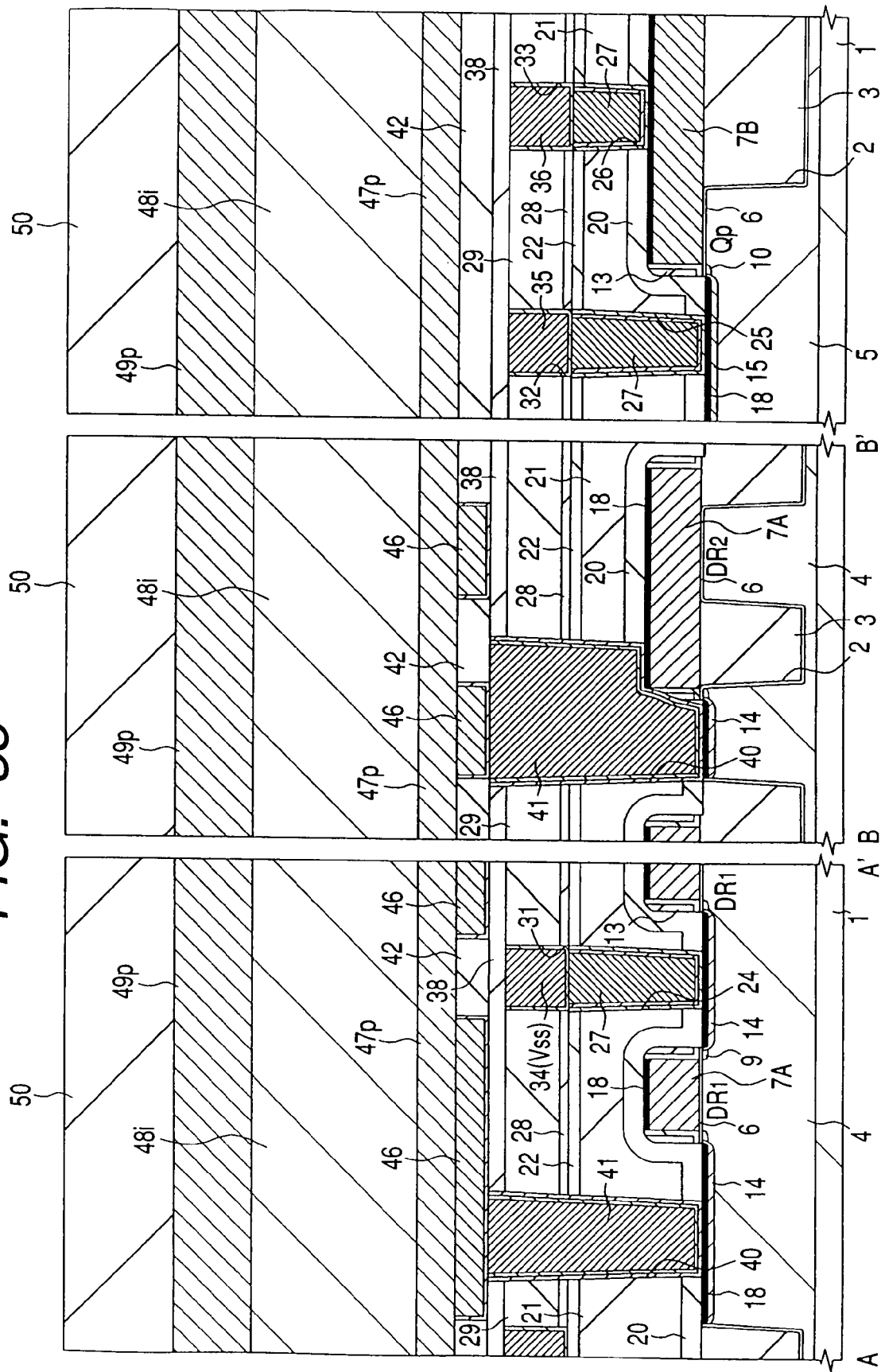
FIG. 38 is a cross-sectional view showing a method of manufacturing a semiconductor memory device according to one embodiment of this invention.

Next, as shown in FIG. 38, a silicon nitride film 50 having a film thickness of approx. 400 nm is deposited as an insulating film by CVD on the p type silicon film 47p. This silicon nitride film 50 is used as a mask when the three silicon films (47p, 48i, 49p) are etched. As since silicon nitride has a large etching selectivity relative to silicon compared with the photoresist, the silicon films (47p, 48i, 49p) can be patterned with higher precision, compared to etching using the photoresist film as a mask.

Figure 39:
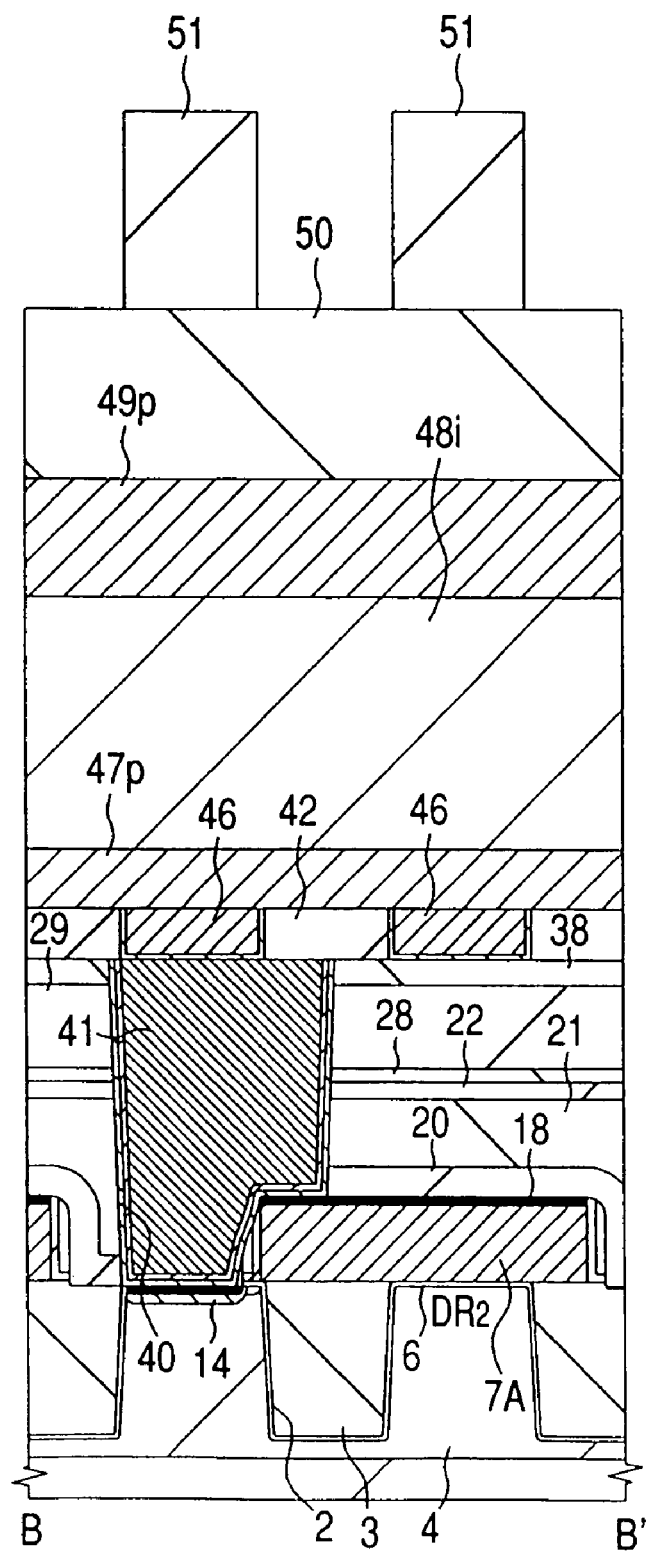
FIG. 39 is a cross-sectional view showing a method of manufacturing a semiconductor memory device according to one embodiment of this invention.
Figure 40:
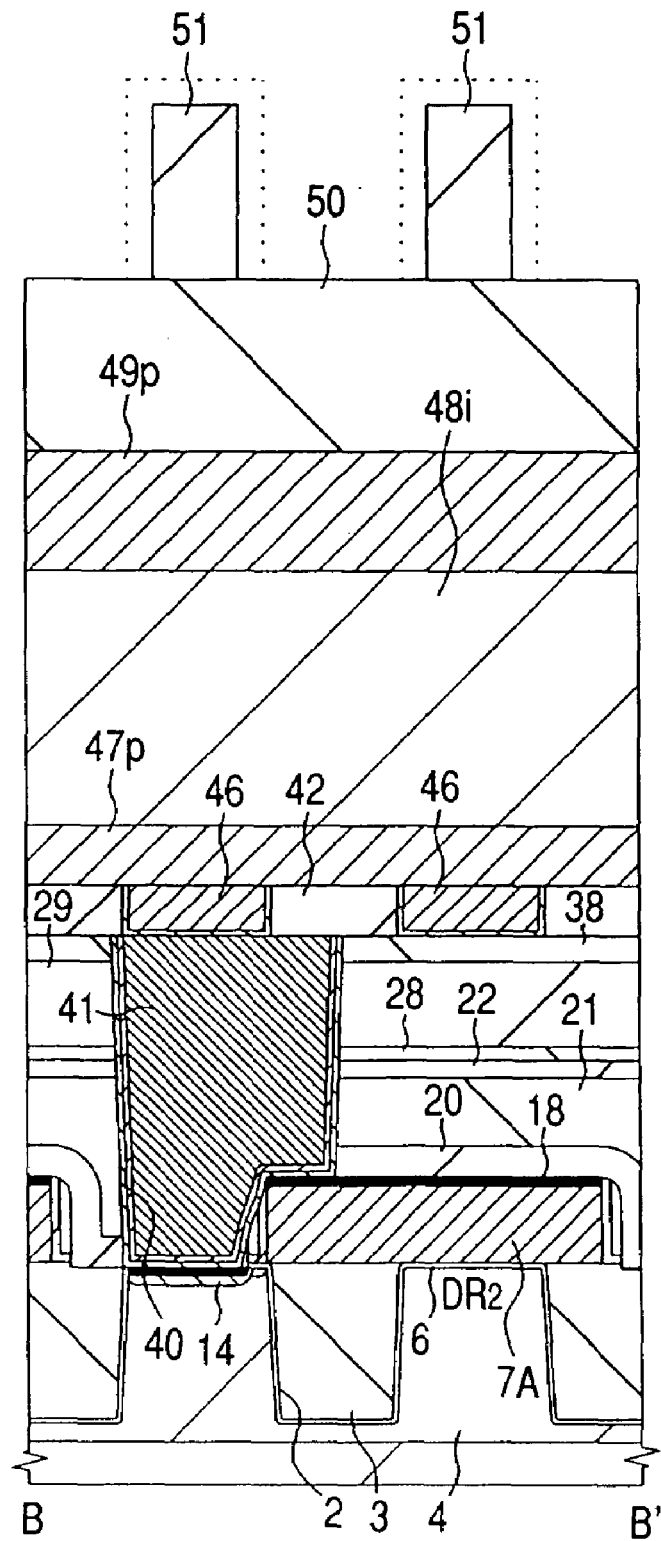
FIG. 40 is a cross-sectional view showing a method of manufacturing a semiconductor memory device according to one embodiment of this invention.

Next, as shown in FIG. 39, a photoresist film 51 is formed above the silicon nitride film 50, and, as shown in FIG. 40, this photoresist film 51 is then slimmed. Specifically, the photoresist film 51 is partially ashed using oxygen radicals produced by the thermal decomposition of ozone, thereby making the pattern width of the photoresist film 51 finer than the wavelength of the exposure light. Herein, the pattern width of the photoresist film 51 is made as fine as about 0.1 μm by this slimming.

Figure 41:
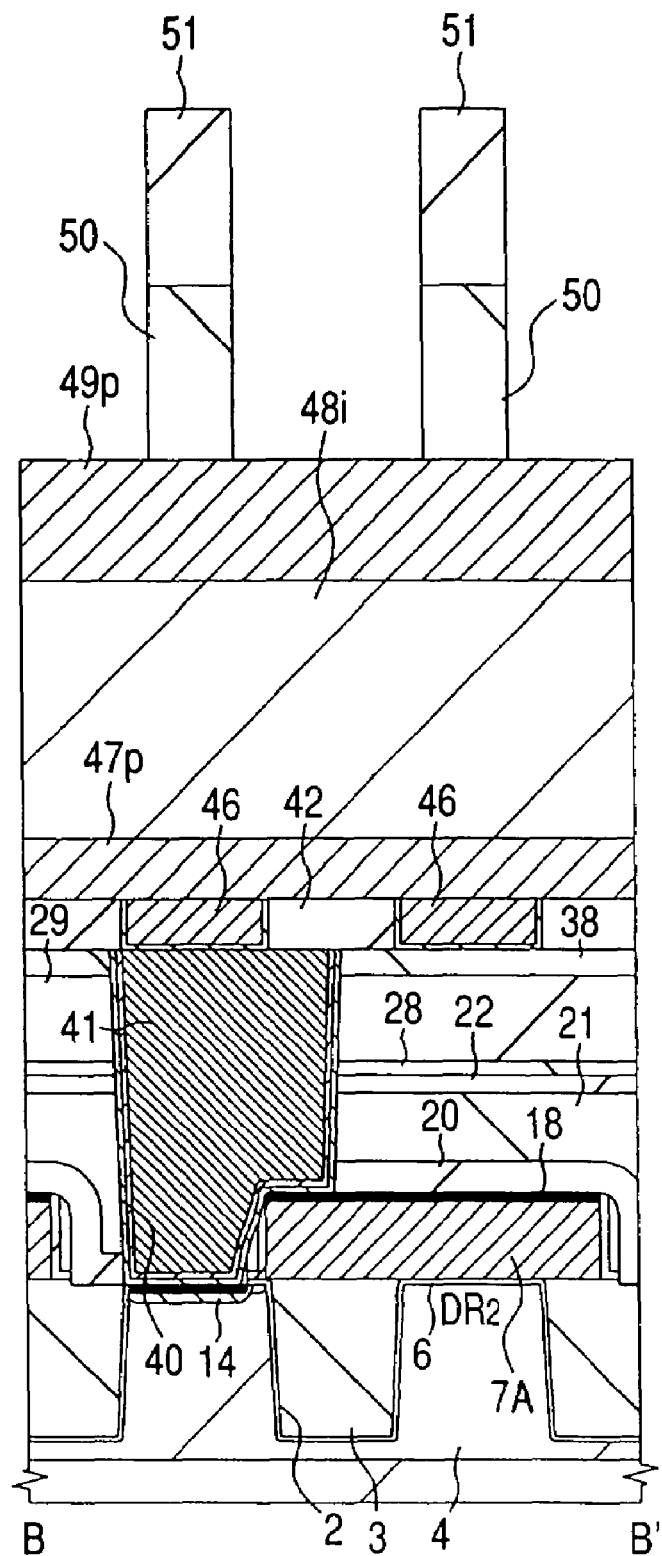
FIG. 41 is a cross-sectional view showing a method of manufacturing a semiconductor memory device according to one embodiment of this invention.

Next, as shown in FIG. 41, the silicon nitride film 50 is dry etched using this fine photoresist film 51 as a mask. In this way, a fine etching mask comprising the silicon nitride film 50, wherein the pattern width in the X direction has been reduced to about 0.1 μm, is obtained.

Figure 42:
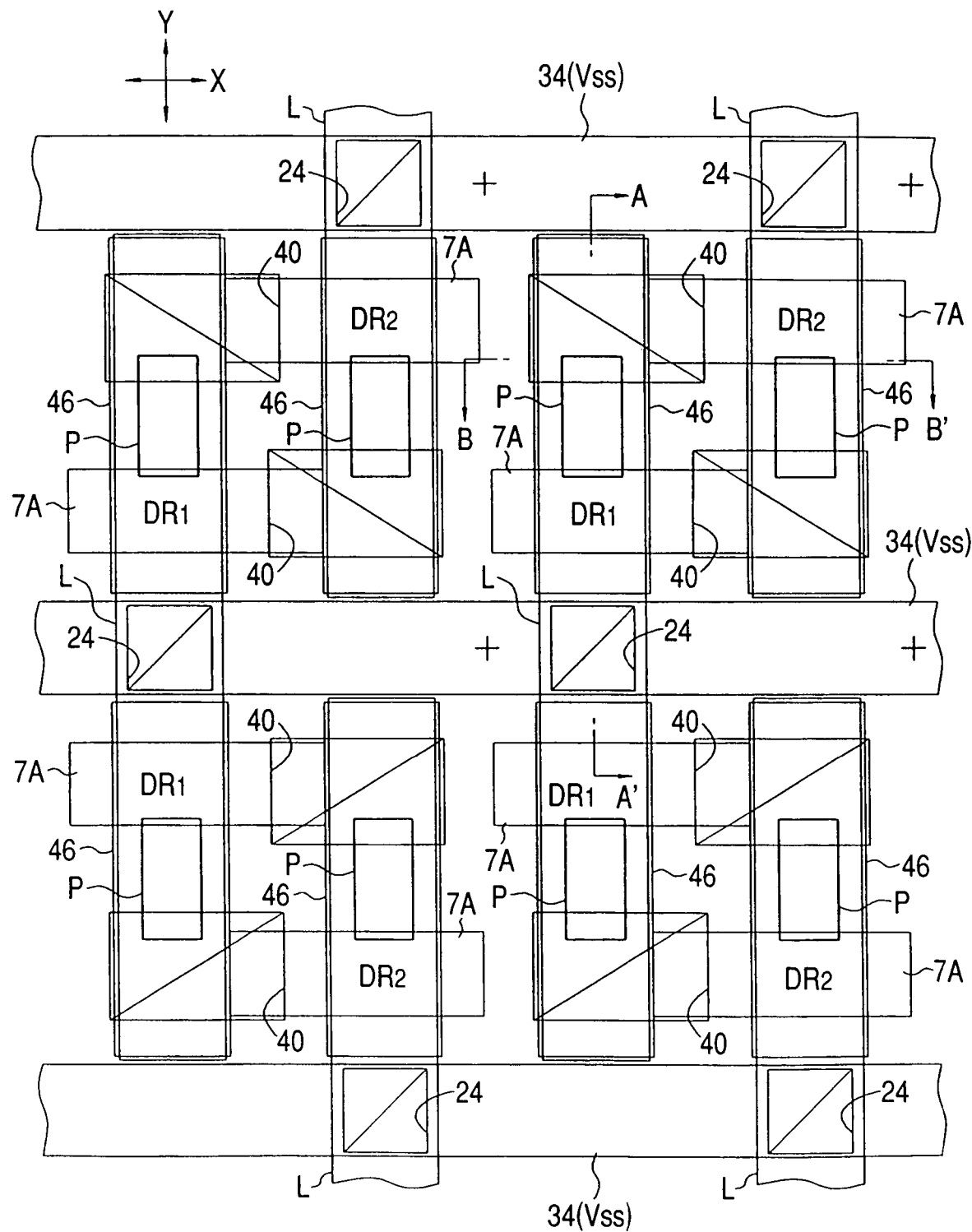
FIG. 42 is a plan view showing a method of manufacturing a semiconductor memory device according to one embodiment of this invention.
Figure 43:
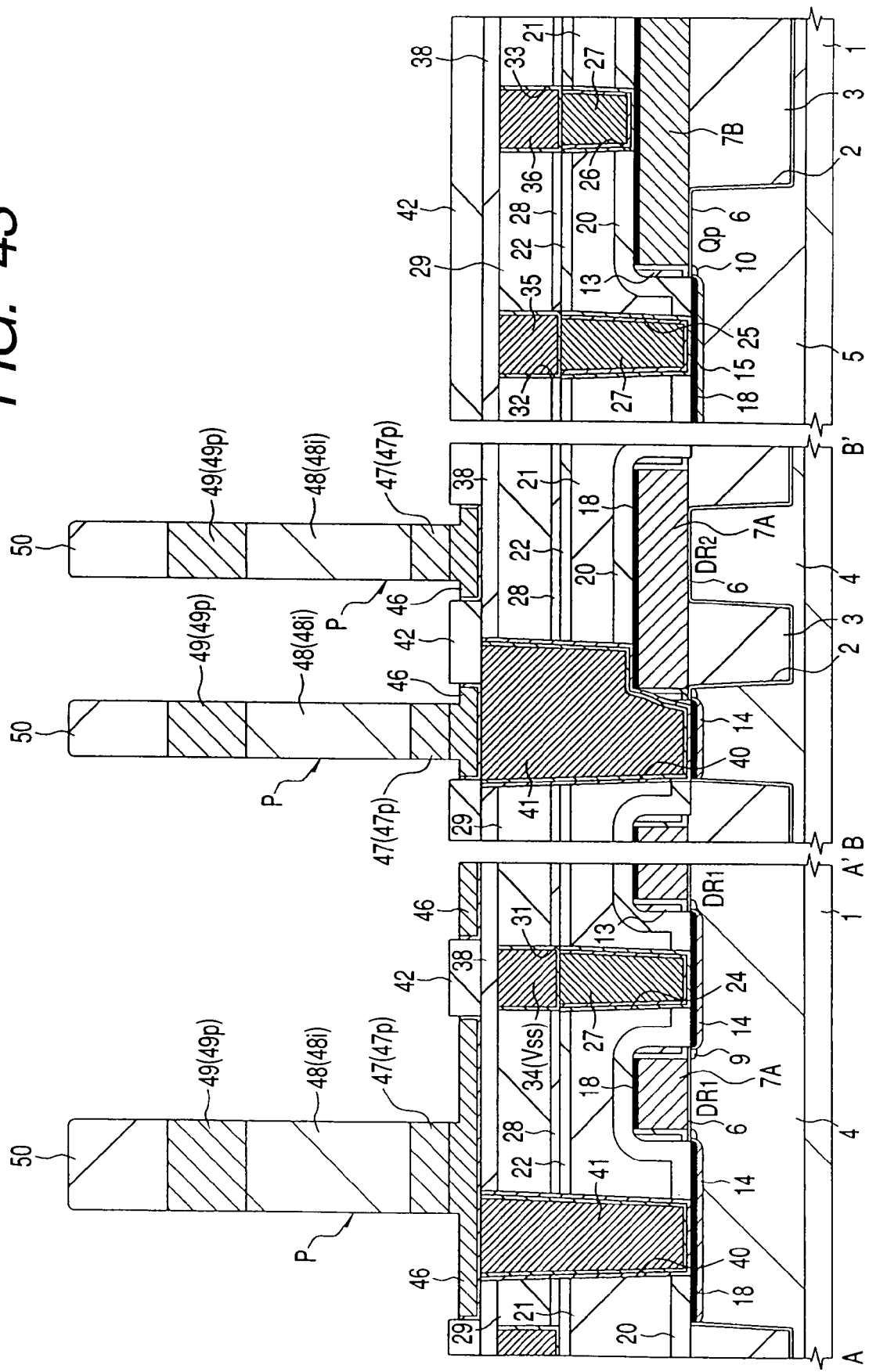
FIG. 43 is a cross-sectional view showing a method of manufacturing a semiconductor memory device according to one embodiment of this invention.

Next, as shown in FIGS. 42 and 43, dry etching of the silicon films (47p, 48i, 49p) is performed, using the silicon nitride film 50 as a mask. Due to this, a laminate (P) having a square pole shape comprising the lower semiconductor layer 47 comprising a p type silicon film 47p, the intermediate semiconductor layer 48 comprising the silicon film 48i and the upper semiconductor layer 47 comprising a p type silicon film 49p is formed on the connecting conductive layer 46. The laminate (P), as seen in plan view, is formed so that the drain (n+ type semiconductor region 14) of the drive MISFETs (DR$_1$, DR$_2$), the lower semiconductor layer 47, the intermediate semiconductor layer 48 and the upper semiconductor layer 49, overlap.

The lower semiconductor layer 47 of the laminate (P) forms the source and the upper semiconductor layer 49 forms the drain of the vertical MISFETs (SV$_1$, SV$_2$). The intermediate semiconductor layer 48, which is situated between the lower semiconductor layer 47 and the upper semiconductor layer 49, effectively forms the substrate of the vertical MISFETs (SV$_1$, SV$_2$), and the side walls constitute the channel region.

As the laminate (P) is formed using the silicon nitride film 50 for which the pattern width in the X direction is as fine as 0.1 μm as an etching mask, the intermediate semiconductor layer 48 which forms the substrate of the vertical MISFETs (SV$_1$, SV$_2$), also has dimensions in the X direction of only about 0.1 μm. Due to this, the vertical MISFETs (SV$_1$, SV$_2$), which use the intermediate semiconductor layer 48 as a substrate, is a perfect depletion type.

That is, since the gate electrode 54 is formed so that the side walls of the intermediate semiconductor layer 48 having a square pole shape, which is the substrate (channel) of the vertical MISFETs (SV$_1$, SV$_2$) are surrounded, the fine intermediate semiconductor layer 48 is perfectly depleted, and therefore perfect depletion type vertical MISFETs (SV$_1$, SV$_2$) are formed. Due to this, the OFF leakage current ($I_{OFF}$ (P)) can be reduced compared with the ON current ($I_{ON}$ (P)) Of the vertical MISFETs (SV$_1$, SV$_2$), and the channel width can be enlarged. As since a perfect depletion type MISFET has little fluctuation of properties due to impurities in the substrate, a variation of the properties of the vertical MISFETs (SV$_1$, SV$_2$) resulting from the diffusion of impurities in the p type polycrystalline silicon film forming the lower semiconductor layer 47 and upper semiconductor layer 49 in the intermediate semiconductor layer 48 can be suppressed.

To prevent impurities in the p type polycrystalline silicon film forming the lower semiconductor layer 47 and upper semiconductor layer 49 from diffusing in the middle semiconductor layer 48, one layer or plural layers of a tunnel insulating film comprising a silicon nitride film or the like may be provided near the interface of the upper semiconductor layer 49 and intermediate semiconductor layer 48, near the interface of the lower semiconductor layer 47 and intermediate semiconductor layer 48, and in part of the intermediate semiconductor layer 48. That is, by providing a thin tunnel insulating film in which the loss of drain current (IdS) of the vertical MISFETs (SV$_1$, SV$_2$) is too small to be visible, the spreading of impurities can be prevented and the performance of the vertical MISFETs (SV$_1$, SV$_2$) can be improved.

Figure 44:
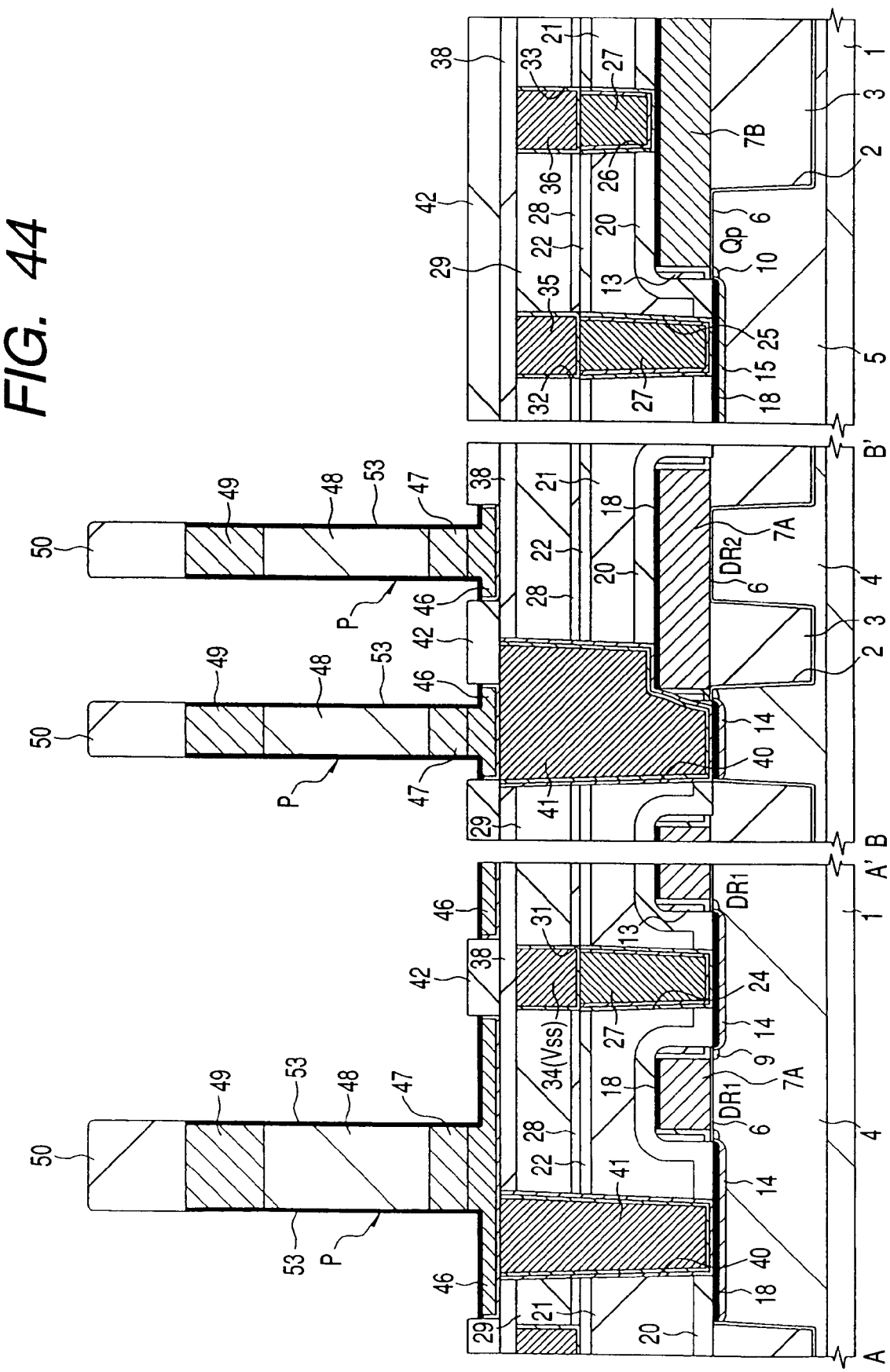
FIG. 44 is a cross-sectional view showing a method of manufacturing a semiconductor memory device according to one embodiment of this invention.

Next, as shown in FIG. 44, the gate insulating film 53 having a film thickness of approx. 10 nm, comprising silicon oxide, is formed on the side wall surface of the laminate (P) (lower semiconductor layer 47, intermediate semiconductor layer 48 and upper semiconductor layer 49) by thermally oxidizing the substrate 1. Due to this oxidation, an oxidation layer mainly comprising an oxide of W silicide is formed in the surface of the connecting conductive layer 46 that is exposed on the perimeter of the base of the laminate (P). The gate insulating film 53 is formed by low-temperature thermal oxidation (for example, wet oxidation) at 800° C. or less, but the invention is not limited thereto and may comprise a silicon oxide film deposited for example by CVD. It may also comprise a high dielectric film deposited by CVD, such as hafnium oxide (HfO$_2$) or tantalum oxide (Ta$_2$O$_5$). Hence, by forming the gate insulating film 53 by a low-temperature process, a scattering of the properties, such as the threshold value (Vth) of the vertical MISFETs (SV$_1$, SV$_2$), due to heat treatment can be reduced.

Figure 45:
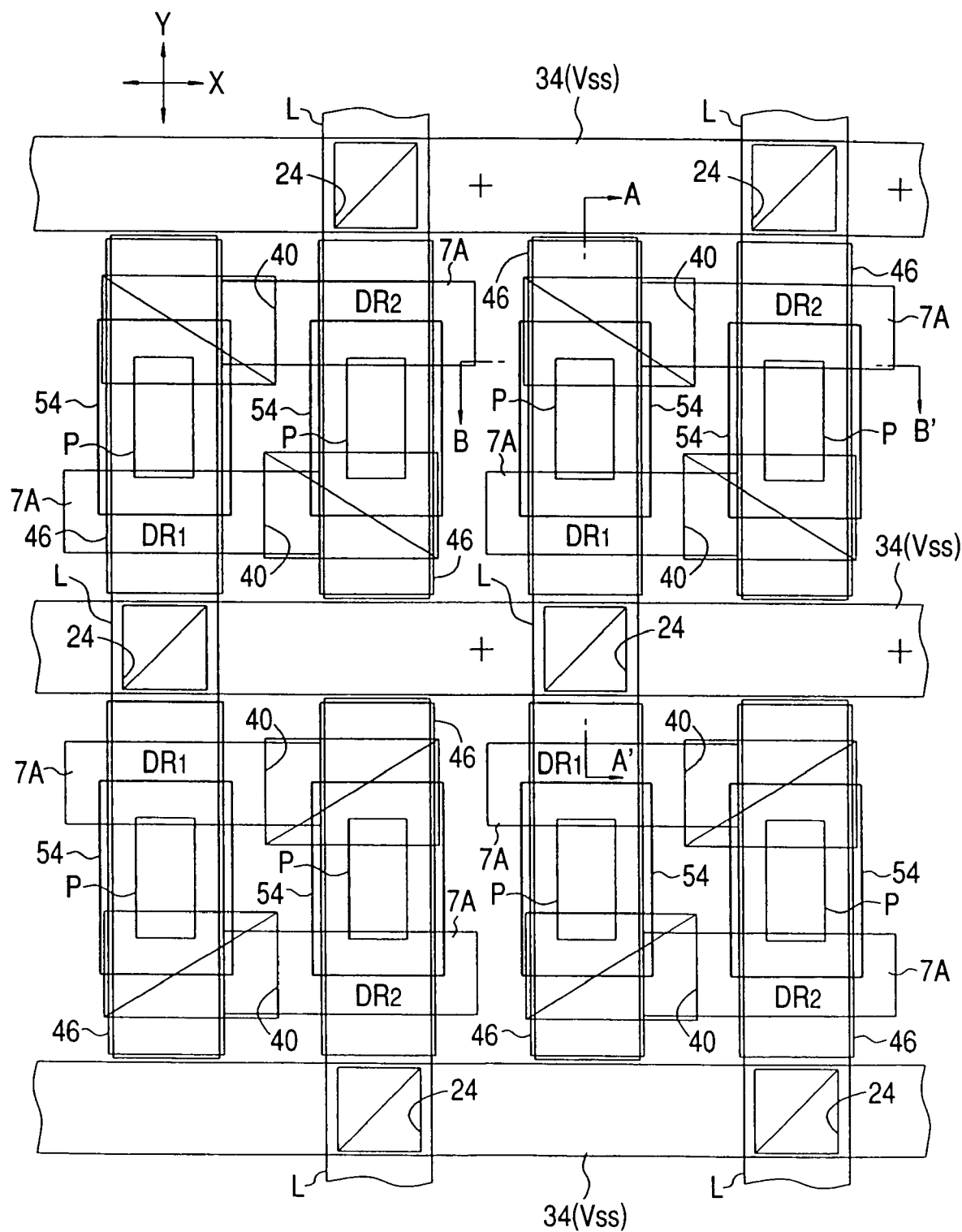
FIG. 45 is a plan view showing a method of manufacturing a semiconductor memory device according to one embodiment of this invention.
Figure 46:
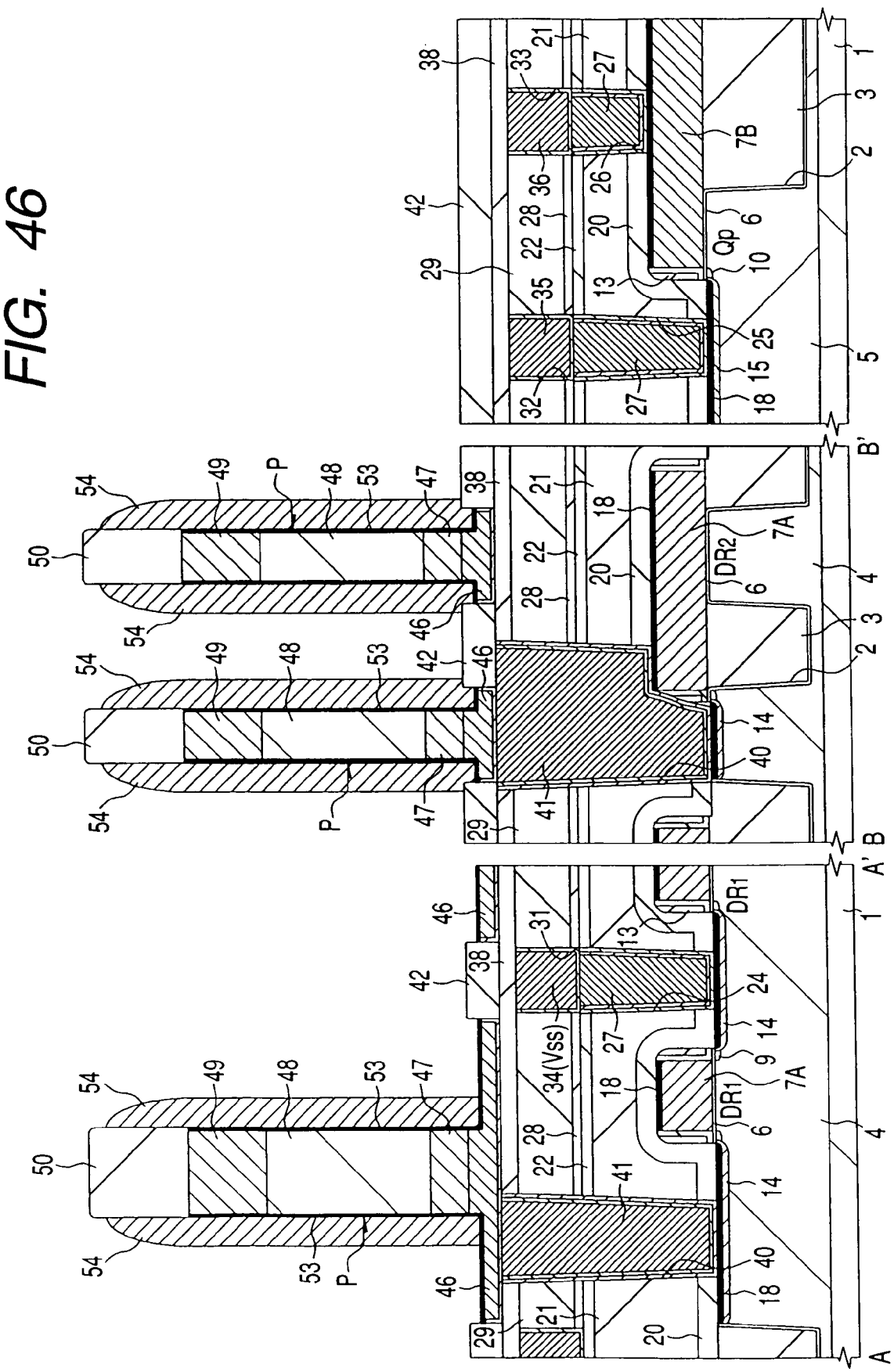
FIG. 46 is a cross-sectional view showing a method of manufacturing a semiconductor memory device according to one embodiment of this invention.

Next, as shown in FIGS. 45 and 46, gate electrodes 54s of the vertical MISFETs (SV$_1$, SV$_2$) are formed on the side walls of the laminate (P). To form the gate electrodes 54, a n type polycrystalline silicon film doped with phosphorus is deposited by CVD on the substrate 1 and remains on the side walls of the laminate (P) by performing anisotropic etching of this n type polycrystalline silicon film.

That is, the gate electrode 54 is formed in the shape of a side wall spacer, which self-aligns with the laminate (P) via the gate insulating film 53, and it is formed so that the side wall perimeter of the laminate (P) (intermediate semiconductor layer 48) is surrounded. Due to this, the manufacturing steps can be reduced and the memory cell size can be slimmed. The gate electrode 54 comprises a p type polycrystalline silicon film doped by boron.

Figure 47:
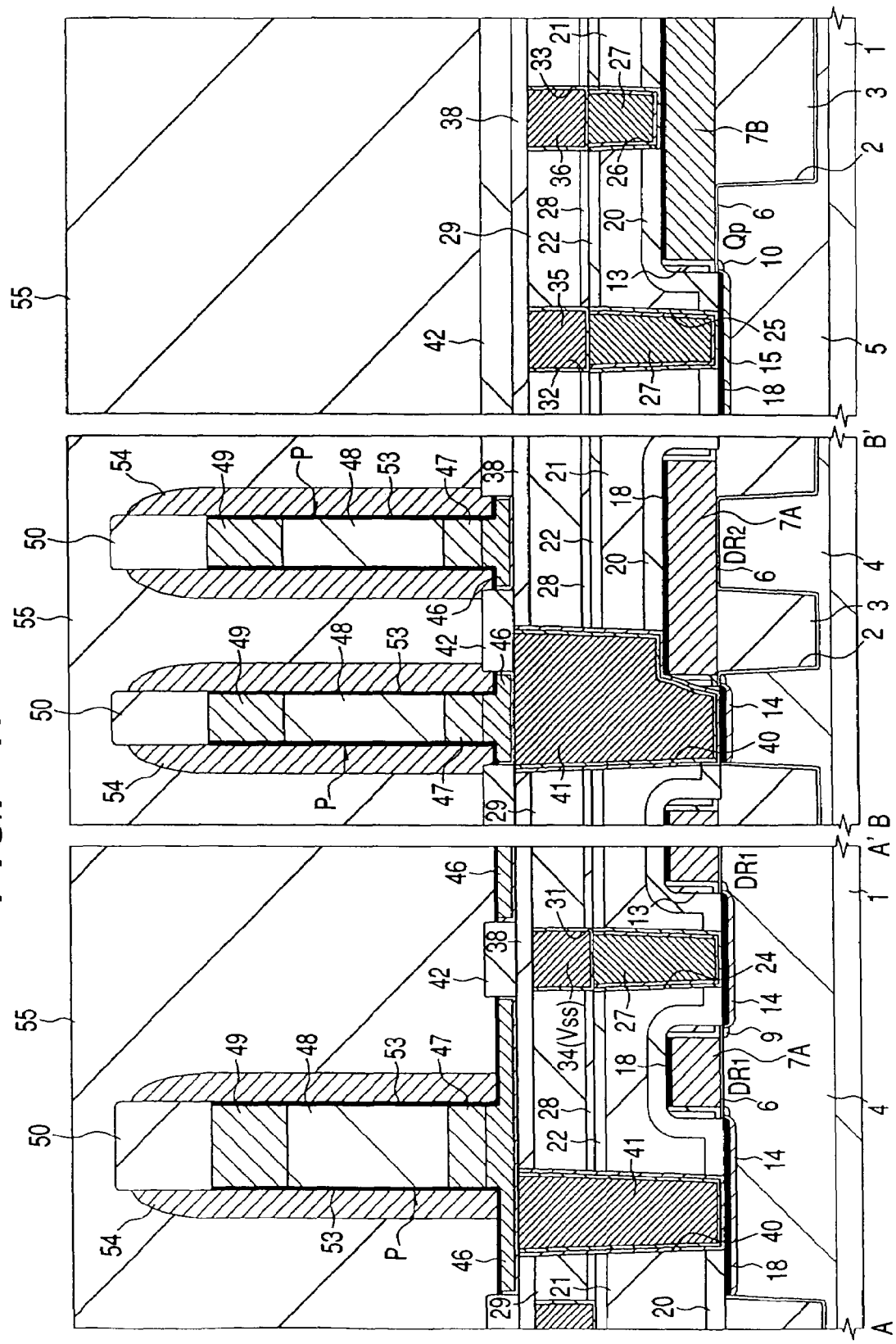
FIG. 47 is a cross-sectional view showing a method of manufacturing a semiconductor memory device according to one embodiment of this invention.

Next, as shown in FIG. 47, a silicon oxide film 55 is deposited as an insulating film by CVD on the substrate 1 containing the gate electrode 54. The silicon oxide film 55 is deposited to a larger film thickness than the pitch of the laminate (P).

Figure 48:
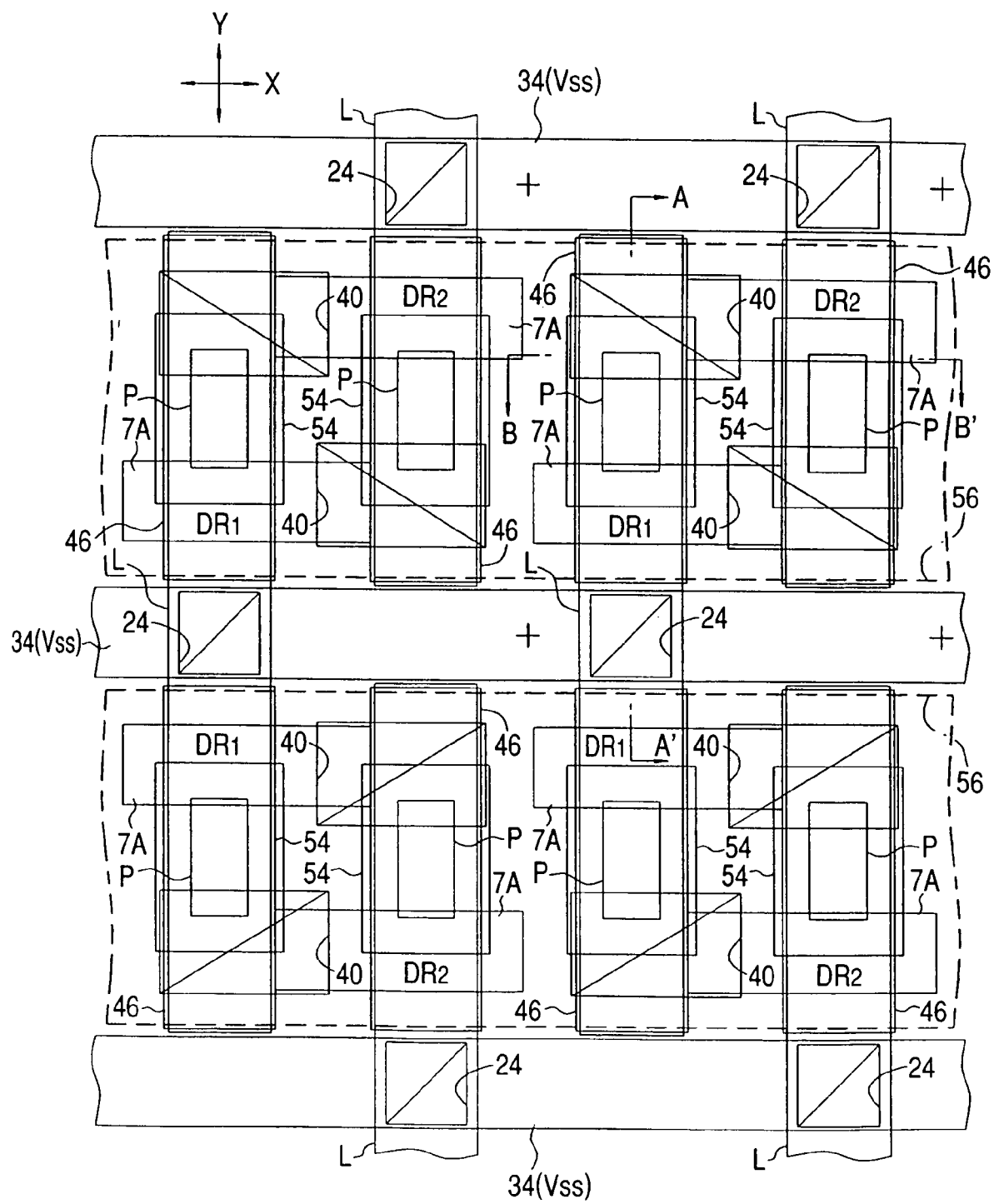
FIG. 48 is a plan view showing a method of manufacturing a semiconductor memory device according to one embodiment of this invention.
Figure 49:
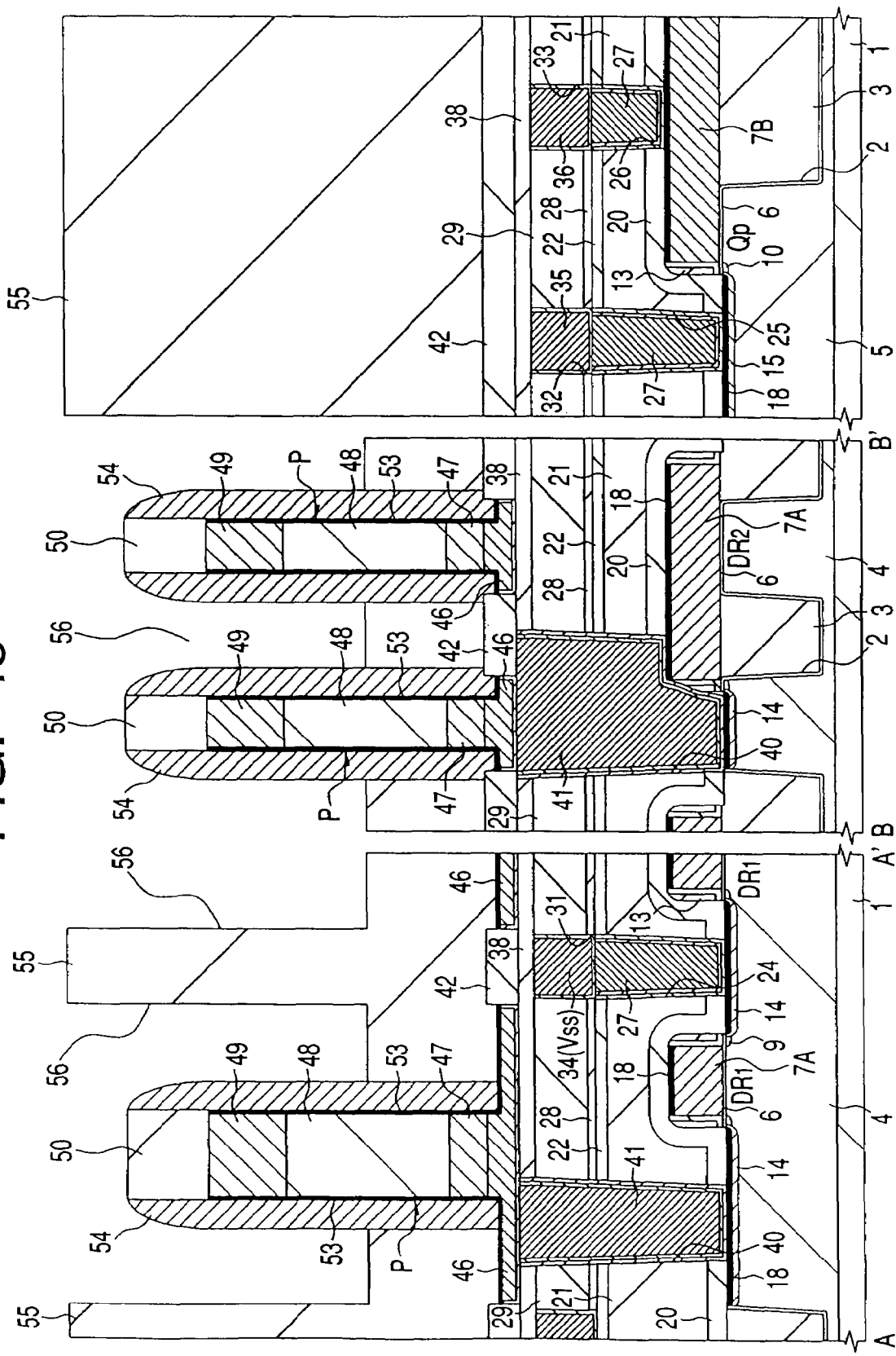
FIG. 49 is a cross-sectional view showing a method of manufacturing a semiconductor memory device according to one embodiment of this invention.

Next, as shown in FIGS. 48 and 49, a groove 56, which opens onto the perimeter of the laminate (P), is formed by dry etching of the silicon oxide film 55, using a photoresist film (not shown) as a mask. As shown in FIG. 49, the groove 56 is formed between the mutually adjoining reference voltage lines 34 (Vss), 34 (Vss) and extends in a belt shape in the X direction. The line width of the groove 56 in the Y direction is formed to be larger than the width of the side wall spacer-shaped gate electrode 54 in the Y direction, and it is formed so as to open onto the whole perimeter of the side wall spacer-shaped gate electrode 54.

The depth of the groove 56 is the depth at which the gate electrode 54 formed on the side walls of the laminate (P) is exposed to some extent. The word line (WL), which is electrically connected to each gate electrode 54 of the vertical MISFETs (SV$_1$, SV$_2$) arranged in the X direction is formed inside the groove 56, as will be mentioned later.

Figure 50:
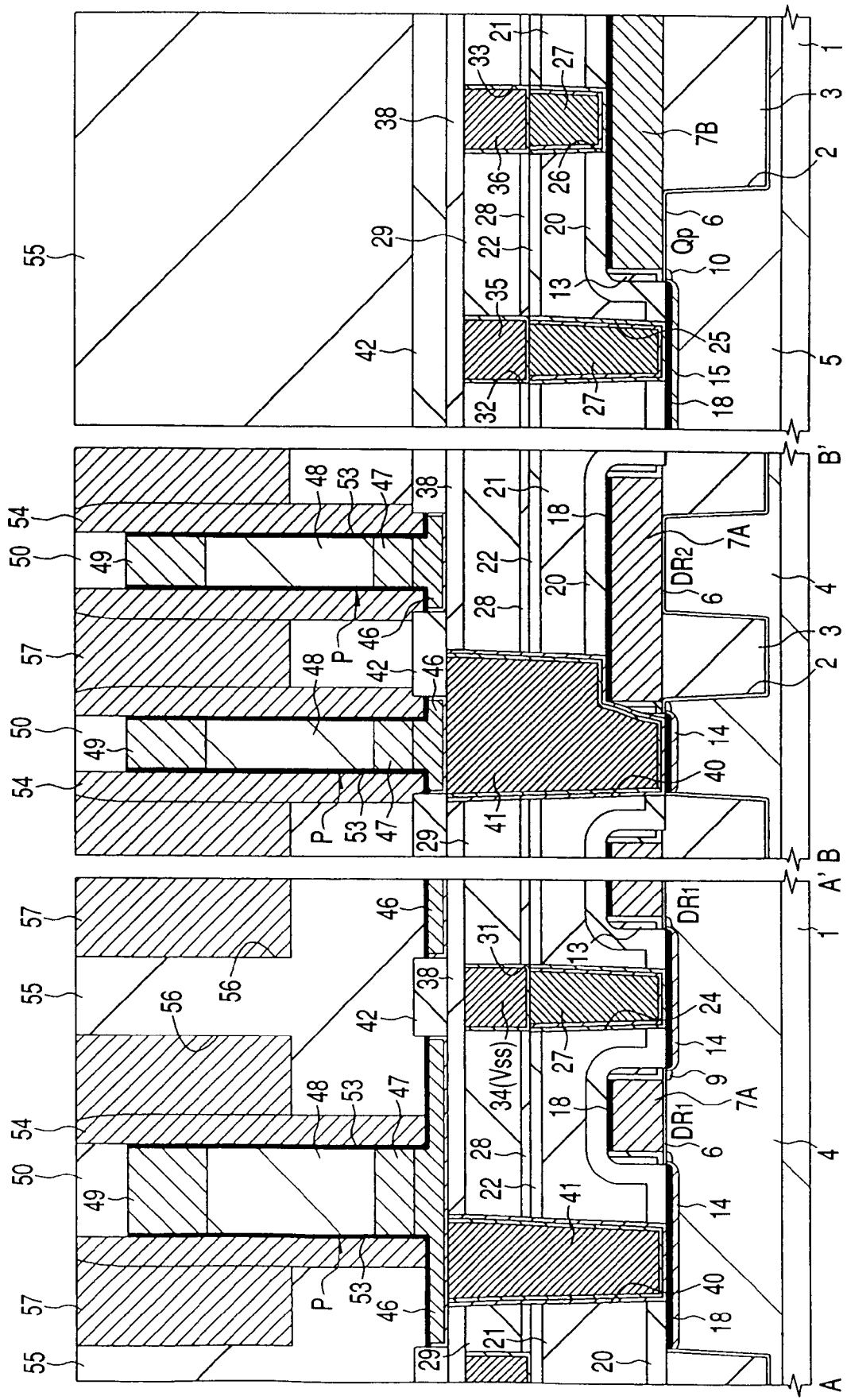
FIG. 50 is a cross-sectional view showing a method of manufacturing a semiconductor memory device according to one embodiment of this invention.

Next, as shown in FIG. 50, a polycrystalline silicon film 57 of the same conductivity type as the gate electrode 54 is formed inside the groove 56. Specifically, a n type (or p type) polycrystalline silicon film 57 is deposited by CVD on the silicon oxide film 55 including the inside of the groove 56, and the polycrystalline silicon film 57 on the silicon oxide film 55 is removed by chemical mechanical polishing or etch back. The polycrystalline silicon film 57 embedded inside the groove 56 is a conductive film which forms the word line (WL).

Thus, the conductive film 57 which forms the word line (WL) is in contact with the side wall spacer-shaped gate electrode 54 over its whole perimeter. Due to this, the resistance value of the word line (WL) can be reduced, and the contact resistance with the gate electrode 54 can be reduced.

Figure 51:
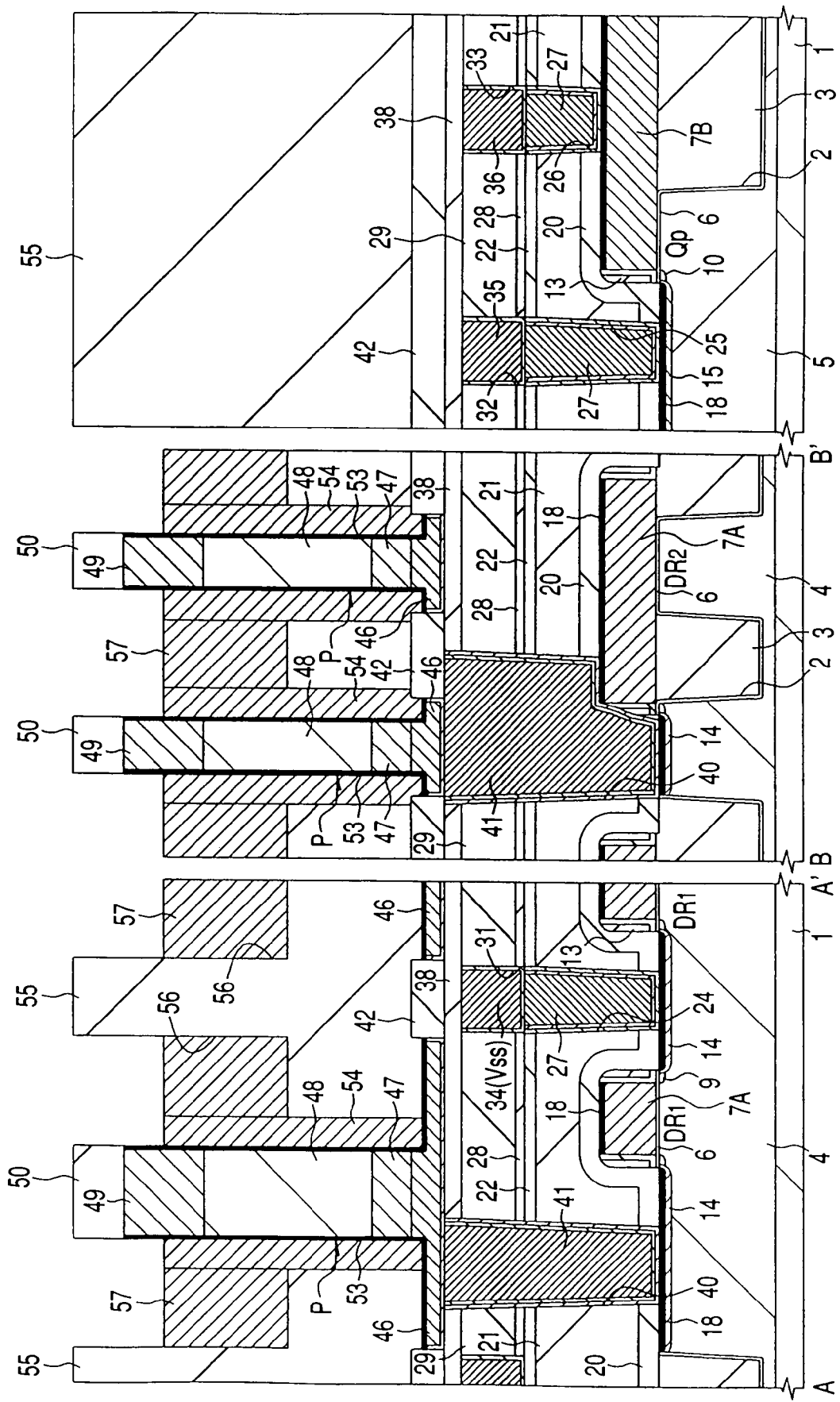
FIG. 51 is a cross-sectional view showing a method of manufacturing a semiconductor memory device according to one embodiment of this invention.

Next, as shown in FIG. 51, the upper surfaces of the polycrystalline silicon film 57 and the gate electrode 54 are retracted below the upper surface of the silicon oxide film 55 by performing etch back of the polycrystalline silicon film 57 and the gate electrode 54 in the groove 56.

Figure 52:
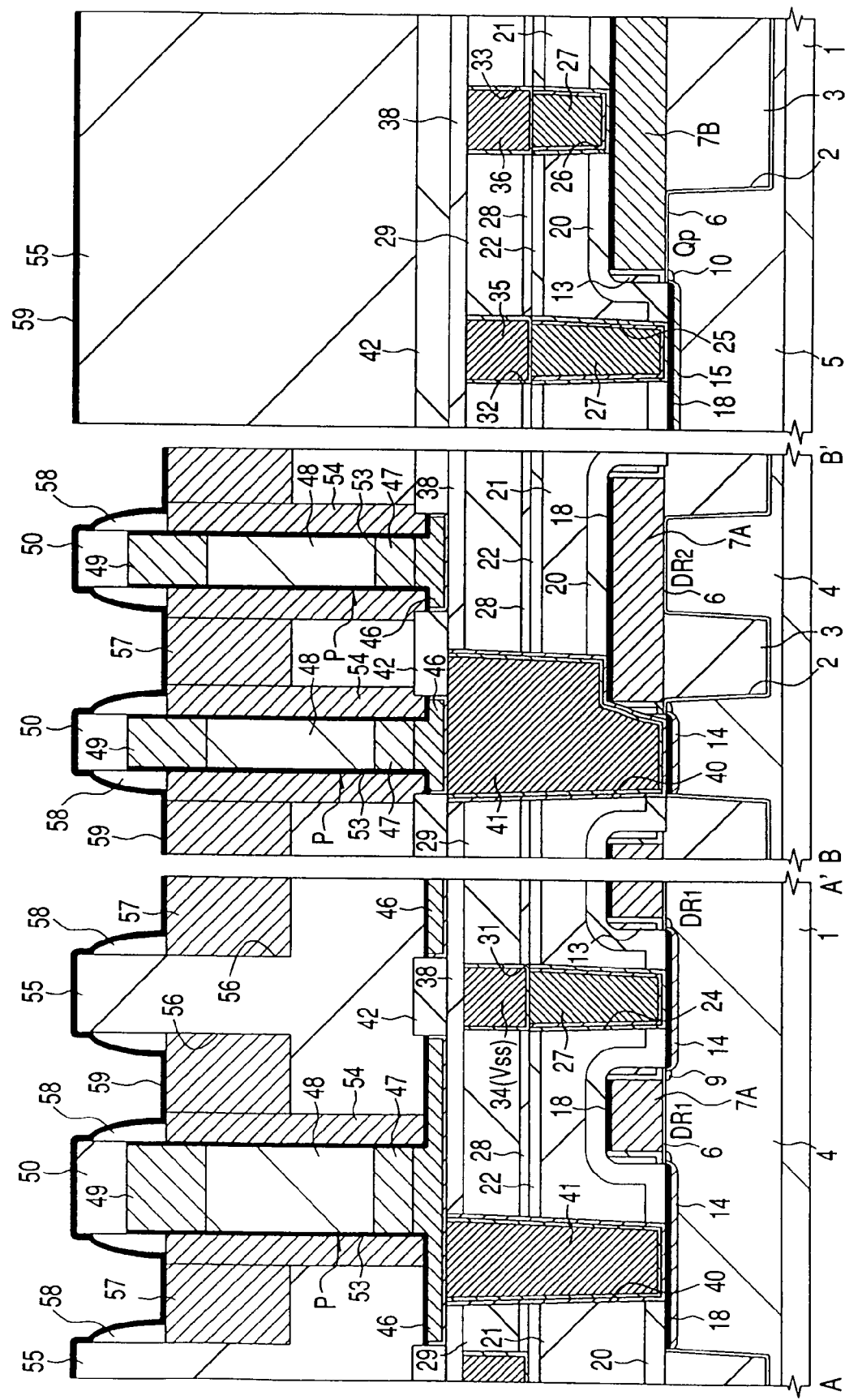
FIG. 52 is a cross-sectional view showing a method of manufacturing a semiconductor memory device according to one embodiment of this invention.

Next, as shown in FIG. 52, after forming a side wall spacer 58 comprising an insulating film on the side walls of the silicon oxide film 55 that is situated above the upper surface of the polycrystalline silicon film 57 and the laminate (P), a Co film 59 having a film thickness of approx. 8 nm is deposited, for example, by sputtering on the substrate 1, including the surface of the polycrystalline silicon film 57. To form the side wall spacer 58, a silicon oxide film is deposited by CVD on the substrate 1, and this silicon oxide film is then anisotropically etched.

Figure 53:
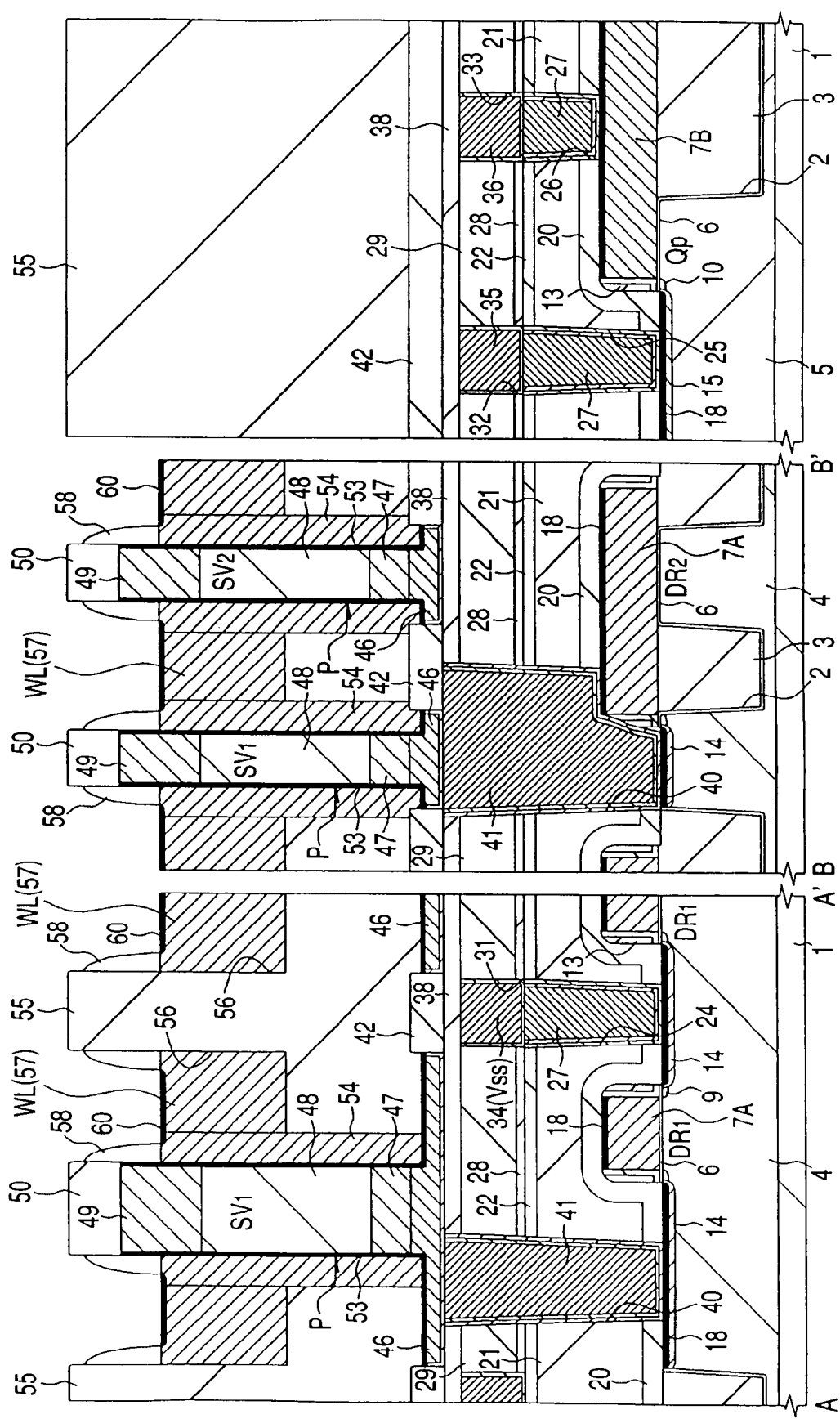
FIG. 53 is a cross-sectional view showing a method of manufacturing a semiconductor memory device according to one embodiment of this invention.

Next, as shown in FIG. 53, a Co silicide layer 60 is formed on the surfaces of the polycrystalline silicon film 57 and gate electrode 54 by heat-treating the substrate 1 to make the Co film 59 and the polycrystalline silicon film (polycrystalline silicon film 57 and gate electrode 54) react, and the unreacted Co film 59 is removed by etching. The Co silicide layer 60 is formed to reduce the contact resistance with the upper layer metal interconnection of the word line (WL).

Figure 54:
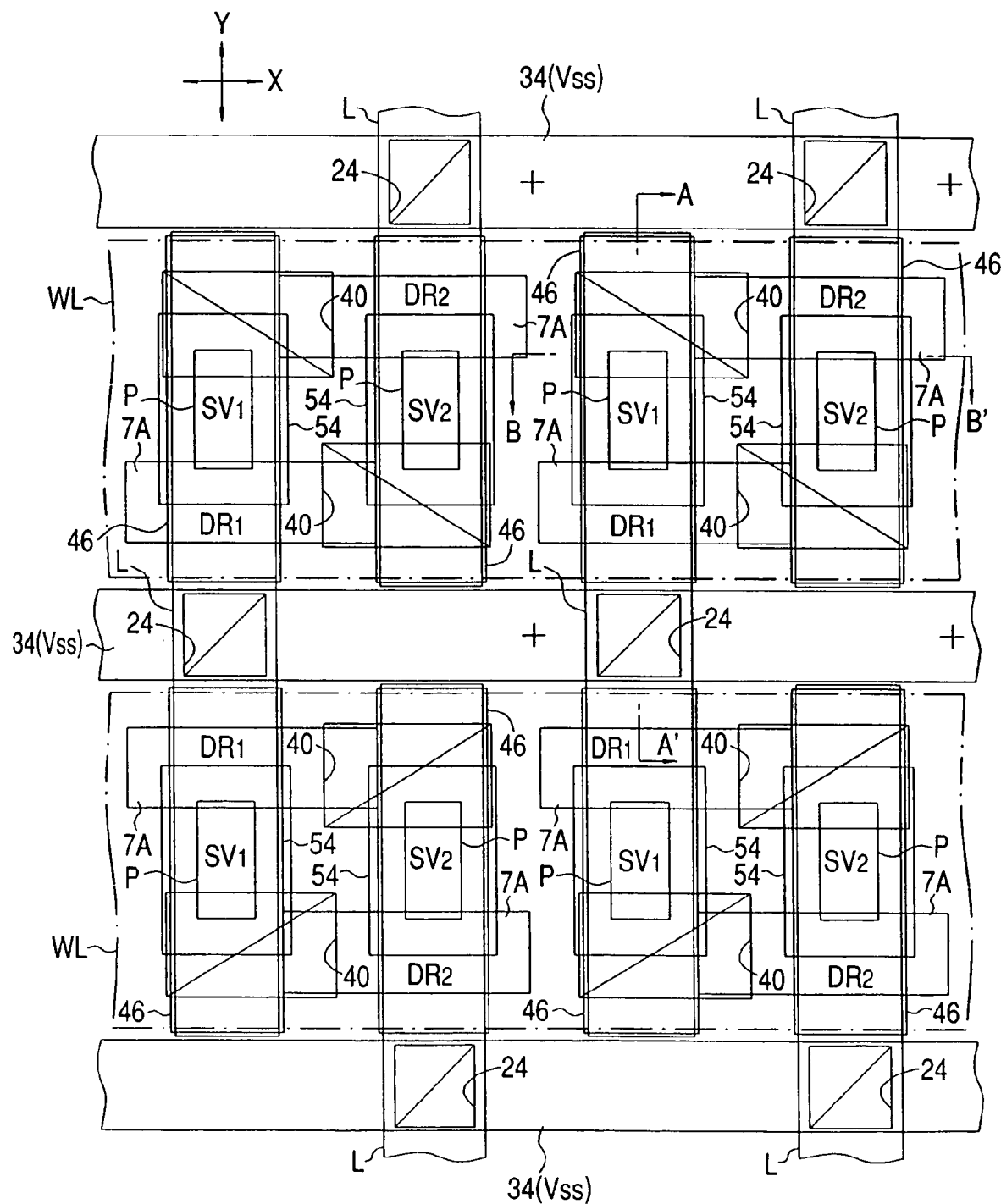
FIG. 54 is a plan view showing a method of manufacturing a semiconductor memory device according to one embodiment of this invention.

Due to these steps, the word line (WL) is formed by the polycrystalline silicon film 57 inside the groove 56. As shown in FIG. 54, the word line (WL) is formed between the mutually adjoining reference voltage lines 34 (Vss), 34 (Vss) and extends in a belt shape in the X direction. Further, due to these steps, a p channel type vertical MISFET ($SV_1$) is formed above the n channel type drive MISFET ($DR_1$), and a p channel type vertical MISFET ($SV_2$) is likewise formed above the n channel type drive MISFET ($DR_2$). This effectively completes a memory cell comprising two drive MISFETs ($DR_1$, $DR_2$) and two vertical MISFETs ($SV_1$, $SV_2$).

Figure 55:
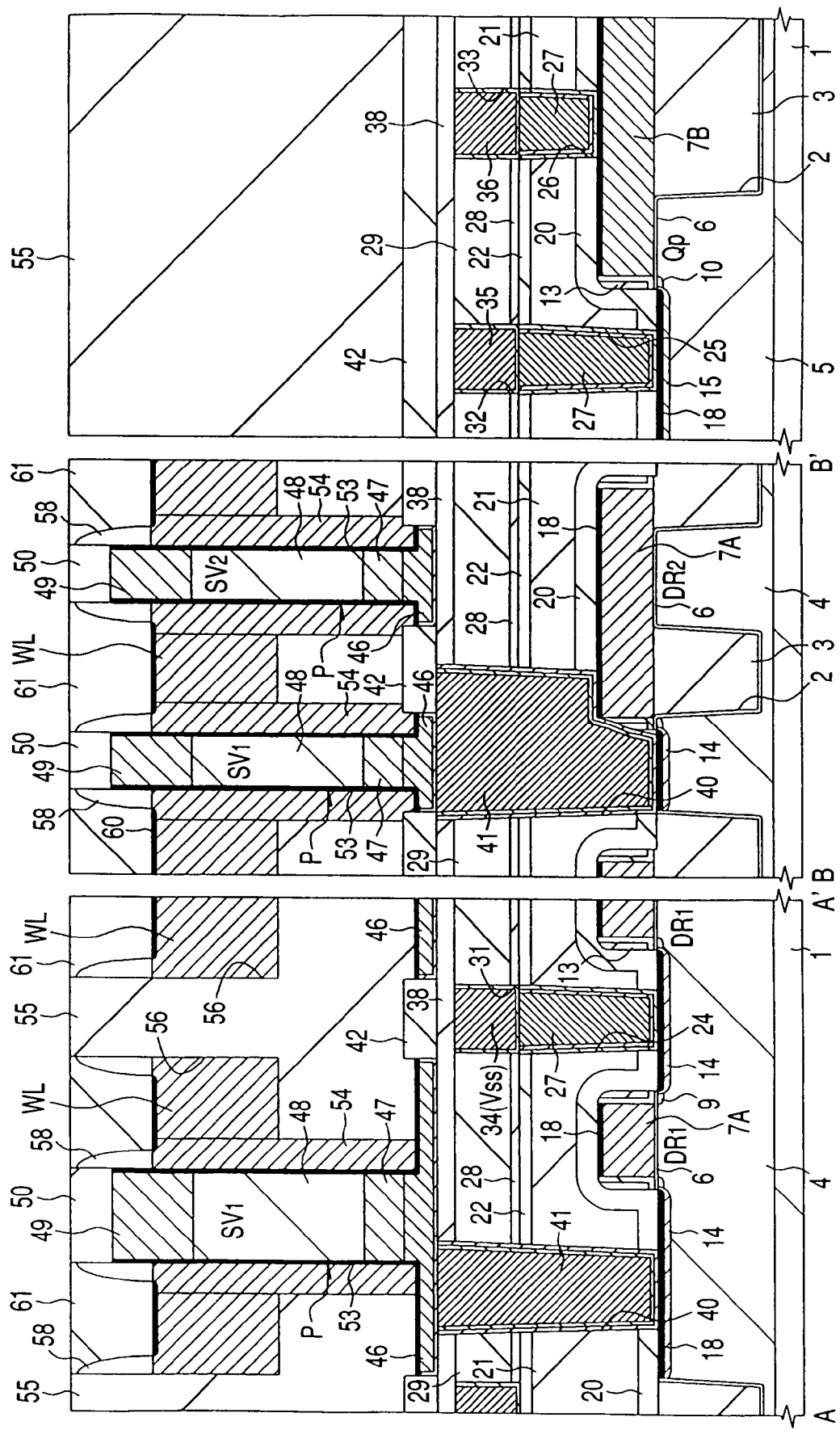
FIG. 55 is a cross-sectional view showing a method of manufacturing a semiconductor memory device according to one embodiment of this invention.

Next, as shown in FIG. 55, the silicon oxide film 61 is embedded, for example, as an insulating film inside the groove 56 in which the word line (WL) was formed. Specifically, the silicon oxide film 61 is deposited by CVD on the silicon oxide film 55, including the inside of the groove 56, and the unnecessary silicon oxide film 61 outside the groove 56 is then removed by chemical mechanical polishing. The silicon oxide film 61 is polished until the surface of the silicon nitride film 50, which is formed in the topmost part of the laminate (P), is exposed.

Figure 56:
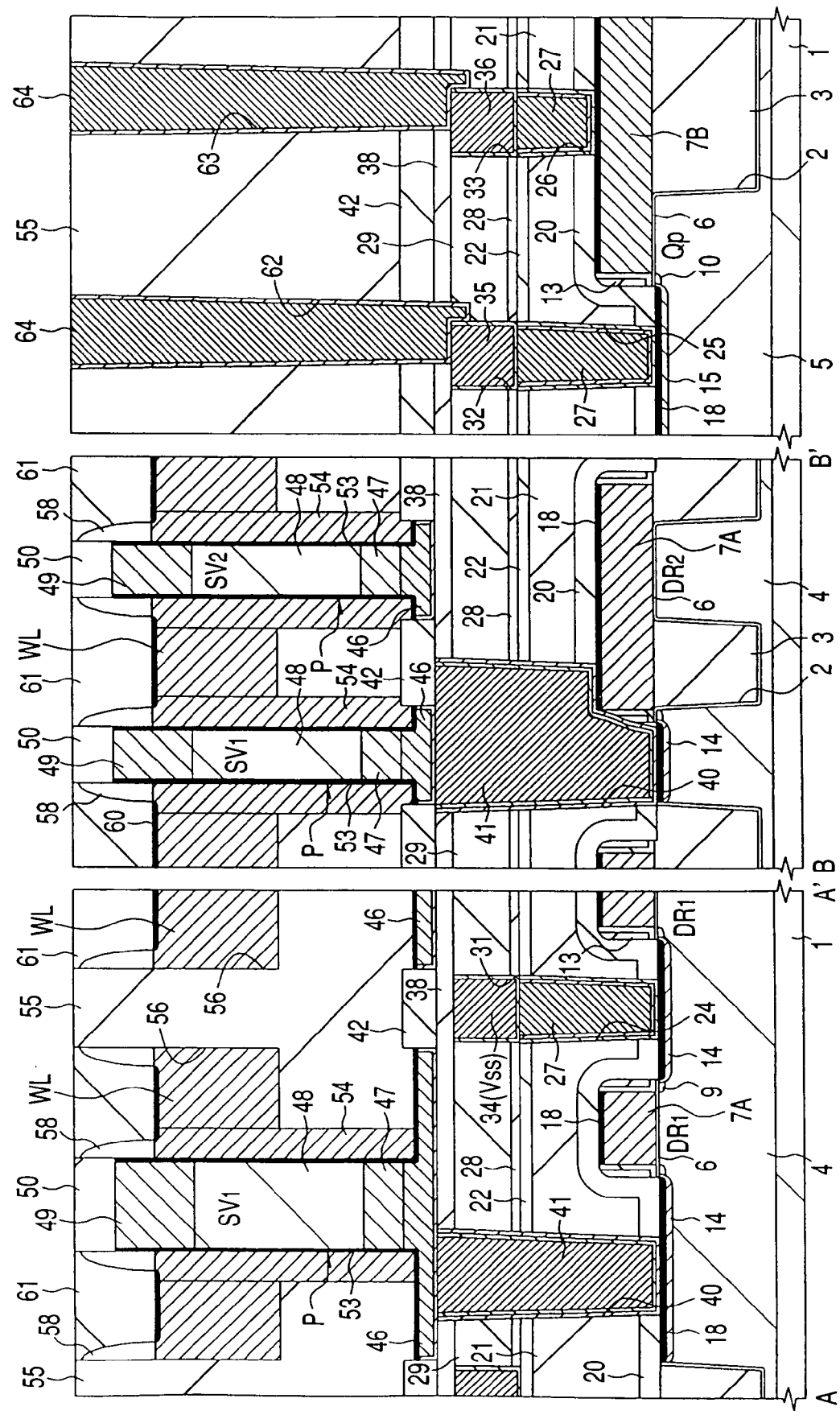
FIG. 56 is a cross-sectional view showing a method of manufacturing a semiconductor memory device according to one embodiment of this invention.

Next, as shown in FIG. 56, throughholes 62, 63 are formed in the first layer interconnections 35, 36 in the peripheral circuit region, and plugs 64 are formed inside the throughholes 62, 63. To form the plugs 64, a silicon oxide film 55 is formed in the peripheral circuit region using a photoresist film (not shown) as a mask, and the throughholes 62, 63 are formed above the first layer interconnections 35, 36 by dry etching the silicon oxide film 42 and silicon nitride film 38 underneath. Next, a TiN film is deposited by sputtering on the silicon oxide film 55, including the inside of the throughholes 62, 63, a W film, which is a metal film, is deposited by CVD, and the plugs 64 embedded in the throughholes 62, 63 are formed by removing unnecessary W film and TIN film outside the throughholes 62, 63 by chemical mechanical polishing. The plugs 64 may comprise a laminate comprising a Ti film, or a TiN film and a W film.

Figure 57:
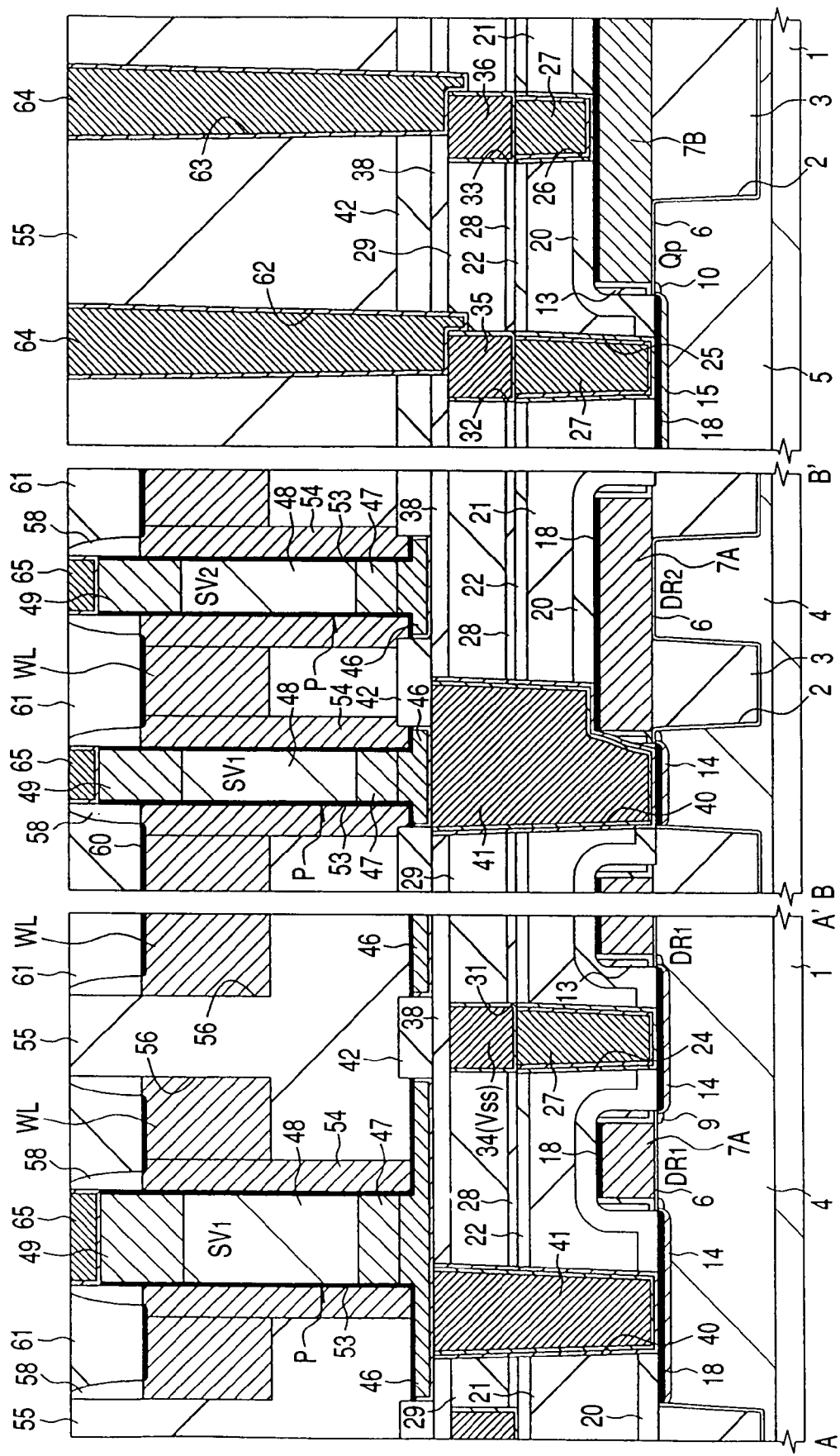
FIG. 57 is a cross-sectional view showing a method of manufacturing a semiconductor memory device according to one embodiment of this invention.

Next, as shown in FIG. 57, the surface of the upper semiconductor layer 49 is exposed by removing the silicon nitride film 50 formed in the topmost part of the laminate (P), and a plug 65 is formed there. To form the plug 65, the surface of the upper semiconductor layer 49 is first exposed by removing the silicon nitride film 50 by wet etching using hot phosphoric acid or the like. Next, a TiN film is deposited by sputtering on the silicon oxide films 55, 61 including the inside of the groove produced by removal of the silicon nitride film 50, a W film is deposited by CVD, and the plug 65 embedded in the groove produced by removing the silicon nitride film 50 is formed by removing unnecessary TiN film and W film from the outside of the groove by chemical mechanical polishing. The plug 65 may comprise a laminate film comprising a Ti film, or a TiN film and a W film. The plug 65, which is formed above the upper semiconductor layer 49, is formed in order to electrically connect the complementary data lines (BLT, BLB) and the semiconductor layer 49, which are formed by the following steps.

Figure 58:
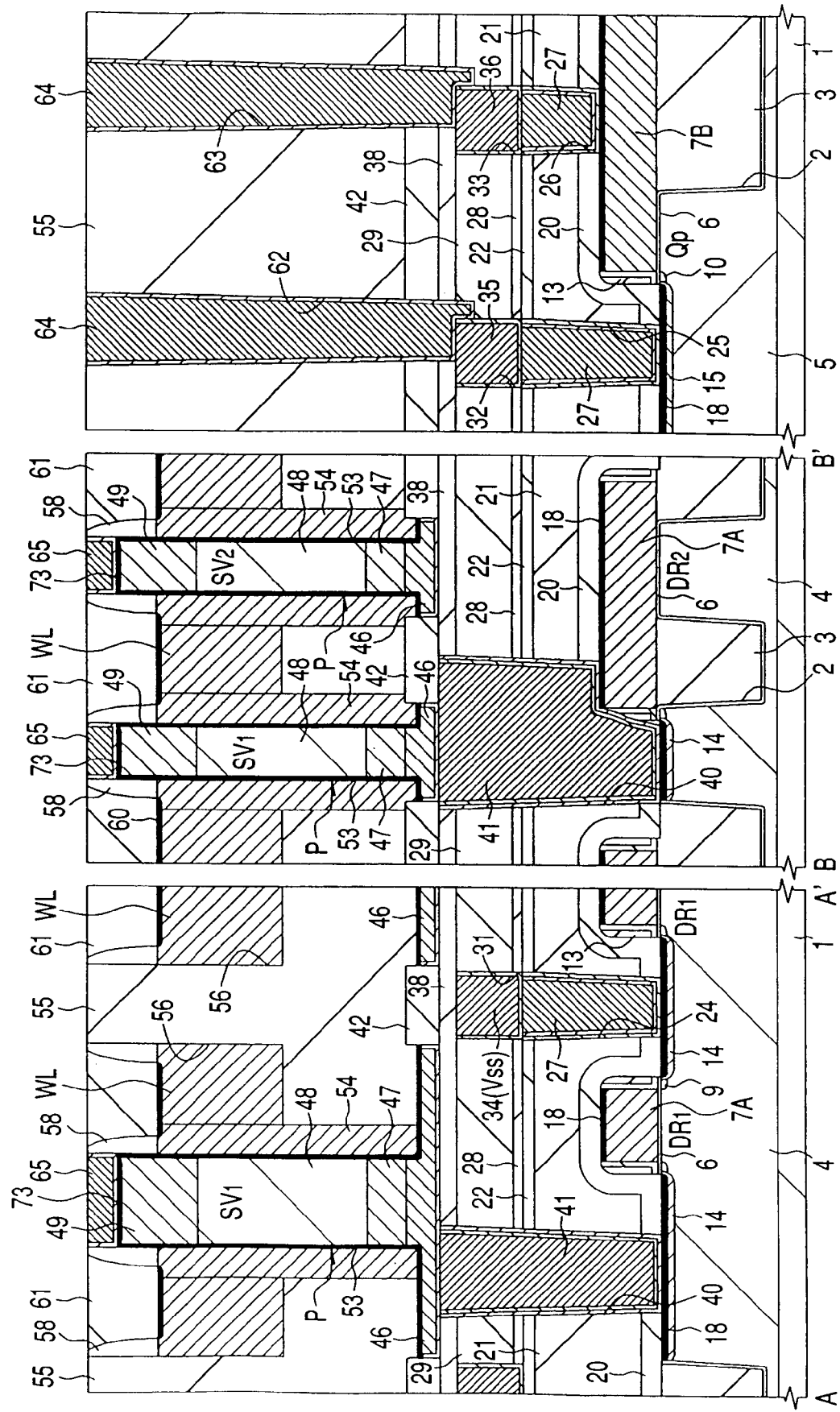
FIG. 58 is a cross-sectional view showing a method of manufacturing a semiconductor memory device according to one embodiment of this invention.

As shown in FIG. 58, prior to the step of forming the plug 65 above the upper semiconductor layer 49, a Co silicide layer 73 may be formed on the surface of the upper semiconductor layer 49 and the plug 65 formed on the Co silicide layer 73. To form the Co silicide layer 73, the surface of the upper semiconductor layer 49 is first exposed by removing the silicon nitride film 50, a Co film is deposited by sputtering on the substrate 1 including the surface of the upper semiconductor layer 49, the substrate 1 is heat-treated to cause the Co film and upper semiconductor layer 49 comprising the polycrystalline silicon film to react, and the unreacted Co film is removed by etching. The Co silicide layer 73 is formed to reduce contact resistance between the complementary data lines (BLT, BLB) and the semiconductor layer 49.

Figure 59:
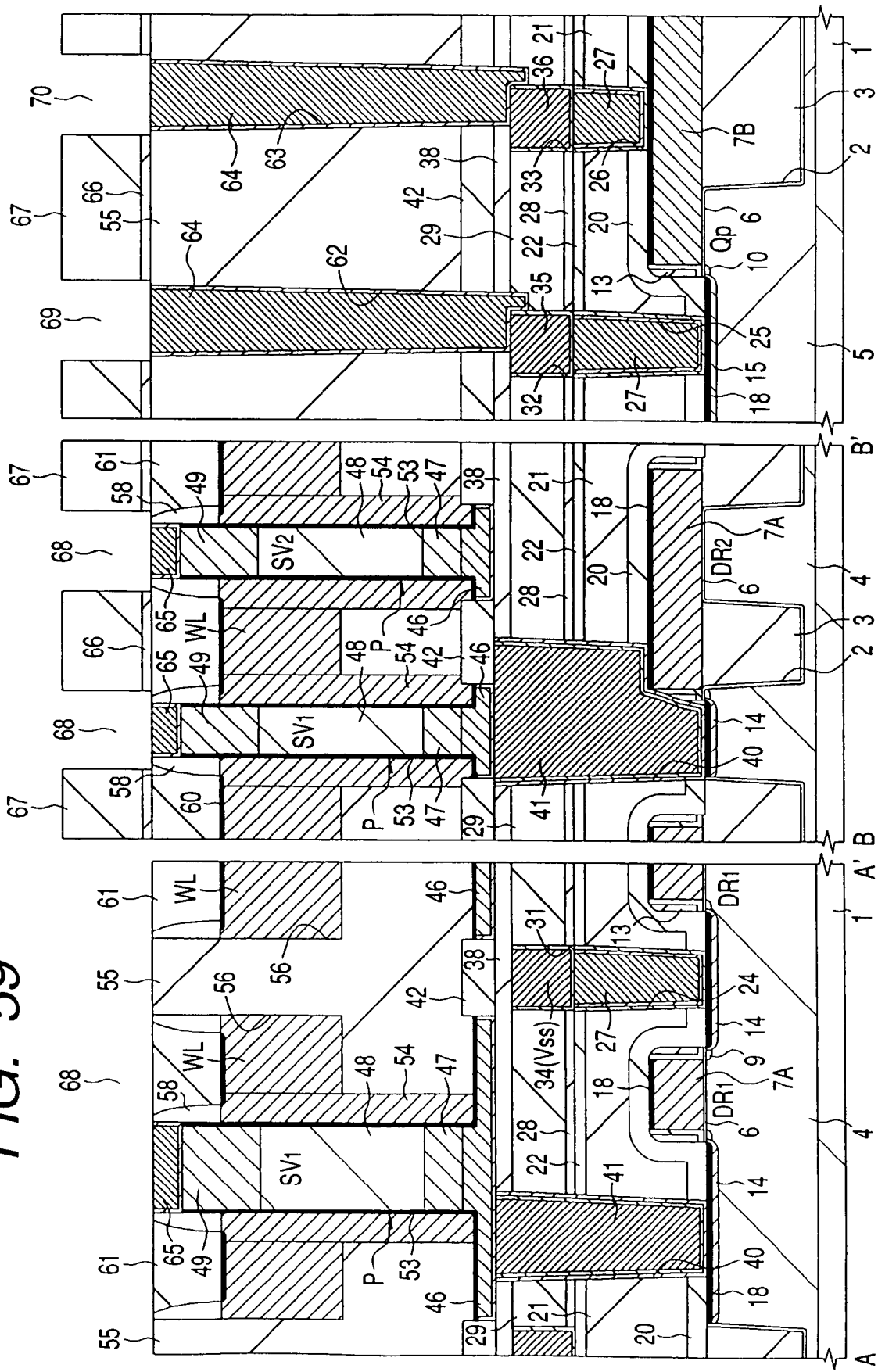
FIG. 59 is a cross-sectional view showing a method of manufacturing a semiconductor memory device according to one embodiment of this invention.

Next, as shown in FIG. 59, a silicon carbide film 66 having a film thickness of approx. 25 nm and a silicon oxide film 67 having a film thickness of approx. 300 nm are deposited by CVD on the substrate 1, an interconnection groove 68 is formed above the upper semiconductor layer 49 formed in the memory array by dry etching of the silicon oxide film 67 and the silicon carbide film 66, using a photoresist film (not shown) as a mask, and interconnection grooves 69, 70 are formed above the plug 64 formed in the peripheral circuit region.

Figure 60:
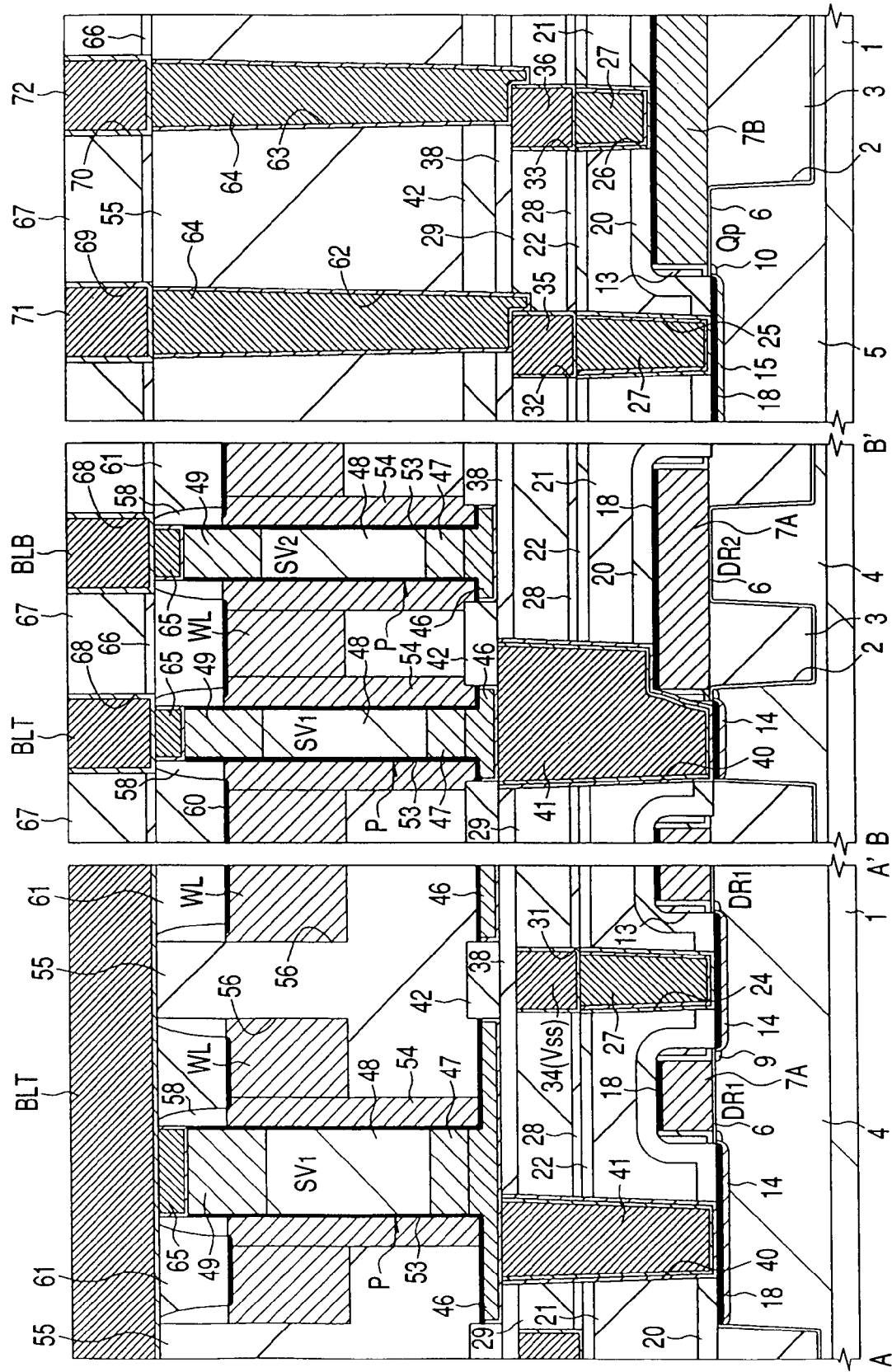
FIG. 60 is a cross-sectional view showing a method of manufacturing a semiconductor memory device according to one embodiment of this invention.
Figure 61:
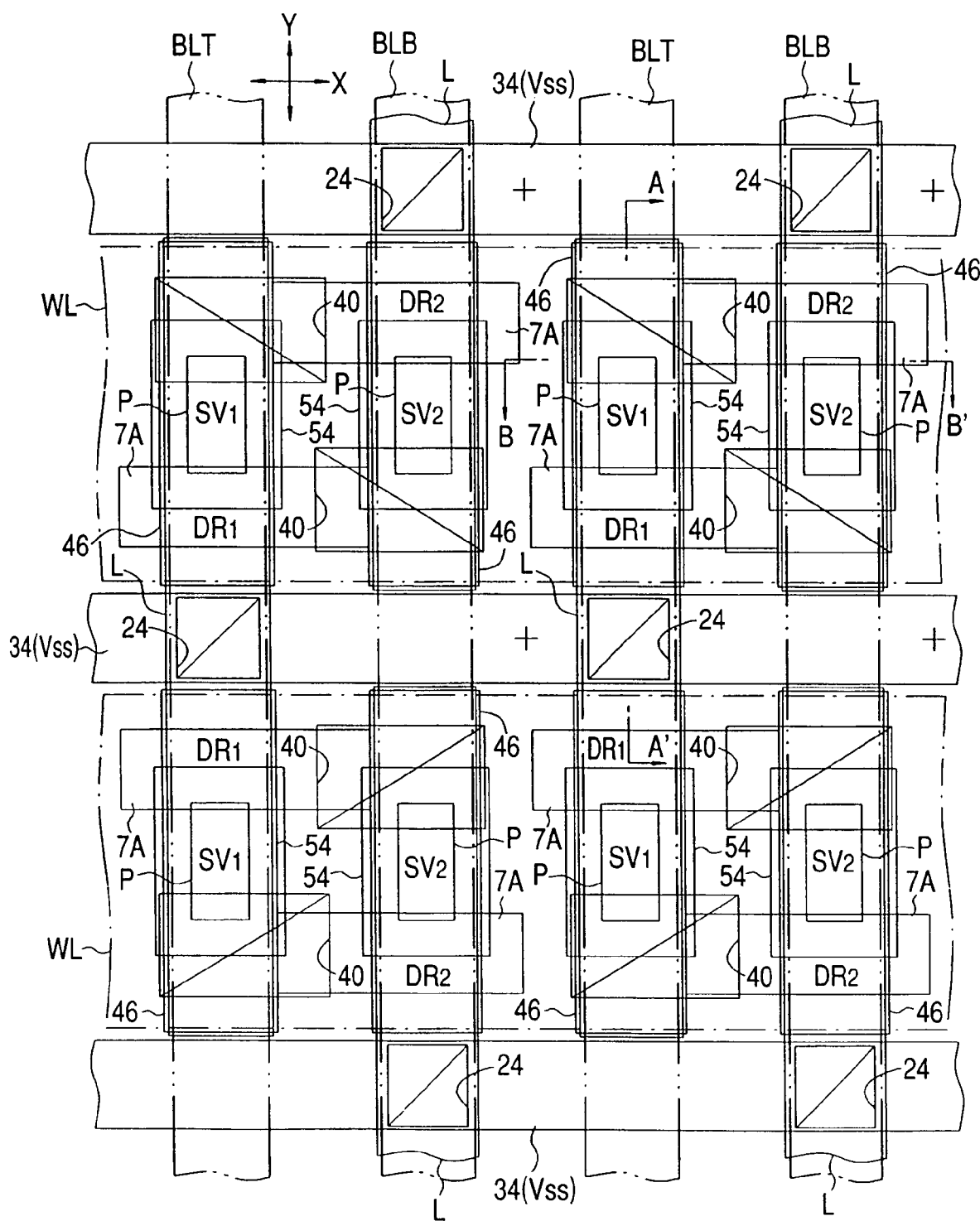
FIG. 61 is a plan view showing a method of manufacturing a semiconductor memory device according to one embodiment of this invention.

Next, as shown in FIGS. 60, 61, the complementary data lines (BLT, BLB) are formed inside the interconnection groove 68, and the second-layer interconnections 71, 72 of the peripheral circuit are formed inside the interconnection grooves 69, 70. The complementary data lines (BLT, BLB) and the second-layer interconnections 71, 72 are formed so as to be embedded in the interconnection grooves 68, 69, 70 by depositing a tantalum nitride (TaN) film by sputtering on the silicon oxide film 67, including the inside of the interconnection grooves 68, 69, 70, depositing a Cu film, which is a metal film, by sputtering or electroplating, and removing unnecessary Cu film and TaN film outside the grooves by chemical mechanical polishing. As shown in FIG. 60, one (BLT) of the complementary data lines (BLT, BLB) is formed above the vertical MISFET ($SV_1$) arranged in the Y direction, and the other (BLB) is formed above the vertical MISFET ($SV_2$) arranged in the Y direction.

These steps complete the formation of the SRAM of this embodiment, as shown in FIG. 2 and FIG. 3. Subsequently, upper interconnections, comprising metal films, are formed above the complementary data lines (BLT, BLB) and second-layer interconnections 71, 72 via an interlayer insulating film, but these are not shown.

Embodiment 2

Figure 62:
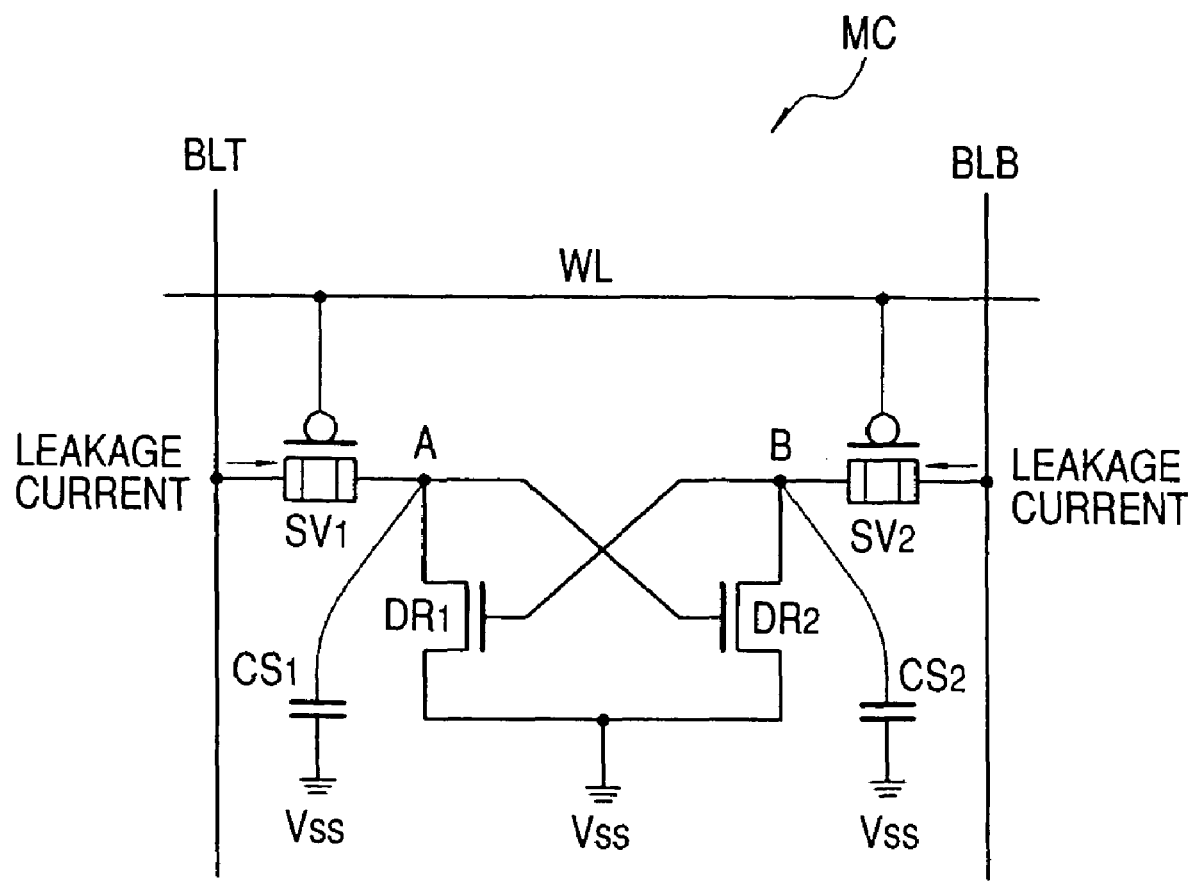
FIG. 62 is an equivalent circuit diagram showing a memory cell of a semiconductor memory device according to another embodiment of this invention.

FIG. 62 is an equivalent circuit diagram showing the memory cell of a SRAM according to this embodiment. The SRAM of this embodiment has a composition wherein capacitative elements ($CS_1$, $CS_2$) are formed at a pair of charge storage nodes (A, B) of the memory cell (MC) of Embodiment 1, in order to suppress software errors of the memory cell due to a rays.

Specifically, one of the electrodes of each of the capacitative elements ($CS_1$, $CS_2$) is electrically connected to the drain region of the drive MISFETs ($DR_1$, $DR_2$), which constitutes a charge storage node (A, B). The reference potential (Vss) is applied to the other electrode of the capacitative elements ($CS_1$, $CS_2$). Between the electrodes of the capacitative elements ($CS_1$, $CS_2$), a capacitance insulating film having a dielectric constant higher than silicon oxide, such as silicon nitride, is formed.

Figure 63:
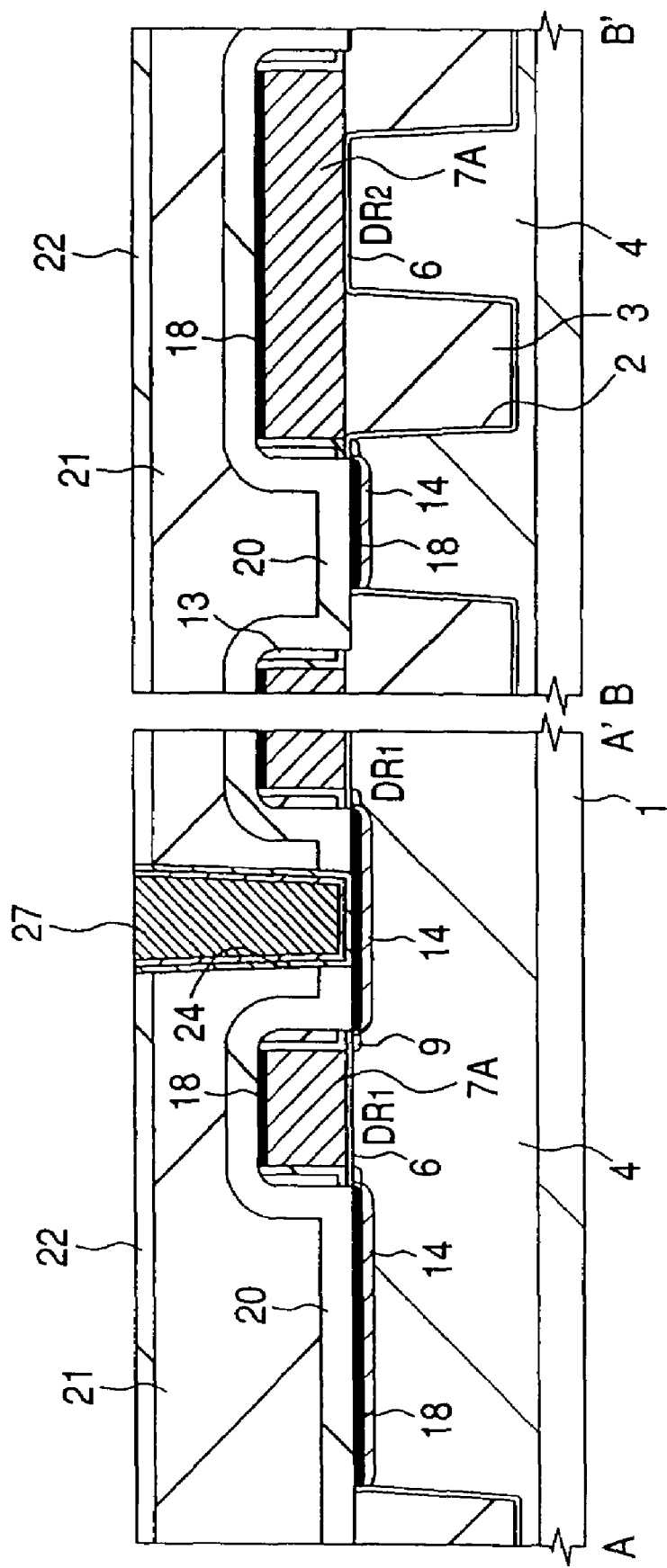
FIG. 63 is a cross-sectional view showing a method of manufacturing a semiconductor memory device according to another embodiment of this invention.

The aforesaid capacitative element ($CS_1$, $CS_2$), for example, can be formed by the following methods. First, as shown in FIG. 63, the upper insulating film of the drive MISFETs ($DR_1$, $DR_2$) is etched to form a contact hole 24 above the $n^+$ type semiconductor region 14 (source), and a plug 27 is embedded inside the contact hole 24. Up to this point, the steps are identical to the steps shown in FIG. 4-FIG. 24.

Figure 64:
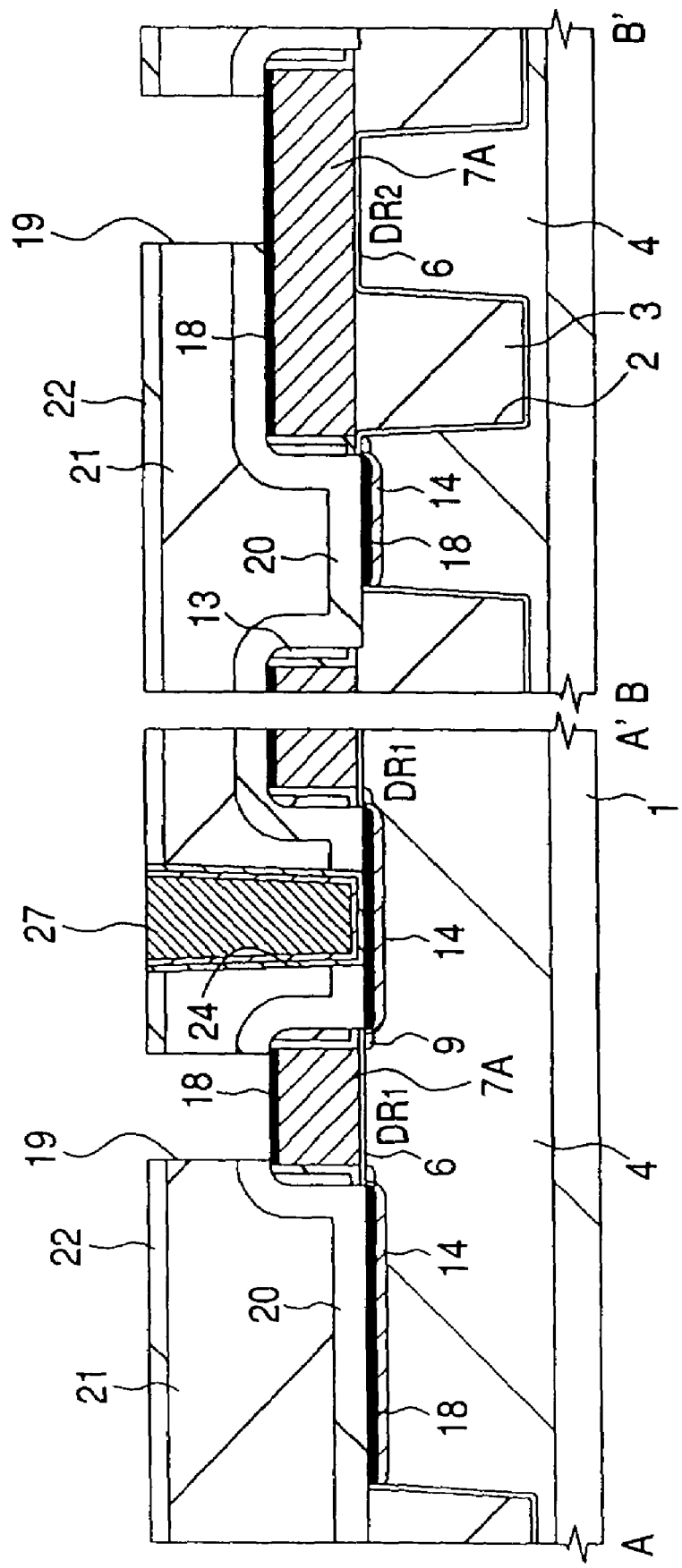
FIG. 64 is a cross-sectional view showing a method of manufacturing a semiconductor memory device according to another embodiment of this invention.

Next, as shown in FIG. 64, a contact hole 19 is formed above each of the gate electrodes 7A of the drive MISFETs ($DR_1$, $DR_2$) by etching the silicon oxide films 22, 21 and the silicon nitride film 20.

Figure 65:
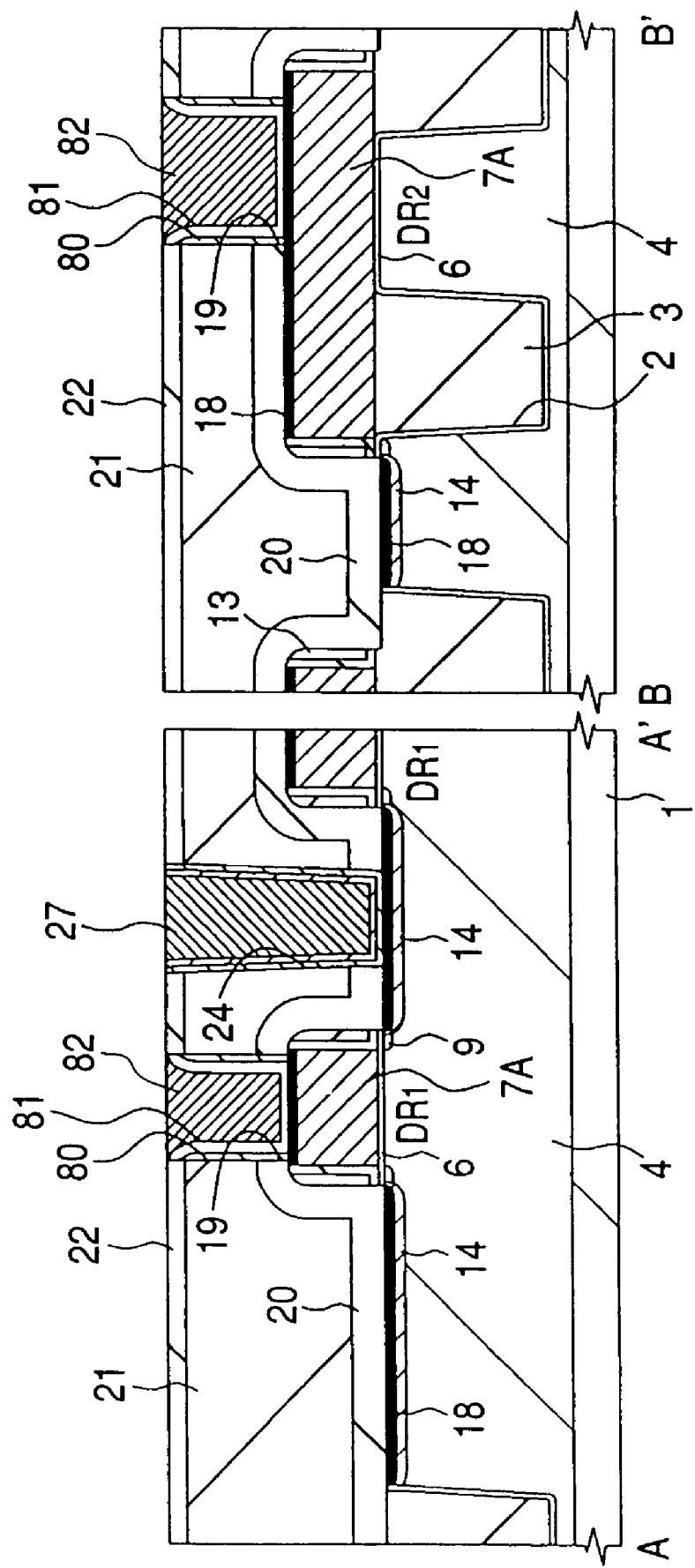
FIG. 65 is a cross-sectional view showing a method of manufacturing a semiconductor memory device according to another embodiment of this invention.

Next, as shown in FIG. 65, a Ti film 80, for example, is formed as a conductive film on the side walls of the contact hole 19, a capacitance insulating film 81 comprising silicon nitride or the like is formed on the side walls and base of the contact hole 19, and a W film 82 is embedded, for example, as a metal film. By forming the Ti film 80 on the side walls of the contact hole 19, the surface area of one electrode of the capacitative elements ($CS_1$, $CS_2$), which is formed by the upper surface of the gate electrode 7A and the Ti film 80, can be increased. The Ti film 80 may be replaced by a conductive film, such as a TiN film or a polycrystalline silicon film.

Figure 66:
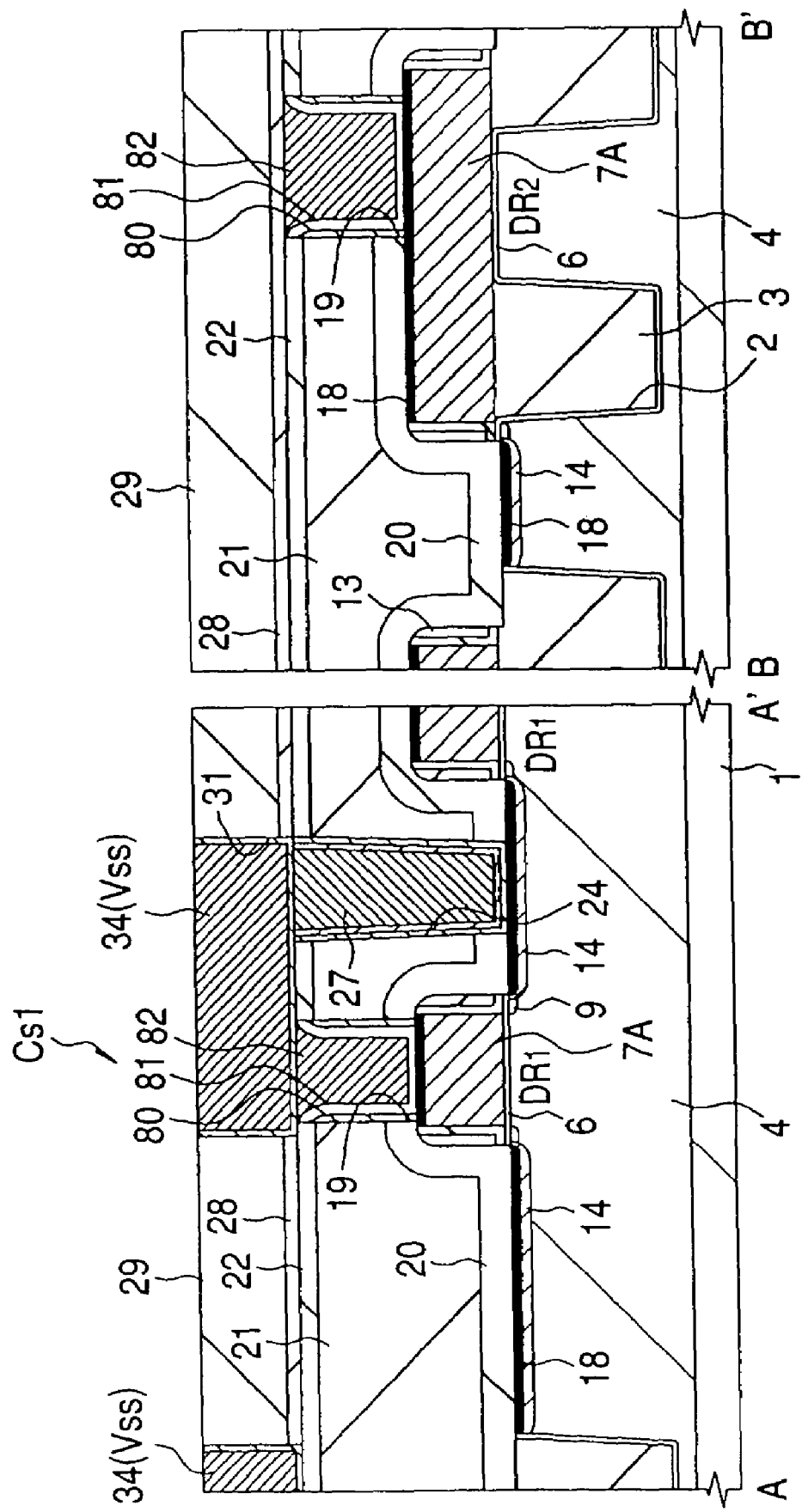
FIG. 66 is a cross-sectional view showing a method of manufacturing a semiconductor memory device according to another embodiment of this invention.

Next, as shown in FIG. 66, an interconnection groove 31 is formed in the silicon oxide film 29 and the silicon nitride film 28 above the contact hole 19 according to the steps shown in FIG. 25-27 of the aforesaid Embodiment 1, and the reference voltage line 34 (Vss) is then formed in the interconnection groove 31. At this time, part of the interconnection groove 31 extends above the contact hole 19, and a capacitative element ($CS_1$, $CS_2$) is formed by electrically connecting the W film 82 in the contact hole 19 and the reference voltage line 34 (Vss). The remaining steps are identical to those of Embodiment 1.

That is, one of the electrodes of each of the capacitative elements ($CS_1$, $CS_2$) is electrically connected to the drain region of the drive MISFETs ($DR_1$, $DR_2$) via the conductive film 80 and the gate electrodes 7A of the drive MISFETs ($DR_1$, $DR_2$). The other electrode of the capacitative elements ($CS_1$, $CS_2$) is electrically connected to the reference voltage line 34 (Vss) via the conductive film 82 embedded inside the contact hole 19.

Since one electrode of the capacitative elements ($CS_1$, $CS_2$) is formed by the conductive film 80, which is formed on the side walls and base of the contact hole 19, and the other electrode is formed by the conductive film 82, which is embedded inside the contact hole 19, the surface area of the side walls and base of the contact hole 19 can be used as a capacitative element.

Hence, by forming the capacitative elements ($CS_1$, $CS_2$) using the side walls and base of the contact hole 19, the surface area of the electrodes of the capacitative elements ($CS_1$, $CS_2$) can be enlarged, and the capacitance of the capacitative elements ($CS_1$, $CS_2$) can be increased.

Figure 67:
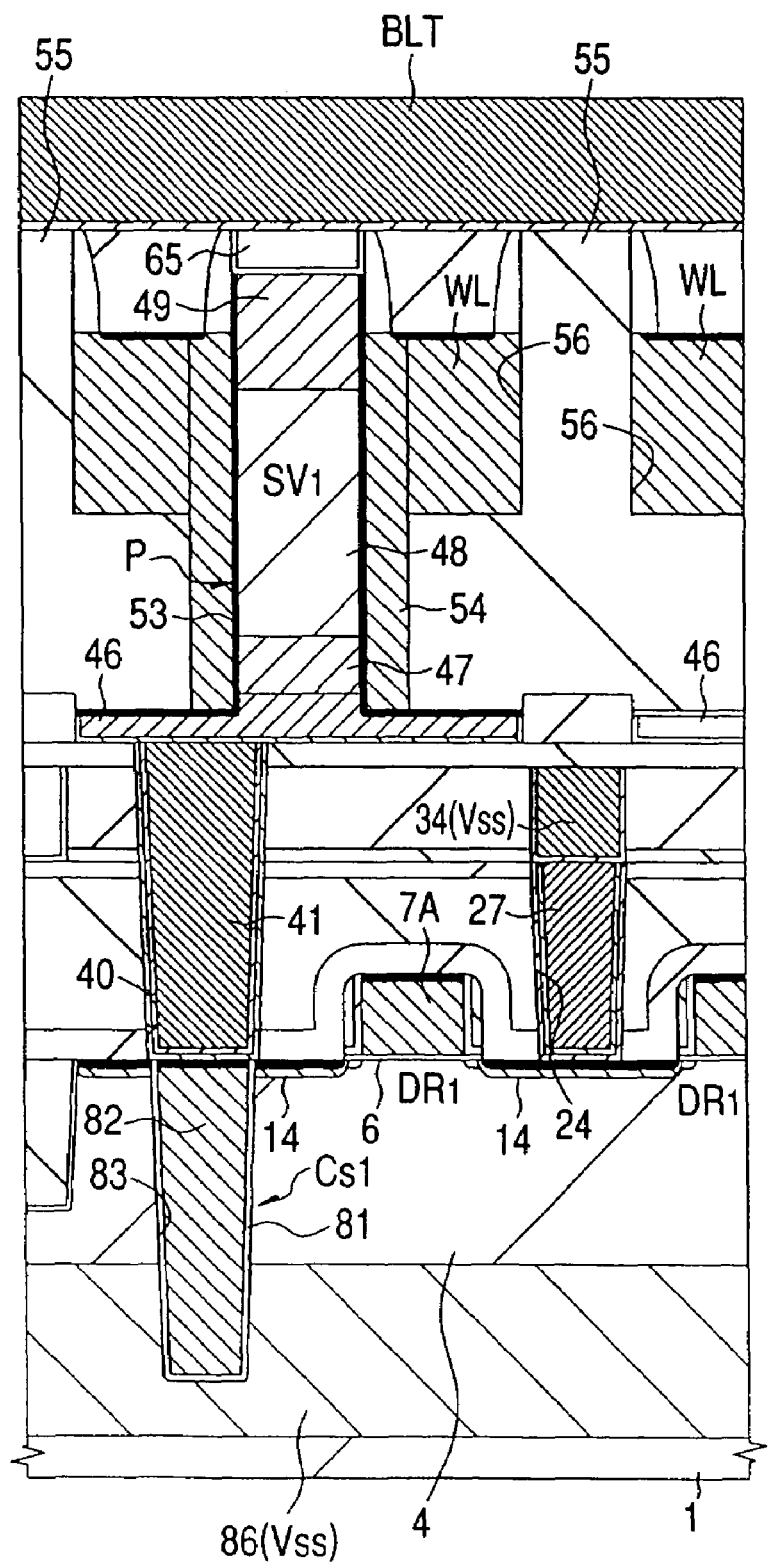
FIG. 67 is a cross-sectional view showing a method of manufacturing a semiconductor memory device according to another embodiment of this invention.

As shown in FIG. 67, the capacitative elements ($CS_1$, $CS_2$) can also be manufactured by forming a groove 83 in the substrate below the $n^+$ type semiconductor region 14 (source), and forming a capacitance insulating film 81 of silicon nitride with a conductive film 85 of polycrystalline silicon therein. In this case, an embedding well 86 for a power supply is formed in the substrate 1 around the groove 83, and the reference voltage (Vss) is supplied to the capacitative elements ($CS_1$, $CS_2$) via this embedding well 86.

The impurity concentration of the embedding well 86 is higher than the impurity concentration of the well 4, and its resistance value is reduced. The embedding well 86, for example, is formed in the whole lower part of the well 4, that is formed in the memory cell forming region. However, the embedding well 86 may be formed in the whole lower part of the well 4, including the peripheral circuit region. If this is done, the stability of the potential of the well 4 can be improved, and the properties of the semiconductor memory device can be improved.

One of the electrodes of each of the capacitative elements ($CS_1$, $CS_2$) comprises a conductive film 85 embedded in the groove 83 via the capacitance insulating film 81, and it is electrically connected with the drain region of the drive MISFETs ($DR_1$, $DR_2$) via a plug 41. The other electrode of the capacitative elements ($CS_1$, $CS_2$) comprises the embedding well 86 formed so as to surround the base and side wall perimeter of the groove 83. Since the base and side wall perimeter of the groove 83 can be used as the capacitative element ($CS_1$, $CS_2$), the surface area of the electrode of a capacitative element ($CS_1$, $CS_2$) can be enlarged, and the capacitance of the capacitative element ($CS_1$, $CS_2$) can be increased.

Embodiment 3

As described in connection with Embodiment 1, when the gate electrode 7A of the drive MISFETs ($DR_1$, $DR_2$) is formed by patterning the gate electrode material (polycrystalline silicon film) by two etchings using two different masks, deformation of the end of the gate electrode 7A due to the interference of exposure light can be suppressed.

Of the SRAM peripheral circuits, in these circuits containing MISFETs having a short gate length and circuits wherein MISFETs are arranged at high density, when the gate electrodes of the MISFETs in these circuits are formed, it is desirable to pattern the gate electrode material (polycrystalline silicon film) by two etchings using two different masks. Hereafter, the method of forming the gate electrodes of a MISFET forming the peripheral circuits will be described.

Figure 68:
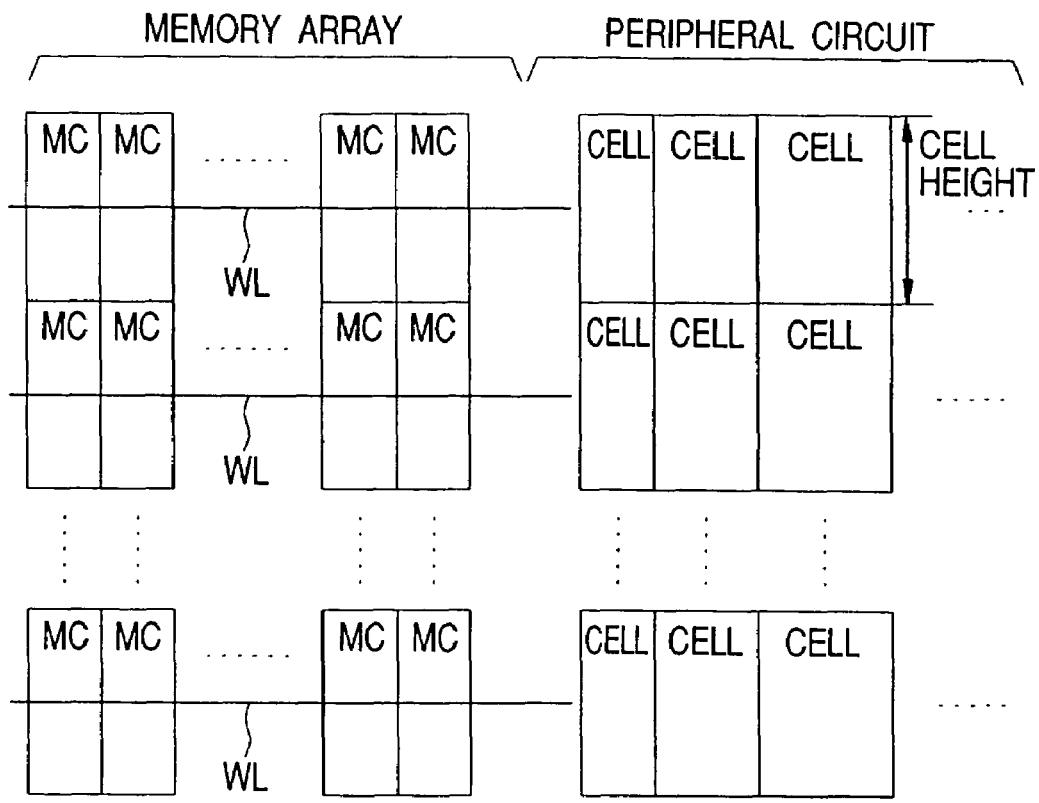
FIG. 68 is a schematic plan view describing the construction of the memory array and peripheral circuit of a semiconductor memory device according to another embodiment of this invention.
Figure 69:
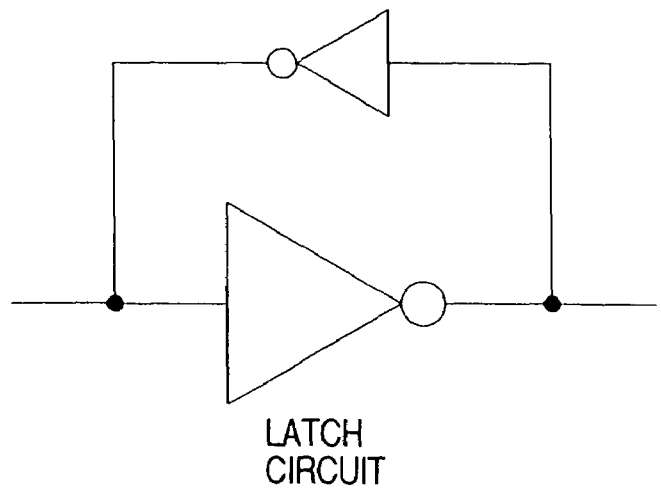
FIG. 69 is a circuit diagram of a latch circuit forming a part of the peripheral circuit.

As shown in FIG. 68, in addition to memory arrays wherein a large number of memory cells (MC) are arranged in the form of a matrix, a SRAM also will include peripheral circuits wherein unit circuits referred to as cells are arranged in the form of a matrix. These cells comprise basic gates, such as AND and OR, and latch circuits due to positive feedback, as shown in FIG. 69.

The method of forming channel type MISFETQn and p channel type MISFET forming the above-mentioned latch circuits will now be described with reference to FIG. 70-FIG. 73. FIG. 70 is a plan view of wells (p type well 4 and n type well 5) formed in one cell region, and the silicon oxide film 8 patterned in a belt shape in the cell pitch direction (up-and-down direction of the diagram). Gate electrode materials (n type polycrystalline silicon film 7n and p type polycrystalline silicon film 7p), not shown, are formed under this silicon oxide film 8.

The step of patterning the silicon oxide film 8 involves dry etching of the silicon oxide film 8, using the first photoresist film 16a shown in FIGS. 11, 12 of Embodiment 1 as a mask. That is, the gate electrode materials (n type polycrystalline silicon film 7n, p type polycrystalline silicon film 7p) are formed on the substrate 1, the silicon oxide film 8 is deposited thereon, the silicon oxide film 8 of the memory array is dry etched using the first photoresist film 16a as a mask, and the silicon oxide film 8 of the peripheral circuit region is also dry etched. Due to this, the silicon oxide film 8, having the belt-shaped flat pattern shown in FIG. 11, is formed in the memory array, and the silicon oxide film 8, having the belt-shaped flat pattern shown in FIG. 70, is formed in the peripheral circuit region.

Next, as shown in FIGS. 13 and 14, the silicon oxide film 8 of the memory array is patterned so that it has the same flat shape (rectangular) as the gate electrode, using the second photoresist film 16b as a mask. At this time, the silicon oxide film 8 of the peripheral circuit is patterned so that it has the same flat shape (rectangular) as the gate electrode using the aforesaid second photoresist film 16b as a mask.

Subsequently, the gate electrode materials (n type polycrystalline silicon film 7n, p type polycrystalline silicon film 7p) are dry etched using the aforesaid silicon oxide film 8 patterned in a rectangular shape as a mask. Due to this, the gate electrode 7A of the drive MISFETs ($DR_1$, $DR_2$) is formed in the memory array (FIG. 9), and the gate electrode 7A of the n channel type MISFETQn and gate electrode 7B of the p channel type MISFET are formed in the peripheral circuit region (FIG. 71).

Figure 72A:
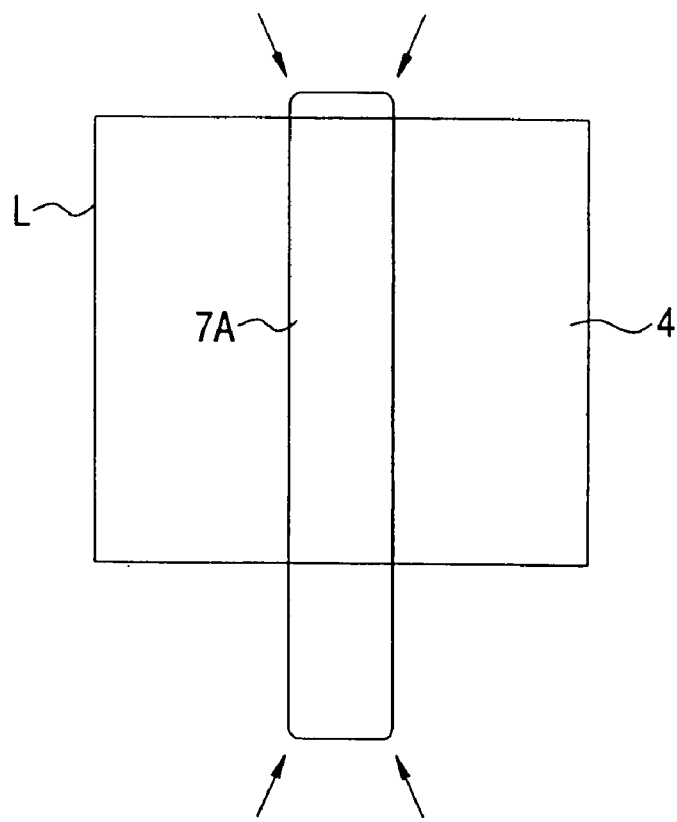
FIG. 72 (*a*) is a plan view showing a flat pattern of a gate electrode formed by two etching steps, and FIG. 72 (*b*) is a plan view showing a flat pattern of a gate electrode formed by one etching step.

Thus, when the gate electrode 7A of the n channel type MISFETQn and gate electrode 7B of the p channel type MISFET are formed by two etchings using two masks, as the roundness of the four corners of the gate electrode 7A (and gate electrode 7B) becomes small, as shown in FIG. 72(a), the amount by which the end retreats inside the active region (L) becomes small.

Figure 73:
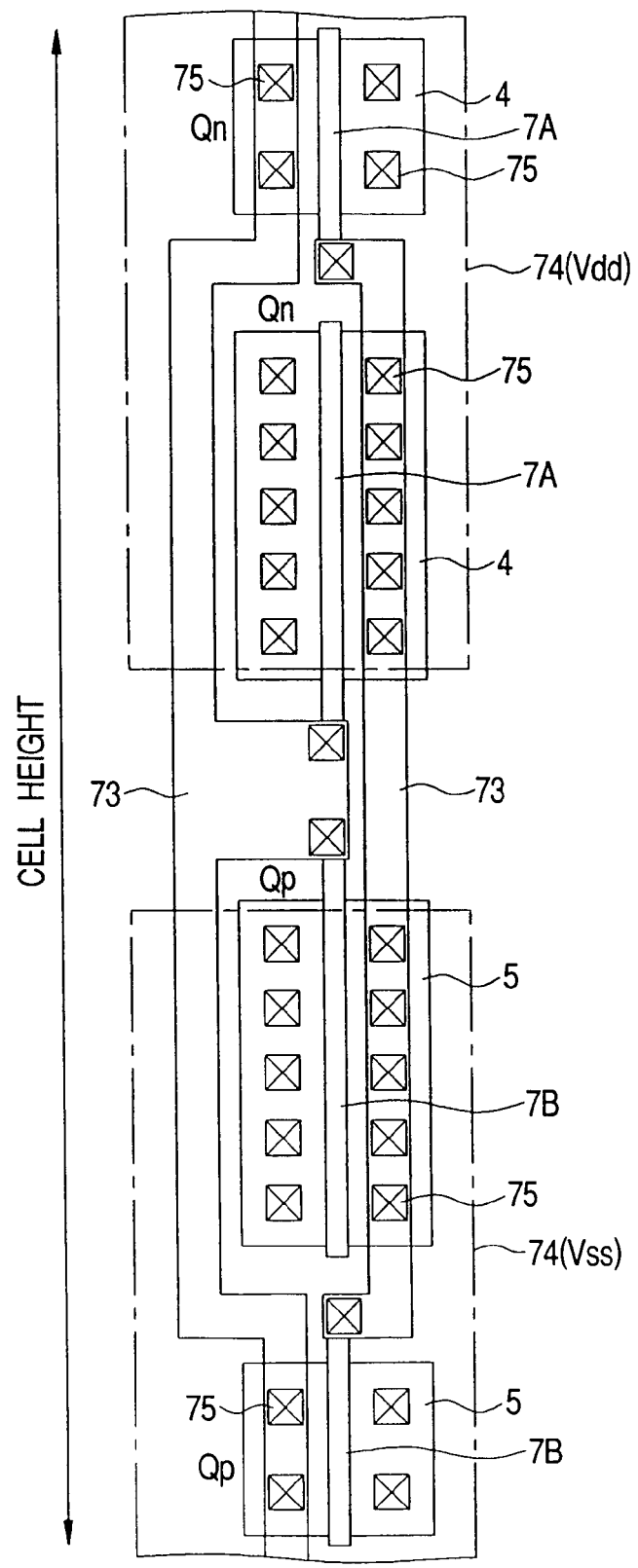
FIG. 73 is a plan view of a latch circuit showing a method of manufacturing a semiconductor memory device according to another embodiment of this invention.

Subsequently, as shown in FIG. 73, the latch circuit comprising the two n channel type MISFETQn and two p channel type MISFETQp is completed by forming the interconnections 73, 74 and through holes 75.

According to the above-described method of forming the gate electrodes 7A, 7B, the gap between the gate electrodes 7A, 7B in the pitch direction of the cell, which is the extension direction of the gate electrodes 7A, 7B, can be reduced, so that four MISFETs (two n channel type MISFETQn and two p channel type MISFETQp) can be arranged in one line in the pitch direction of the cell.

Figure 72B:
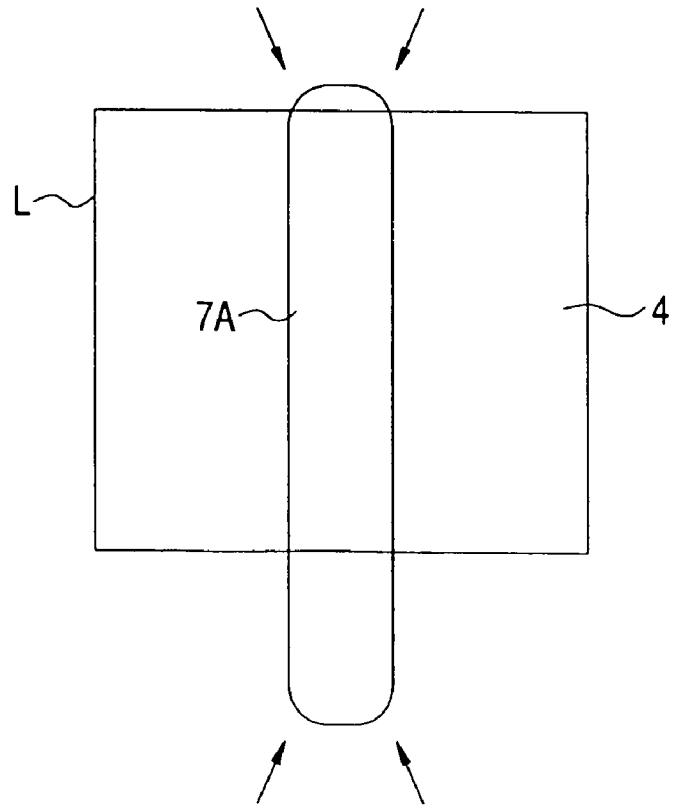

On the other hand, when the gate electrode 7A of the n channel type MISFETQn and gate electrode 7B of the p channel type MISFET are formed by one etching, as shown in FIG. 72(b), the roundness of the four corners of the gate electrode 7A (and gate electrode 7B) becomes large. Therefore, in this case, if the ends of the gate electrodes 7A, 7B are not far removed from the active region (L), the roundness of the ends of the gate electrodes 7A, 7B will reach the inner side of the active region (L) and will degrade the properties of the n channel type MISFETQn and p channel type MISFET.

Figure 74:
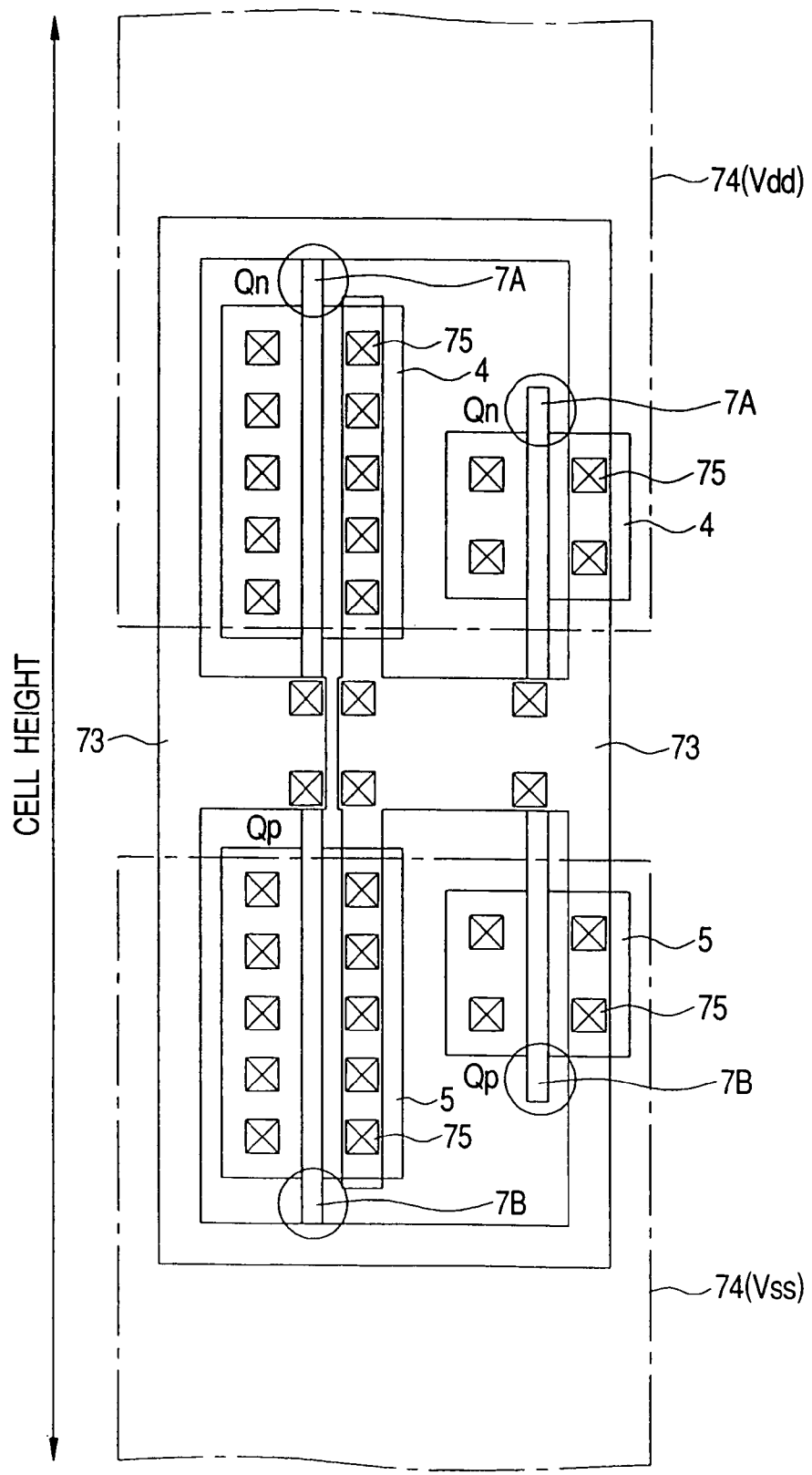
FIG. 74 is a plan view of a latch circuit comprising a MISFET wherein the gate electrodes are formed by one etching step.

However, if the ends of the gate electrodes 7A, 7B are far removed from the active region (L), the gap between the gate electrodes 7A, 7B in the pitch direction of the cell, which is the extension direction of the gate electrodes 7A, 7B, becomes large, so that it is impossible to arrange four MISFETs (two n channel type MISFETQn and two p channel type MISFETQp) in one line in the pitch direction of the cell. That is, in this case, as shown in FIG. 74, the four MISFETs (two n channel type MISFETQn and two p channel type MISFETQp) must be arranged in two lines. As a result, the width of the cell becomes large, and as the surface area of one cell increases, high integration of the peripheral circuit cannot be achieved.

Hence, since the gate electrodes 7A, 7B of the n channel type MISFETQn and p channel type MISFET, which form the peripheral circuit, are formed by two etchings using two masks, high integration of the peripheral circuit of the SRAM can be achieved.

In one part of the peripheral circuit of the SRAM, there is also a circuit, e.g. a power circuit, wherein MISFETs having a relatively long gate length are arranged at a relatively low density. In the MISFET in such a circuit, there is no problem if the ends of the gate electrodes are far removed from the active region (L), so that the gate electrodes can be formed by one etching. In other words, of the aforesaid two etching steps using two masks, the gate electrodes can be formed by one of them.

Embodiment 4

The gate electrode 54 and word line (WL) of the vertical MISFETs ($SV_1$, $SV_2$) can also be formed by the following methods.

Figure 75:
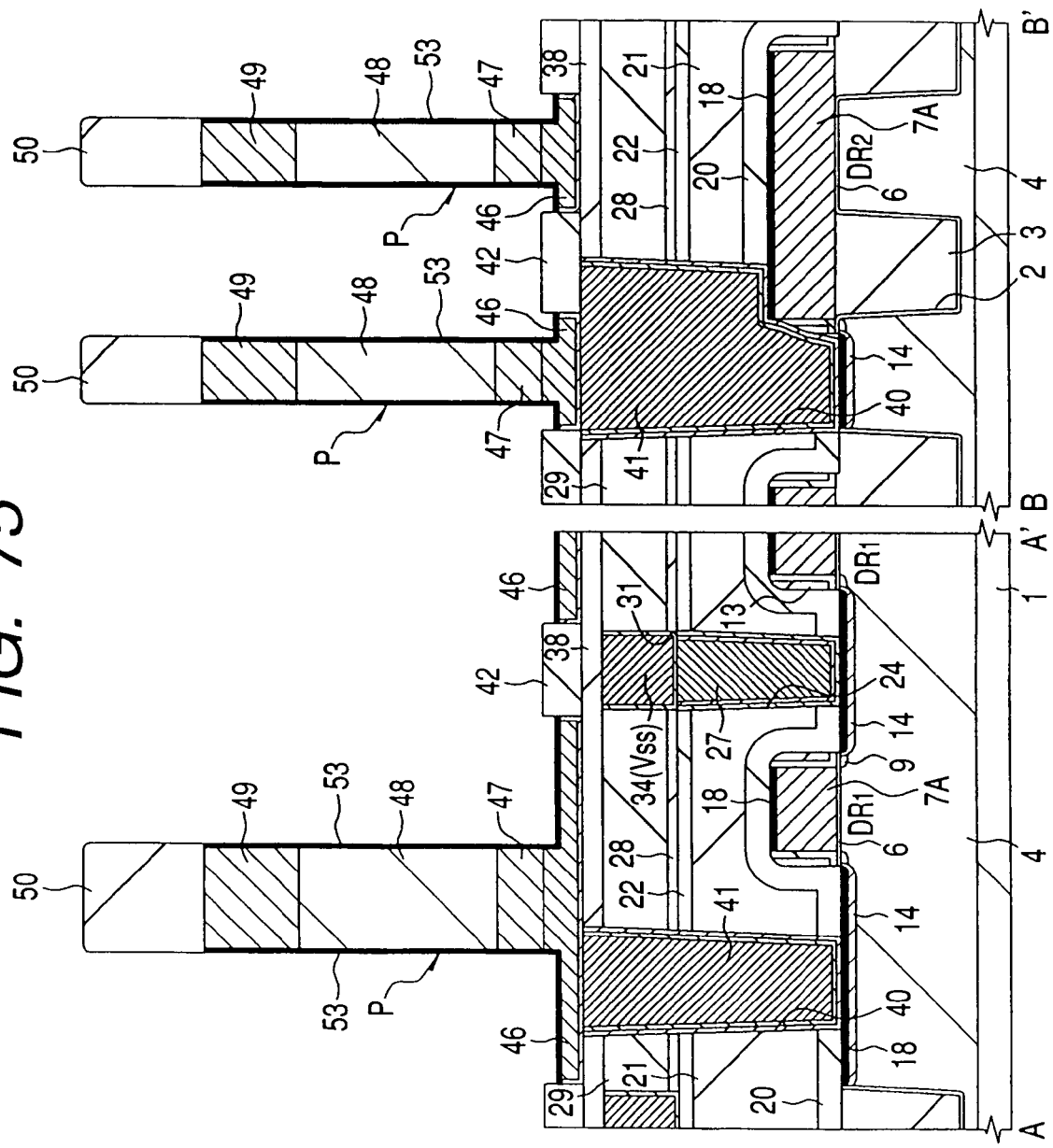
FIG. 75 is a cross-sectional view showing a method of manufacturing a semiconductor memory device according to another embodiment of this invention.

First, as shown in FIG. 75, the drive MISFETs ($DR_1$, $DR_2$) are formed by an identical method to that of Embodiment 1, the laminate (P) comprising the lower semiconductor layer 47, intermediate semiconductor layer 48 and upper semiconductor layer 49 is formed above the drive MISFETs ($DR_1$, $DR_2$), and the gate insulating film 53 comprising silicon oxide is formed on the side wall surface of the laminate (P). The steps thus far described are identical to the steps shown in FIG. 4-FIG. 44 of Embodiment 1.

Figure 76:
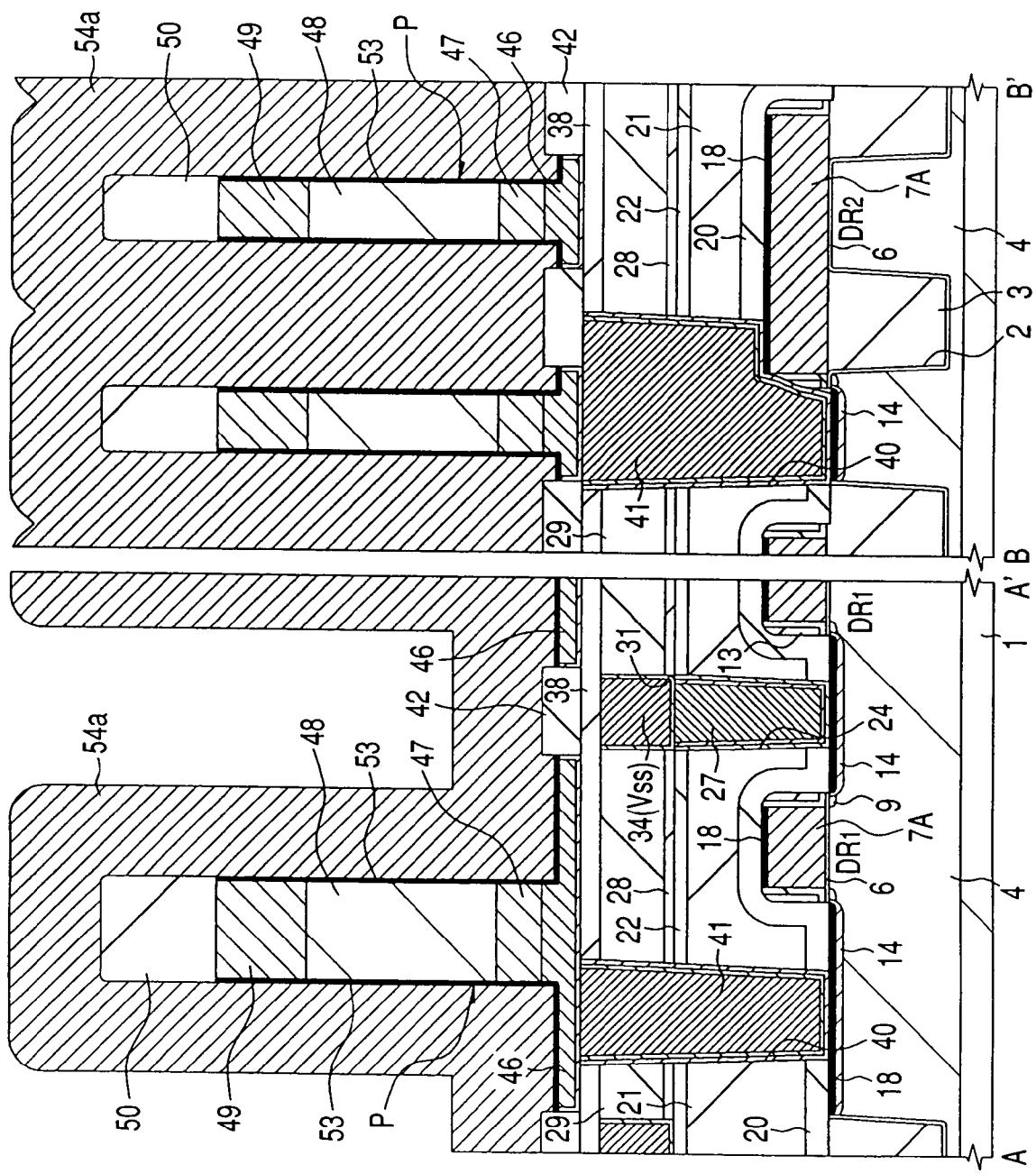
FIG. 76 is a cross-sectional view showing a method of manufacturing a semiconductor memory device according to another embodiment of this invention.

Next, as shown in FIG. 76, a polycrystalline silicon film 54a is deposited by CVD on the substrate 1. The polycrystalline silicon film 54a is of n conductivity type as, since it is doped with phosphorus during film formation. The film thickness of the polycrystalline silicon film 54a is the film thickness for which the polycrystalline silicon film 54a formed on the side walls of two mutually adjoining laminates (P) in the extension direction (the direction of the line B-B' in the figure) of the word line (WL) is in contact, i.e., ½ or more of the gap between these two laminates (P), and it is the film thickness for which the polycrystalline silicon film 54a, which is formed on the side walls of the two mutually adjoining laminates (P) in the direction (the direction of the line A-A' in the figure) perpendicular to the extension direction of the word line (WL), is not in contact. Due to this, the polycrystalline silicon film 54a is obtained, which covers the whole side wall surface of the laminate (P) and extends in a belt shape in the extension direction of the word line (WL). Regarding the impurities doped in the polycrystalline silicon film 54a, phosphorus may be replaced by boron.

Figure 77:
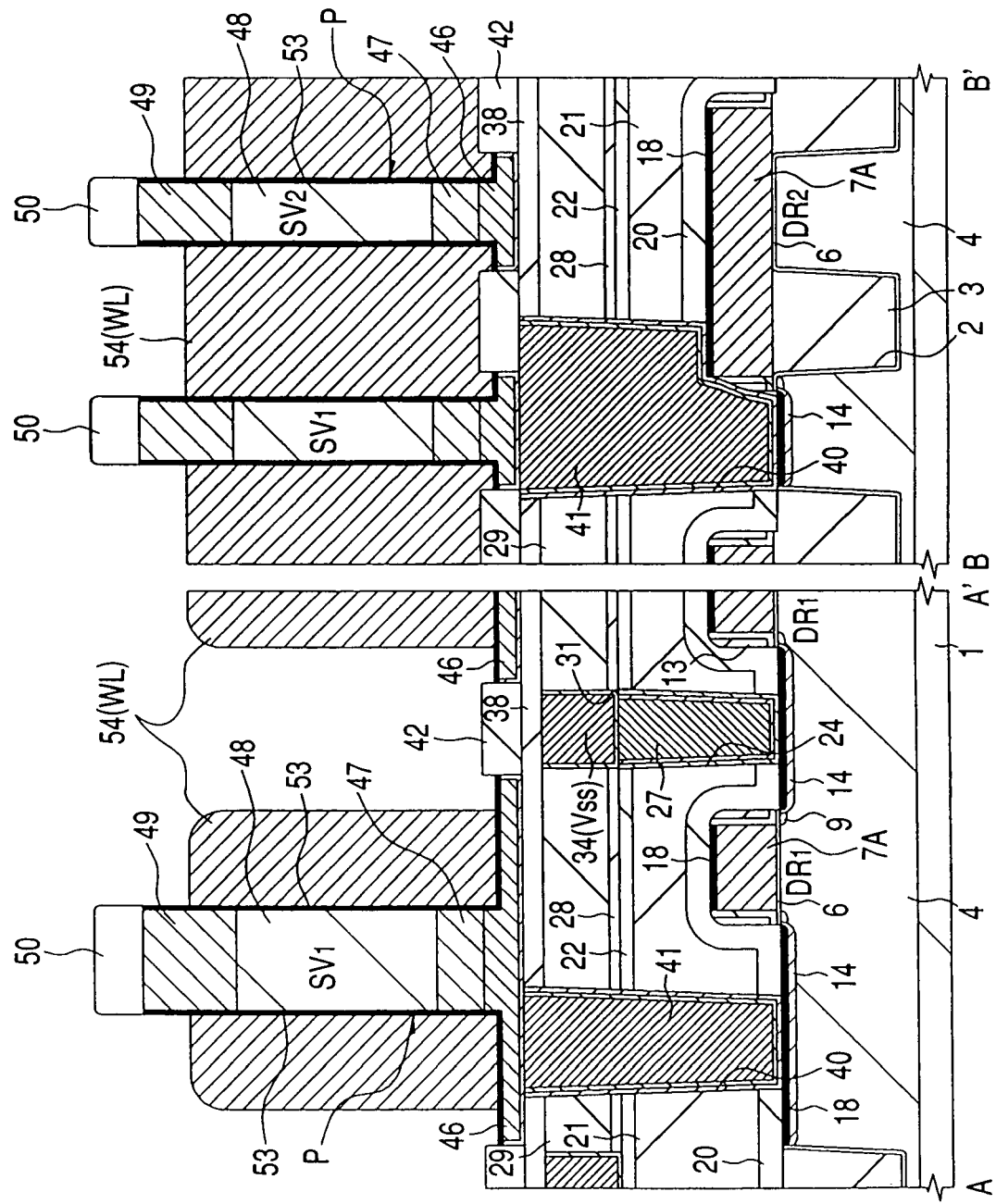
FIG. 77 is a cross-sectional view showing a method of manufacturing a semiconductor memory device according to another embodiment of this invention.

Next, as shown in FIG. 77, by etching the polycrystalline silicon film 54a so that it retreats underneath, the gate electrodes 54 of the vertical MISFETs ($SV_1$, $SV_2$), which are formed together with the word line (WL), are obtained.

According to the above-mentioned method, the number of steps involved in forming the gate electrodes 54 and word line (WL) of the vertical MISFETs ($SV_1$, $SV_2$) can be considerably reduced compared with the method of Embodiment 1.

Figure 78:
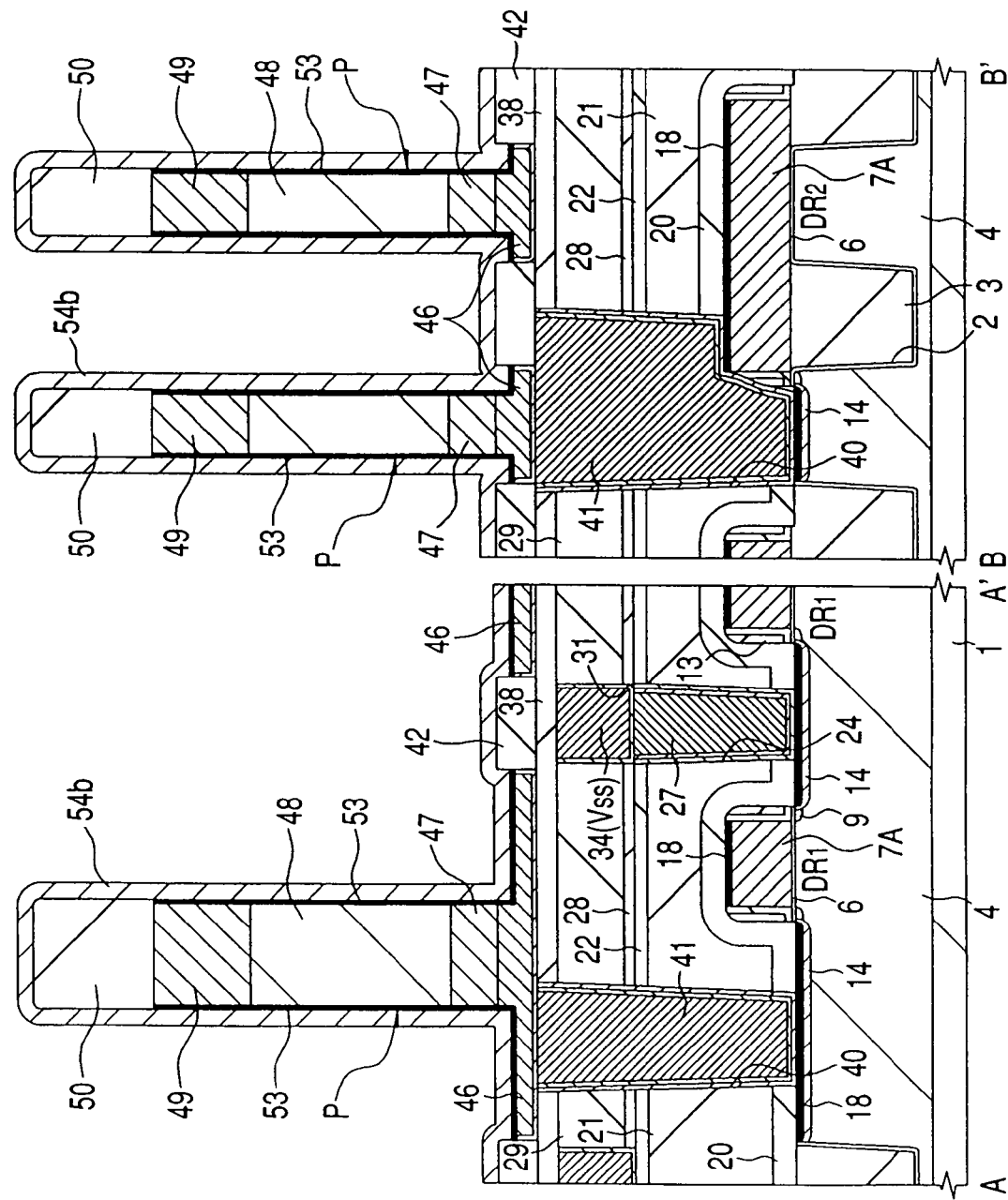
FIG. 78 is a cross-sectional view showing a method of manufacturing a semiconductor memory device according to another embodiment of this invention.
Figure 79:
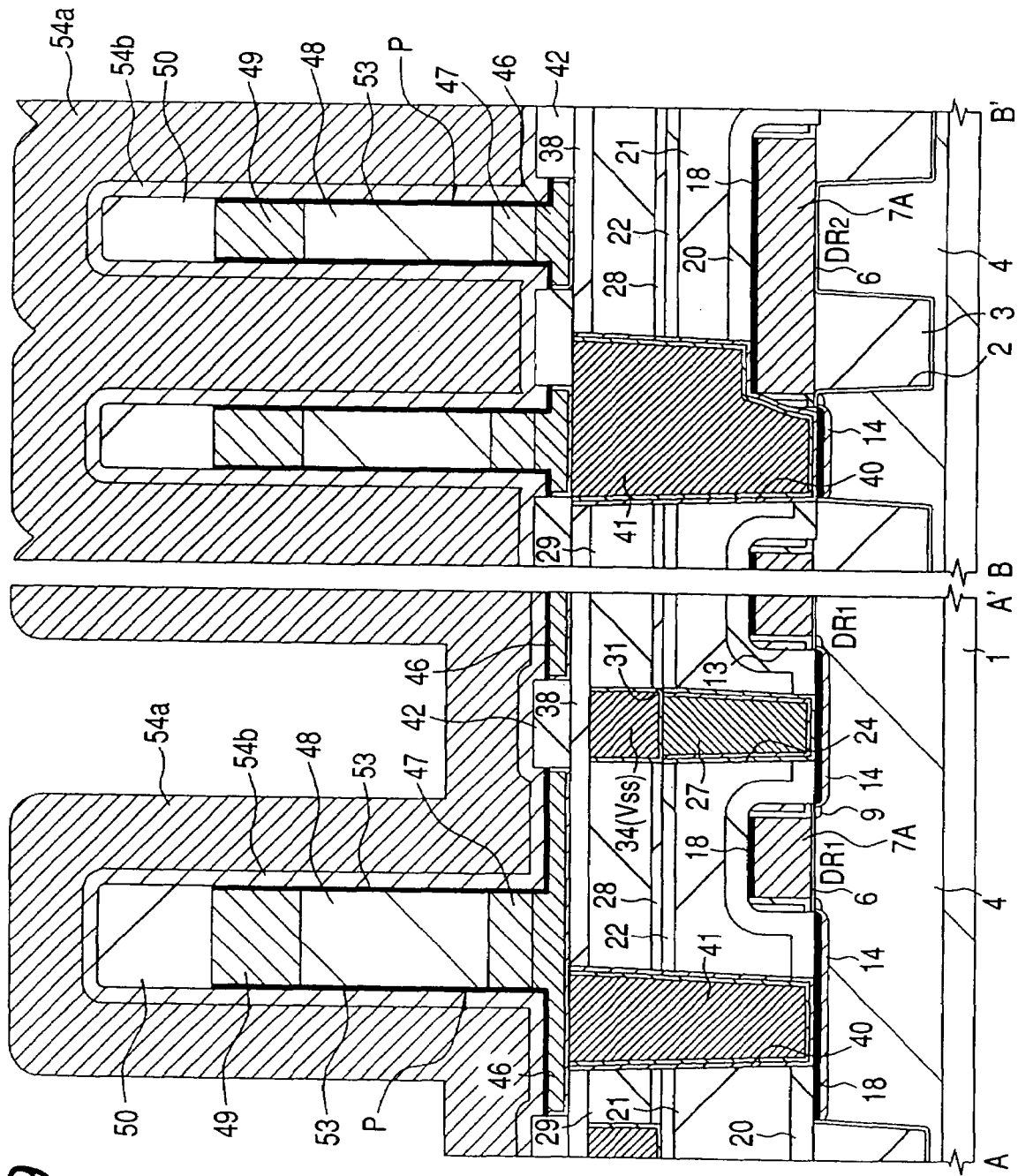
FIG. 79 is a cross-sectional view showing a method of manufacturing a semiconductor memory device according to another embodiment of this invention.

The gate electrodes 54, which are formed together with the word line (WL), may also comprise two layers of polycrystalline silicon films. In this case, first, as shown in FIG. 78, an amorphous silicon film 54b is thinly deposited by CVD on the substrate 1, then, as shown in FIG. 79, the polycrystalline silicon film 54a is deposited by CVD above the amorphous silicon film 54b. Next, the substrate 1 is heat-treated, and the amorphous silicon film 54b is polycrystallized by using the polycrystalline silicon film 54a as a seed crystal.

When the circuit is formed by laminating components, in order to avoid deterioration of the properties of the lower layer components, the process which forms the upper components must be performed as at low a temperature as possible. Therefore, if the silicon gate electrode of the upper components is deposited in the amorphous state, the annealing temperature and time for crystallization must be reduced as much as possible. However, if the annealing temperature is lowered and the time is shortened, there may occur, as a side effect, the problem that the silicon does not properly crystallize. That is, a trade-off between low temperature and crystallization must be resolved.

If it is deposited in the polycrystalline state beforehand, since crystallization annealing is unnecessary, the dilemma is solved. However, since it is a polycrystal, a new problem arises in that reagents may permeate via the crystal interfaces. In particular, in a thin film, there is a considerable risk that the cleaning fluid of the next step may permeate to the gate oxide under the polycrystalline film and cause fatal damage to the components. Here, a trade-off between a lower temperature and component damage must be faced.

These dilemmas cannot be resolved by a monolayer film. However, if there is a two-layer deposition of an amorphous film and a polycrystalline film, these dilemmas are resolved. The amorphous film prevents permeation of fluid to the components, and the second layer of polycrystalline film serves to seed the crystallization of the amorphous silicon of the first layer, so that sufficient crystallization can take place with little thermal load. Since the polycrystalline film serves as a seed crystal to polycrystallize the amorphous film, if a cross-section is observed with a transmission electron microscope, it will be observed that the crystal orientation of the crystals at the interface of the film laminate is continuous.

Embodiment 5

A SRAM, wherein a memory cell is formed from two drive MISFETs ($DR_1$, $DR_2$) and two vertical MISFETs ($SV_1$, $SV_2$), has a construction wherein, at the storage node on the H level side, a charge is retained using the leakage current when the vertical MISFETs ($SV_1$, $SV_2$) are OFF. Therefore, when applying the reference voltage (Vss) of 0V to the data line and writing at the L level (0V), a disturbance may easily occur wherein charge leaks from the storage node of the H level side of the non-selected memory cell to the data line.

Figure 80:
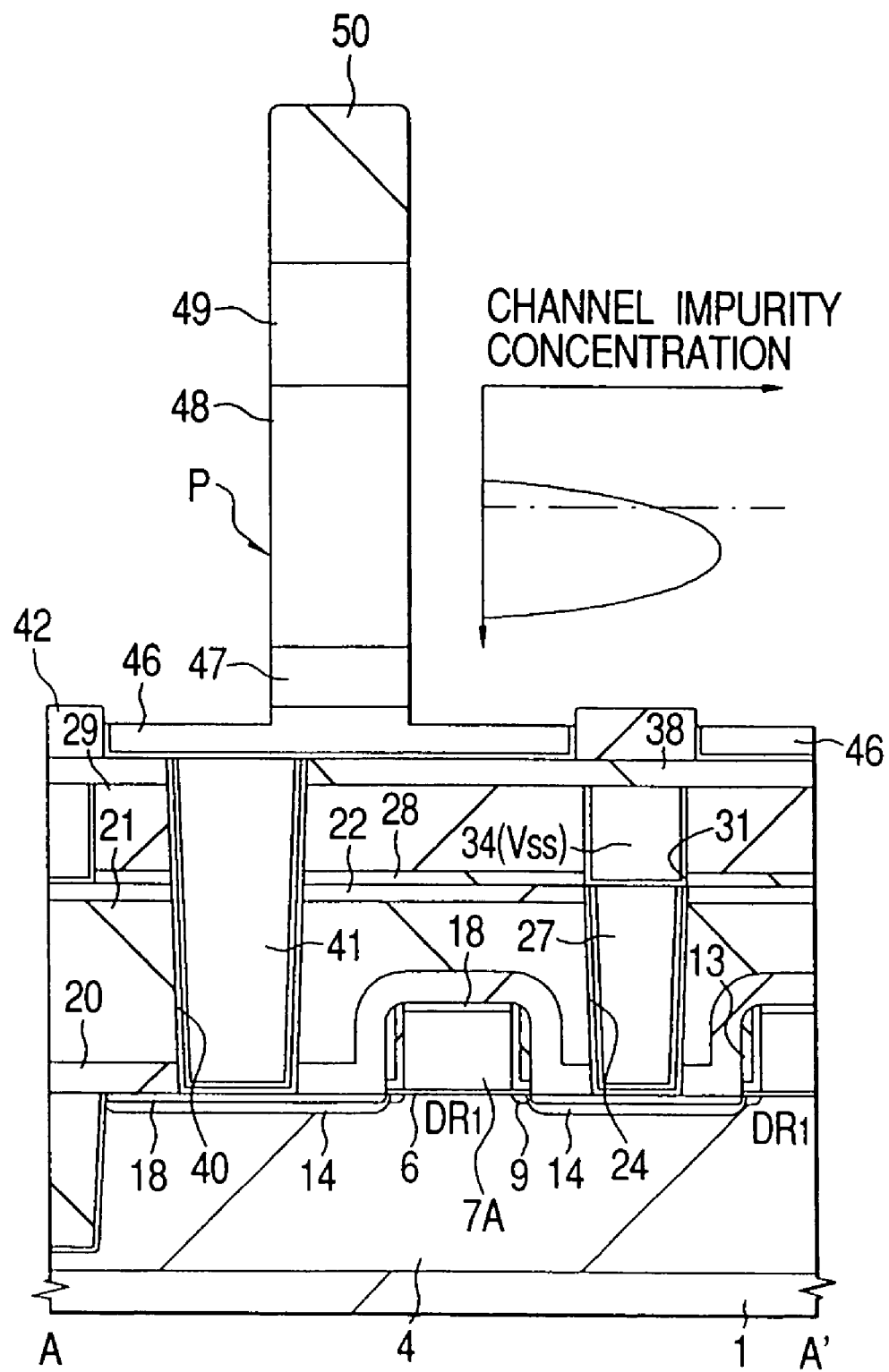
FIG. 80 is a cross sectional view including a graph showing a concentration profile of impurities doped in an intermediate layer of a vertical MISFET.

To counteract this, in this embodiment, when channel impurities are ion implanted to the intermediate semiconductor layer 48 forming the substrate of the vertical MISFETs ($SV_1$, $SV_2$), as shown in FIG. 80, the depth where the maximum peak of the impurity concentration occurs is shifted to a point lower than the center of the intermediate semiconductor layer 48.

When the L level (0V) is written in the memory cell, as the potential on the data line side falls to 0V, the upper semiconductor layer 49, which is the semiconductor layer on the data line side, becomes the drain, and the lower semiconductor layer 47 becomes the source. In general, since the threshold voltage of the MISFET is determined by the impurity concentration near the source, if the depth where the maximum peak of impurity concentration occurs is shifted to a level below the center of the intermediate semiconductor layer 48, the threshold voltage during a write operation increases, and charge leakage from the storage node to the data line decreases. Due to this, the disturbance wherein charge leaks from the storage node to the data line of the non-selected memory cell can be effectively suppressed.

On the other hand, during storage and retention, as the potential of the data line is increased and supplied from the data line to the storage node on the H level side, the upper semiconductor layer 49, which is the semiconductor layer on the data line side, becomes the source, and the lower semiconductor layer 47 becomes the drain.

Therefore, if the depth where the maximum peak of impurity concentration occurs is shifted to a level below the center of the intermediate semiconductor layer 48, since the impurity concentration near the source (upper semiconductor layer 49) is low, the threshold voltage is low, and sufficient leakage current can flow from the data line to the storage node.

Hence, according to this embodiment, since the threshold voltage of the non-selected memory cell can be increased for a write operation, and the threshold voltage can be decreased for storage and retention, it is easy to achieve the dual objective of reducing fluctuation of the node potential due to a disturbance and achieving stable memory retention, so that there is a sufficient tolerance to disturbance defects, i.e., a stable operation can be guaranteed.

Due to this, it is possible to design a shorter latency time for restoring the node potential, which fell due to the disturbance, so high speed operation of the SRAM can be achieved.

The invention, as conceived by the inventors, has been described based on various embodiments, but it will be understood that various modifications may be made without departing from the scope and spirit of the invention as defined by the appended claims.

For example, the features of the manufacturing method are not limited to the aforesaid semiconductor memory device, and the invention may, of course, be interpreted as applying to a method of forming a vertical MISFET, and a method of forming a semiconductor integrated circuit device comprising a MISFET. The construction may, of course, also be interpreted as applying to a vertical MISFET, as well as a semiconductor integrated circuit device comprising a MISFET.

The salient features of the invention as described with reference to these embodiments may be summarized as follows.

What we claim is:

1. A method of manufacturing a semiconductor device including memory cells having MISFETs, comprising steps of:
   (a) forming a first film over a conductive film formed over a main surface of a semiconductor substrate;
   (b) patterning the first film to form first patterns each having a shape extending in a first direction;
   (c) patterning the first patterns in a second direction perpendicular to the first direction to form second patterns each separated in the first direction; and
   (d) patterning the conductive film by using the second patterns to form gate electrodes of the MISFETs.

2. A method according to claim 1,
   wherein a gate pattern of the first film for a gate electrode of a MISFET in a peripheral circuit is formed by using the step (b) or the step (c).

3. A method according to claim 1,
   wherein a gate pattern of the first film for a gate electrode of a MISFET in a peripheral circuit is formed by using the step (b), the step (c) and the step (d).

4. A method according to claim 1,
   wherein the first film includes an inorganic film.

5. A method according to claim 4,
   wherein the inorganic film includes a silicon oxide film.

6. A method according to claim 1,
   wherein each memory cell includes a first MISFET and a second MISFET arranged so that the first MISFET and the second MISFET are cross-coupled,
   wherein, in the step (d), gate electrodes of the first MISFETs and the second MISFETs are formed, and
   wherein the memory cells arranged in the first direction are arranged with the same layout pattern in the first direction.

7. A method according to claim 1,
wherein each memory cell includes a first MISFET and a second MISFET arranged so that the first MISFET and the second MISFET are cross-coupled,
wherein, in the step (d), gate electrodes of the first MISFETs and the second MISFETs are formed,
wherein the memory cells arranged in the second direction are arranged with a layout of axial symmetry with respect to a boundary line between the memory cells aligned in the first direction.

8. A method according to claim 1,
wherein each memory cell includes a first MISFET and a second MISFET arranged so that the first MISFET and the second MISFET are cross-coupled,
wherein, in the step (d), gate electrodes of the first MISFETs and the second MISFETs are formed,
wherein the first MISFET and the second MISFET are arranged with point symmetry with respect to a centerpoint in a memory cell forming region.

9. A method according to claim 1,
wherein the memory cell comprises a memory cell of a static random access memory.

10. A method of manufacturing a semiconductor device including memory cells having MISFETs, comprising steps of:
(a) forming a first film over a conductive film formed over a main surface of a semiconductor substrate;
(b) patterning the first film to form first patterns each having a shape extending in a first direction;
(c) patterning the first patterns in a second direction perpendicular to the first direction to form second patterns each separated in the first direction; and
(d) patterning the conductive film by using the second patterns to form gate electrodes of the MISFETs,
wherein each of the memory cells constitutes a memory cell of a static random access memory,
wherein the memory cell includes a first MISFET and a second MISFET such that the first MISFET and the second MISFET are cross-coupled, and
wherein the first MISFET and the second MISFET are arranged with point symmetry with respect to a centerpoint in a memory cell forming region.

11. A method according to claim 10,
wherein a gate pattern of the first film for a gate electrode of a MISFET in a peripheral circuit is formed by using the step (b) or the step (c).

12. A method according to claim 10,
wherein a gate pattern of the first film for a gate electrode of a MISFET in a peripheral circuit is formed by using the step (b), the step (c) and the step (d).

13. A method according to claim 10,
wherein the first film includes a silicon oxide film.

14. A method according to claim 10,
wherein, in the step (d), gate electrodes of the first MISFETs and the second MISFETs are formed, and
wherein the memory cells arranged in the first direction are arranged with the same layout pattern in the first direction.

15. A method according to claim 10,
wherein, in the step (d), gate electrodes of the first MISFETs and the second MISFETs are formed, and
wherein the memory cells arranged in the second direction are arranged with a layout of axial symmetry with respect to a boundary line between the memory cells aligned in the first direction.

16. A method of manufacturing a semiconductor device including memory cells having MISFETs, comprising steps of:
(a) forming a first film over a conductive film formed over a main surface of a semiconductor substrate;
(b) patterning the first film to form first patterns each having a shape extending in a first direction;
(c) patterning the first patterns in a second direction perpendicular to the first direction to form second patterns each separated in the first direction; and
(d) patterning the conductive film by using the second patterns to form gate electrode patterns of the MISFETs,
wherein each of the memory cells constitutes a memory cell of a static random access memory,
wherein the memory cell includes a first MISFET and a second MISFET, and
wherein the gate electrode patterns of the MISFETs have, respectively, a rectangle shape such that a width, in the first direction, of the rectangle shape is greater than a width, in the second direction, of the rectangle shape.

17. A method according to claim 16,
wherein a gate pattern of the first film for a gate electrode of a MISFET in a peripheral circuit is formed by using the step (b) or the step (c).

18. A method according to claim 16,
wherein a gate pattern of the first film for a gate electrode of a MISFET in a peripheral circuit is formed by using the step (b), the step (c) and the step (d).

19. A method according to claim 16,
wherein the first film includes a silicon oxide film.

20. A method according to claim 16,
wherein, in the step (d), gate electrodes of the first MISFETs and the second MISFETs are formed, and
wherein the memory cells arranged in the first direction are arranged with the same layout pattern in the first direction.

21. A method according to claim 16,
wherein, in the step (d), gate electrodes of the first MISFETs and the second MISFETs are formed, and
wherein the memory cells arranged in the second direction are arranged with a layout of axial symmetry with respect to a boundary line between the memory cells aligned in the first direction.

22. A method according to claim 16,
wherein, in the step (d), gate electrodes of the first MISFETs and the second MISFETs are formed, and
wherein the first MISFET and the second MISFET are arranged with point symmetry with respect to a centerpoint in a memory cell forming region.

* * * * *